(12) United States Patent
Cheng

(10) Patent No.: US 12,052,874 B2
(45) Date of Patent: Jul. 30, 2024

(54) THREE-DIMENSIONAL MEMORY DEVICE STRUCTURES AND METHODS

(71) Applicant: Taiwan Semiconductor Manufacturing Company, Ltd., Hsinchu (TW)

(72) Inventor: Chung-Liang Cheng, Changhua (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 261 days.

(21) Appl. No.: 17/387,954

(22) Filed: Jul. 28, 2021

(65) Prior Publication Data
US 2022/0302144 A1    Sep. 22, 2022

Related U.S. Application Data

(60) Provisional application No. 63/163,742, filed on Mar. 19, 2021, provisional application No. 63/163,769, filed on Mar. 19, 2021.

(51) Int. Cl.
| | |
|---|---|
| *H01L 29/423* | (2006.01) |
| *G11C 11/22* | (2006.01) |
| *H01L 27/088* | (2006.01) |
| *H01L 29/786* | (2006.01) |
| *H10B 53/20* | (2023.01) |

(52) U.S. Cl.
CPC ........... *H10B 53/20* (2023.02); *G11C 11/221* (2013.01); *H01L 27/0886* (2013.01); *H01L 29/42392* (2013.01); *H01L 29/78696* (2013.01)

(58) Field of Classification Search
CPC ..... H10B 53/30; H10B 53/20; H01L 25/0657; H01L 25/18; H01L 25/50; H01L 29/42392; H01L 29/66545; H01L 27/0629; H01L 27/0635; H01L 27/0886; G11C 11/221
See application file for complete search history.

(56) References Cited

U.S. PATENT DOCUMENTS

| | | | |
|---|---|---|---|
| 9,985,097 B2 * | 5/2018 | Cheng | H01L 29/42392 |
| 2017/0040321 A1* | 2/2017 | Mitard | H01L 29/78684 |
| 2017/0365604 A1* | 12/2017 | Suh | H01L 21/823878 |
| 2018/0083046 A1* | 3/2018 | Cheng | H01L 28/82 |
| 2019/0326288 A1* | 10/2019 | Hashemi | H01L 21/823821 |
| 2020/0312951 A1* | 10/2020 | Xu | H01L 29/0673 |
| 2021/0296396 A1* | 9/2021 | Wu | H10N 70/011 |

* cited by examiner

*Primary Examiner* — David Vu
*Assistant Examiner* — Brandon C Fox
(74) *Attorney, Agent, or Firm* — Kilpatrick Townsend & Stockton LLP

(57) ABSTRACT

A method of fabricating a semiconductor device includes forming a first stack of semiconductor layers on a substrate. The first stack of semiconductor layers includes alternating first and second semiconductor strips. The method also includes removing the first semiconductor strips to form voids between the second semiconductor strips in the first stack of semiconductor layers. The method further includes depositing a dielectric structure layer and a first conductive fill material in the voids to surround the second semiconductor strips. Further, the method includes removing the second semiconductor strips to form a second set of voids, and depositing a second conductive fill material in the second sets of voids. In some embodiments, the first conductive fill material and the second conductive fill material are configured to form first and second electrodes of a capacitor.

20 Claims, 33 Drawing Sheets

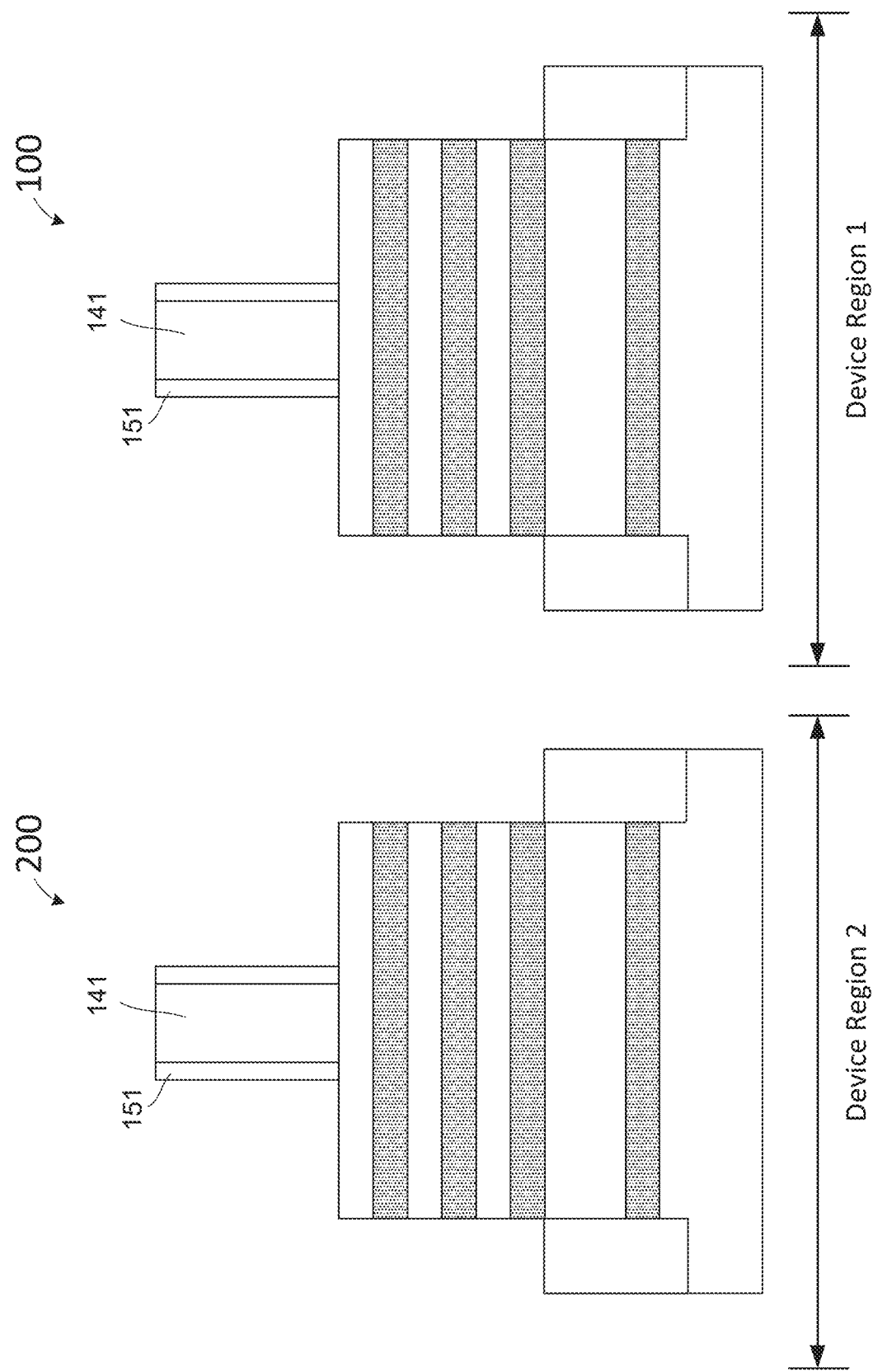

THREE-DIMENSIONAL MEMORY DEVICE STRUCTURES AND METHODS

PRIORITY CLAIM AND CROSS-REFERENCE

This application claims the benefit of U.S. Provisional Patent Application No. 63/163,742, titled "THREE-DIMENSIONAL MEMORY DEVICE STRUCTURES AND METHODS," filed Mar. 19, 2021, and U.S. Provisional Patent Application No. 63/163,769, titled "THREE-DIMENSIONAL MEMORY DEVICE STRUCTURES AND METHODS," filed Mar. 19, 2021. This application is also related to concurrently filed U.S. patent application Ser. No. 17/387,961, titled "THREE-DIMENSIONAL MEMORY DEVICE STRUCTURES AND METHODS." The disclosures of all the above applications are incorporated by reference herein in their entirety.

BACKGROUND

With advances in semiconductor technology, there has been increasing demand for faster devices and higher storage capacity. To scale down the transistors, the semiconductor industry continues to scale down the dimensions of semiconductor devices, such as fin field effect transistors (finFETs) that include semiconductor fins with high aspect ratios in which channel and source/drain regions are formed. A gate structure is formed over and along the sides of the fin (e.g., wrapping), providing the advantage of the increased surface area of the channel.

To scale down memory cells, the semiconductor industry has been reducing lateral device dimensions to reduce device size, while increasing the vertical dimension to increase memory charge storage. The semiconductor industry has also been exploring new architecture and new materials for improved memory performance.

Such scaling down has increased the complexity of semiconductor manufacturing processes. Since device feature sizes continue to decrease, fabrication processes continue to become more difficult to perform. Therefore, improved memory device technology is highly desirable.

BRIEF DESCRIPTION OF THE DRAWINGS

Aspects of the present disclosure are best understood from the following detailed description when read with the accompanying figures. It is noted that, in accordance with the standard practice in the industry, various features in the figures are not drawn to scale. In fact, the dimensions of the various features may be arbitrarily increased or reduced for clarity of discussion.

FIGS. 2, 3, 4, 5A, and 5B illustrate cross-sectional views of respective intermediate structures at various stages of an exemplary method for fabricating semiconductor devices in device regions 1 and 2, respectively, in accordance with some embodiments.

DETAILED DESCRIPTION

Figure 1A:
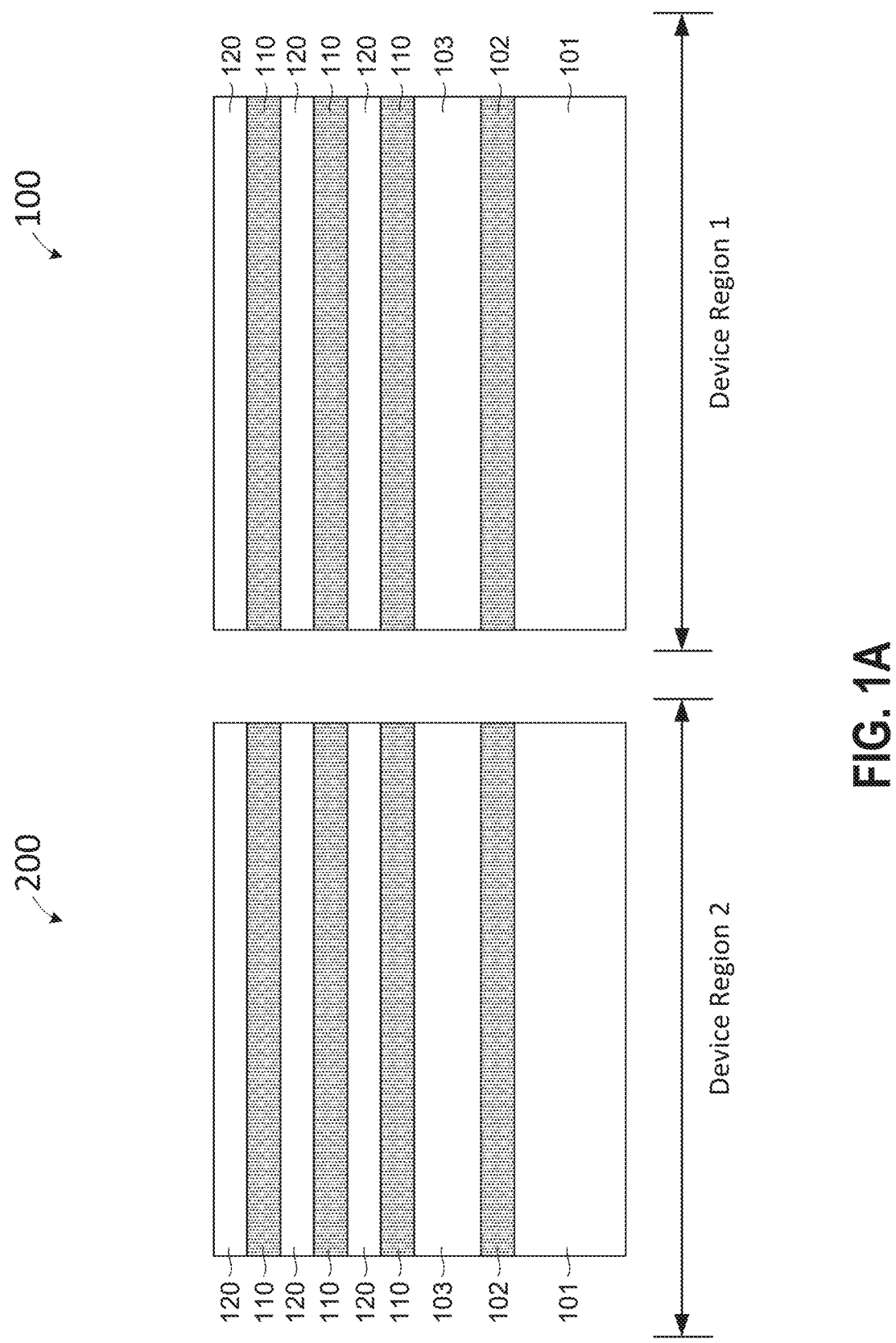
FIGS. 1A and 1B illustrate a cross-sectional view and a three-dimensional (3D) view of intermediate structures at an early stage of an exemplary method for fabricating semiconductor devices in device regions 1 and 2, respectively, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In advanced technologies, using dimension shrink to increase device density becomes more and more challenging due to physical limitation. Therefore, structures and methods are described for novel 3D GAA (gate-all-around) FeRAM devices to improve device performance.

Figure 1B:
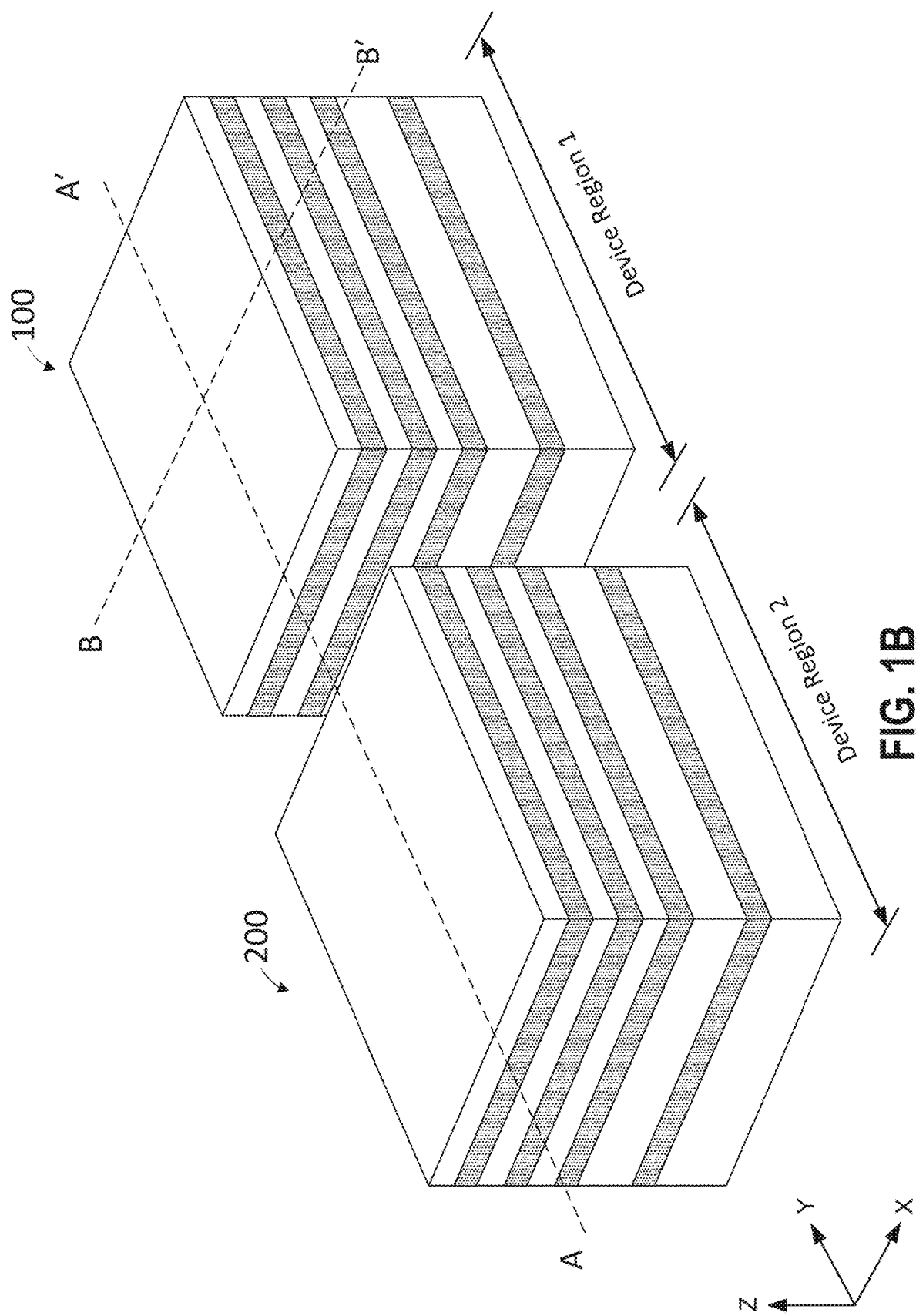

FIGS. 1A and 1B illustrate a cross-sectional view and a three-dimensional (3D) view of intermediate structures at an early stage of an exemplary method for fabricating semiconductor devices in device regions 1 and 2, respectively, in accordance with some embodiments. FIG. 1A illustrates a cross-sectional view, and FIG. 1B illustrates a three-dimensional view of the intermediate structure. The cross-sectional view in FIG. 1A is taken along the A-A' cutline in FIG. 1B. FIG. 1B also shows a second cutline B-B' perpendicular to cutline A-A', which is referred to in subsequent drawings, e.g., in FIGS. 5B, 14A, 14B, 15A, 15B, 16A, and 16B.

In the subsequent figures, intermediate device structures at various stages of fabricating semiconductor devices in device in regions 1 and 2 are referred to as device structures 100 and 200, respectively. Intermediate device structures 100 and 200 can be fabricated concurrently on the same semiconductor wafer and in the same integrated circuit (IC) chip. Alternatively, they can also be fabricated separately.

As described below, intermediate device structures 100 depict various processing stages of a gate-all-around (GAA) capacitor device having a first electrode and a dielectric material wrapped around a second electrode. Intermediate device structures 200 depict various processing stages of a gate-all-around (GAA) transistor having a gate electrode and gate dielectric wrapped around the channel regions of the transistor. The dielectric material can include high-k and ferroelectric materials. In some embodiments, the GAA capacitor device can be used as a capacitor or memory device in a first device region, also referred to as device region 1. The GAA transistor can be used as transistors in the processor core, input/output, or static random access memory (SRAM) in a second device region, also referred to as device region 2.

In the figures below, to simplify the drawings, common elements are identified with the same reference numerals. Further, in some cases, in the intermediate device structures in each successive processing stage, reference numerals are only used to mark changes from the previous stage, unless otherwise noted.

In FIGS. 1A and 1B, the intermediate structures 100 and 200 include stacked structures in the first and second device regions on a substrate. Each of the stacked structures includes a stack of alternating first and second semiconductor layers.

The substrate may be a bulk semiconductor substrate, or a semiconductor-on-insulator (SOI) substrate, which may be doped (e.g., with a p-type or an n-type dopant) to form various well regions or doped regions therein, or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The substrate may be made of silicon or another semiconductor material. For example, the substrate can be a silicon wafer. In some examples, the substrate is made of a compound semiconductor such as silicon germanium (SiGe), silicon carbide (SiC), gallium arsenic (GaAs), indium arsenide (InAs), or indium phosphide (InP), or another suitable compound semiconductor. In some examples, the substrate is made of an alloy semiconductor such as gallium arsenide phosphide (GaAsP), aluminum indium arsenide (AlInAs), aluminum gallium arsenic (AlGaAs), gallium indium arsenide (GaInAs), gallium indium phosphide (GaInP), or gallium indium arsenide phosphide (GaInAsP), or another suitable alloy semiconductor.

In the example of FIGS. 1A and 1B, a top portion of the substrate is represented by layers 101, 102, and 103. In an embodiment, the substrate is represented by a Si layer 101, a Si/Ge layer 102, and a Si layer 103. In another embodiment, layer 102 can be a dielectric layer, e.g., a silicon oxide layer, forming a silicon-on-oxide (SOI) substrate including layers 103, 102, and 101. In either case, Si layer 101 may be a top portion of a Si wafer.

Each of the stacked structures includes a stack of alternating first semiconductor layers 110 and second semiconductor layers 120. In some examples, the total number of layers in the stack of semiconductor layers 110 and 120 is between three and twenty. For example, there may be six layers or ten layers. In other embodiments, there can be more or fewer layers. In some examples, the thickness of the stacked semiconductor layers 110 and 120 is in a range from about 5 nm to about 100 nm. In other embodiments, the thickness can be thinner or thicker.

The semiconductor layers 110 and 120 can be made of different semiconductor materials such as silicon, germanium, silicon germanium (SiGe), gallium arsenic (GaAs), indium arsenide (InAs), silicon carbide (SiC), indium gallium arsenide (InGaAs), or other suitable semiconductor materials. In some embodiments, the semiconductor layers 110 are made of SiGe, and the semiconductor layers 120 are made of Si. Semiconductor layer 110 or the semiconductor layer 120 may be formed alternately on the substrate by blanket epitaxial growth processes. Next, the stacked alternating first semiconductor layers 110 and second semiconductor layers 120 on the substrate are patterned using photolithography and etching processes to form two separate stacks of intermediate structures 100 and 200 in device region 1 and device region 2 of the substrate; respectively, device region 1 and device region 2 can be located in different parts of the substrate for an IC chip. In some embodiments, device region 1 and device region 2 can be located in adjacent parts of the substrate to facilitate interconnection.

To form the stacks, the semiconductor layers are deposited sequentially, for example, using an epitaxial process (EPI). To pattern the stacks, a patterned mask (not shown) is formed on the stacked semiconductor layers 110 and 120 in the patterning and etching process. The mask can be a photoresist mask or a hard mask. In some examples, the hard mask is made of silicon oxide ($SiO_2$), silicon carbon nitride (SiCN), silicon oxycarbide (SiOC), silicon oxycarbon nitride (SiOCN) silicon nitride (SiN or $Si_3N_4$), or another suitable material. The hard mask is formed using deposition, photolithography, and etching processes. The etching processes may include a reactive ion etch (ME), neutral beam etch (NBE), inductive coupled plasma (ICP) etch, or another suitable etch process, or a combination thereof.

FIGS. 2, 3, 4, 5A, and 5B illustrate cross-sectional views of respective intermediate structures at various stages of an exemplary method for fabricating semiconductor devices in device regions 1 and 2, respectively, in accordance with some embodiments.

Figure 2:
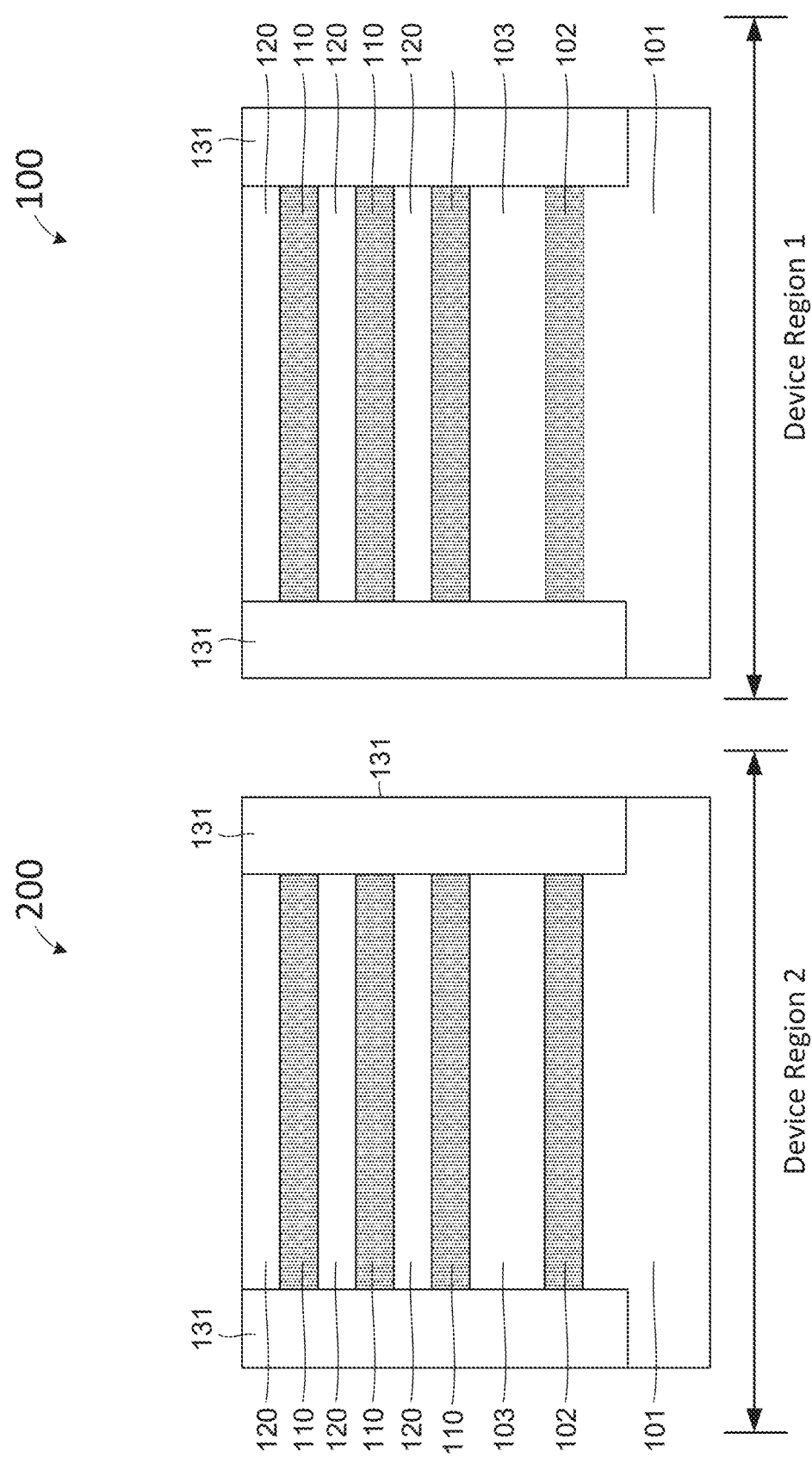

As shown in FIG. 2, multiple isolation structures 131 are formed at the sides of the stacked structures, in accordance with some embodiments. Here, portions of the stacked structures are removed to form trenches between adjacent stacked structures, and an isolation material is deposited in the trenches to form the isolation structures 131 at the sides of the stacked structures. The process of removing portions of the stack structures is similar to the mask and etch processes described above in connection with FIGS. 1A and 1B.

The isolation structure 131 is, for example, a shallow-trench-isolation (STI) structure, which surrounds the remaining the stack structures. The isolation structure 131 is formed by filling the trenches with an insulating material. The insulating material can be silicon oxide, silicon nitride, silicon oxynitride, fluoride-doped silicate glass (FSG), or another low dielectric constant (low-k) dielectric material. The trenches may be filled with the insulating material using a deposition process, such as chemical vapor deposition (CVD), flowable CVD (FCVD), a spin-on-glass (SOG) process, or another suitable process. The deposition process can be followed by a planarization process, such as a chemical-mechanical polishing (CMP) process or an etching process.

In some embodiments, a liner (not shown) may be formed between the isolation structures 131 and stacked structures. In these embodiments, a liner material layer for forming the liner is conformally deposited on the sidewalls of the stacked structures before filling the trenches with the insulating material. The material of the liner 103 may be silicon oxide, silicon nitride, silicon oxynitride, or another suitable material. The liner material layer may be deposited using CVD, physical vapor deposition (PVD), atomic layer deposition (ALD) process, or another suitable process.

Figure 3:
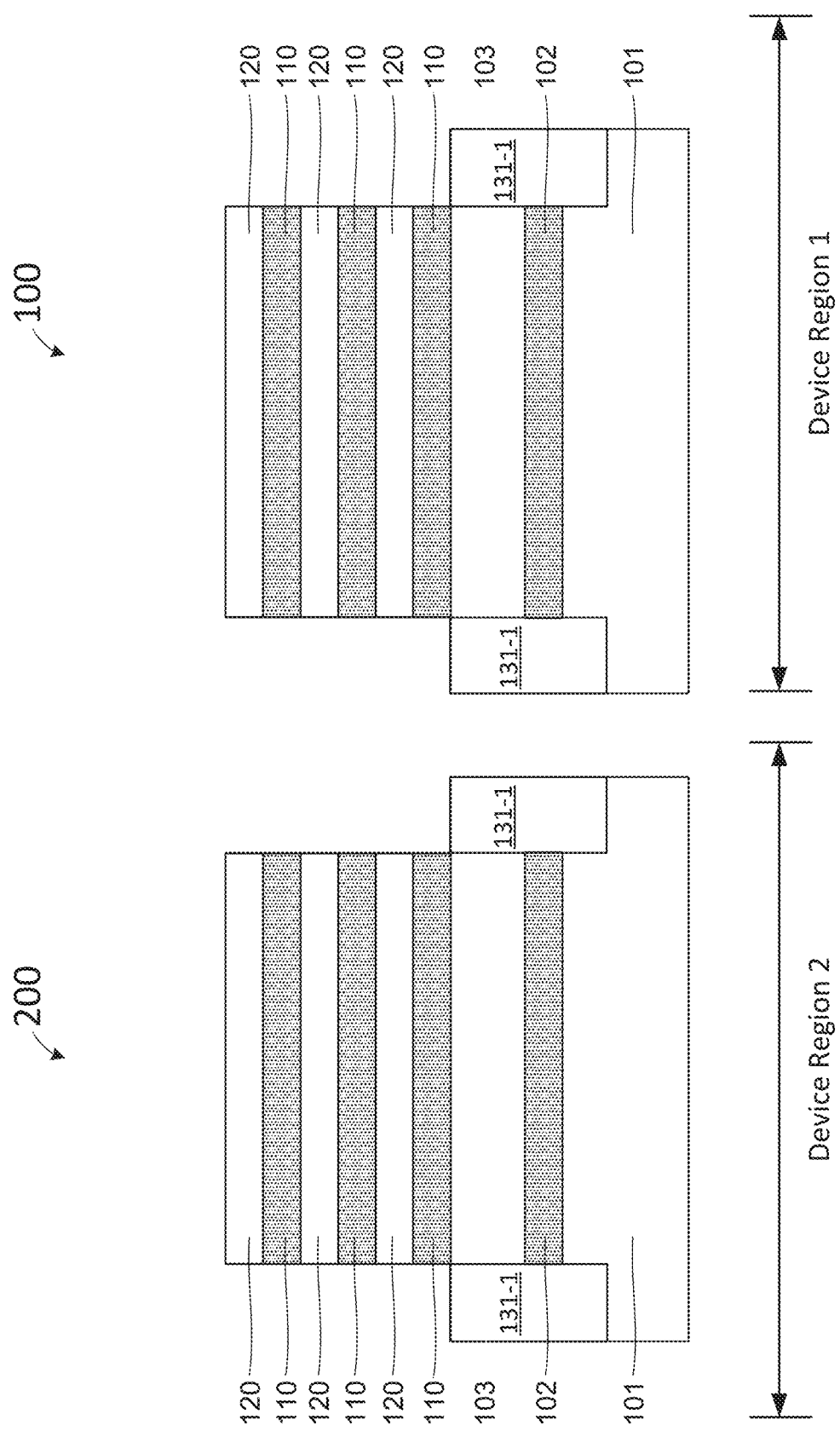

In FIG. 3, isolation structures 131 are recessed by an etching process to expose the stacks of alternating first semiconductor layers 110 and second semiconductor layers 120. The etching process can include ME, NBE or another suitable etching process. In some instances, the top surfaces of the recessed isolation structures 131-1 are selected to expose suitable numbers of alternating first semiconductor layers 110 and second semiconductor layers 120.

In FIG. 4, dummy gate structures 141 and gate spacers 151 are formed on top of the stacks of alternating first semiconductor layers 110 and second semiconductor layers 120. In some embodiments, each of the dummy gate structures 141 will be replaced with a replacement gate structure in subsequent processing steps.

Each of the dummy gate structures 141 can include a dummy gate dielectric layer on the top of the stacked semiconductor layers and a dummy gate electrode layer on the dummy gate dielectric layer. To simplify the drawings, the dummy gate dielectric layer and the dummy gate electrode layer are not shown individually in FIG. 4. In some embodiments, the dummy gate electrode layer is made of poly-silicon. The dummy gate dielectric layer may be made of silicon oxide, silicon nitride, silicon oxynitride, or other low dielectric constant (low-k) dielectric material. The dummy gate dielectric layer and the dummy gate electrode layer are deposited independently, and then may be patterned together using photolithography and etching processes to form the dummy gate structures 141. The deposition processes for the dummy gate dielectric layer and the dummy gate electrode layer may include CVD, PVD, ALD, high density plasma CVD (HDPCVD), metal organic CVD (MOCVD), or plasma enhanced CVD (PECVD) processes. The etching processes for forming the dummy gate structures 141 may include RIE, NBE, or another suitable etching process.

A hard mask layer is formed on the dummy gate electrode layer and patterned to serve as an etching mask for forming the dummy gate structures 141. In some examples, the hard mask is made of silicon oxide ($SiO_2$), silicon carbon nitride (SiCN), silicon oxycarbide (SiOC), silicon oxycarbon nitride (SiOCN) or silicon nitride (SiN or $Si_3N_4$). The second hard mask 118 may be made of silicon oxide ($SiO_2$). The hard mask may be formed using deposition, photolithography and etching processes.

The gate spacers 151 may be formed by conformally depositing one or more spacer layers on the dummy gate structures 141, and along the sidewalls of the dummy gate structures 141. The spacer layers may be made of different materials and have different thicknesses than each other. The one or more spacer layers may include silicon oxide ($SiO_2$), silicon nitride (SiN or $Si_3N_4$), silicon oxynitride (SiON), silicon carbon nitride (SiCN), or a combination thereof, and may be deposited by CVD, ALD or another deposition process. The spacer layers are then anisotropically etched to form the gate spacers 151. The etching process may include a ME, NBE, or other etching processes.

Figure 5A:
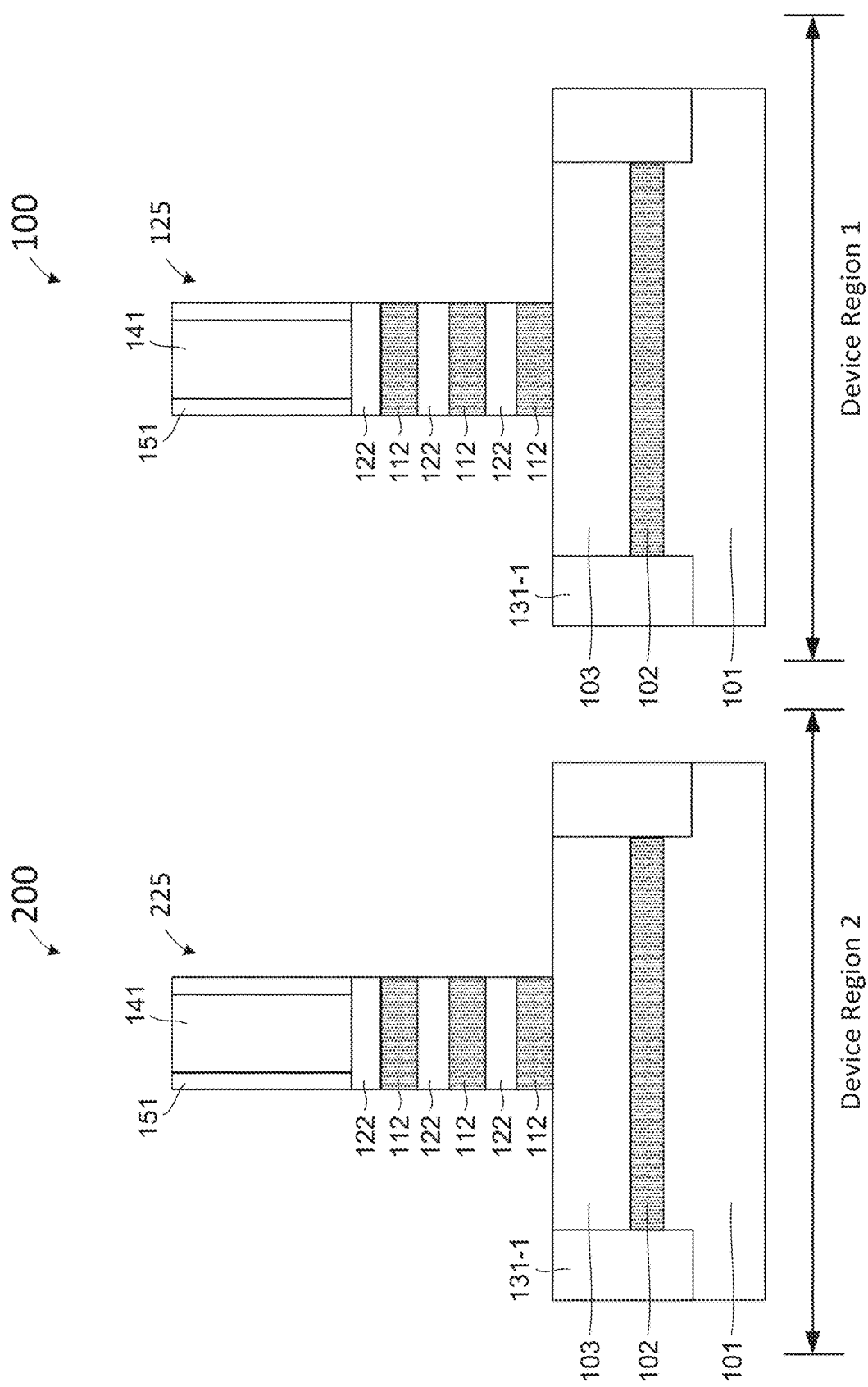
Figure 5B:
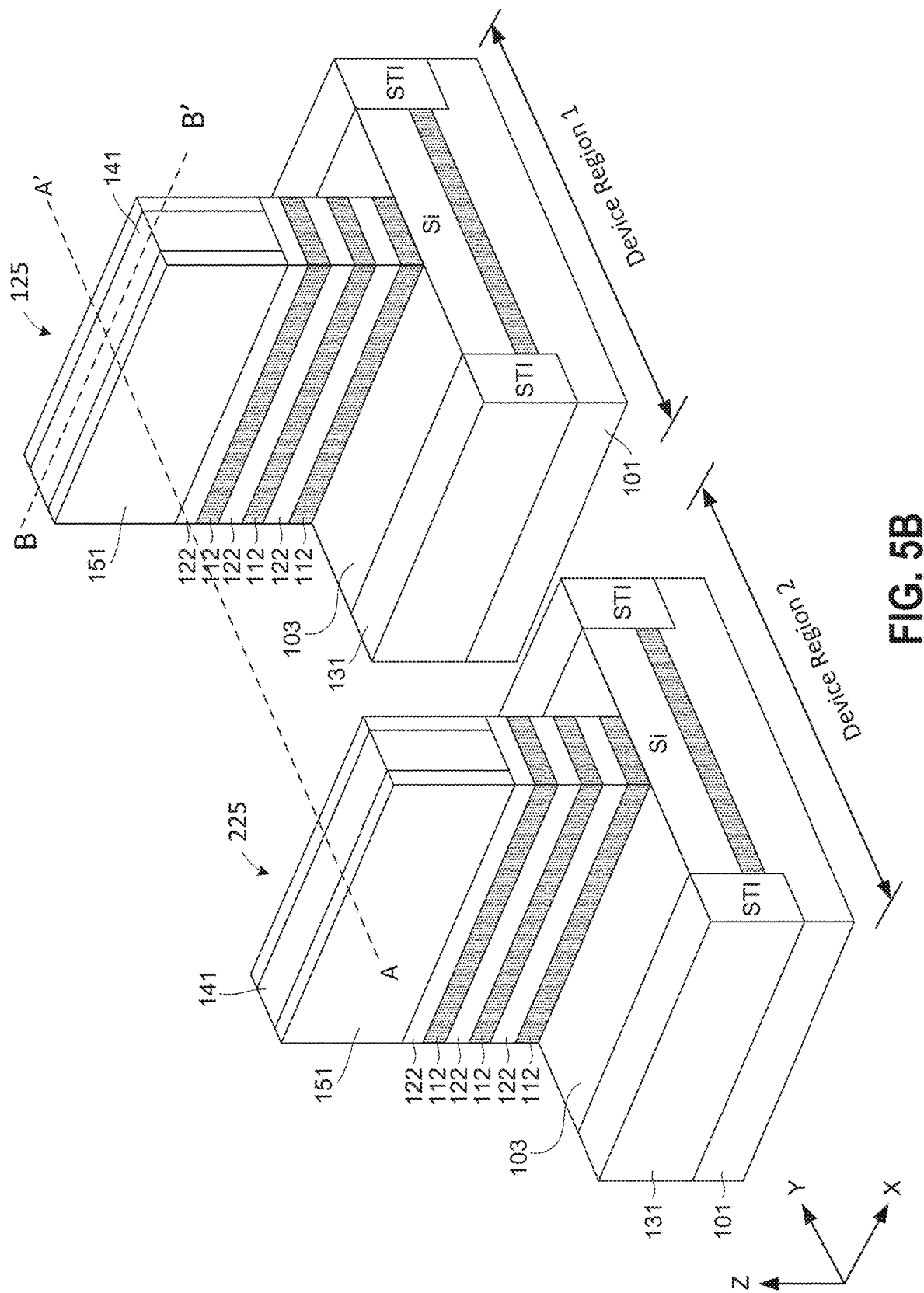

Next, starting with the intermediate structures in FIG. 4, using dummy gate structures 141 and gate spacers 151 as etch masks, the stacks of alternating semiconductor layers 110 and 120 are etched to form fin structures 125 and 225 in device region 1 and device region 2, respectively, as shown in FIGS. 5A and 5B.

FIGS. 5A and 5B illustrate various views of an intermediate structure at one stage of an exemplary method for fabricating semiconductor devices, in accordance with some embodiments. FIG. 5A illustrates a cross-sectional view, and FIG. 5B illustrates a three-dimensional perspective view of the intermediate structure. The cross-sectional view in FIG. 5A is taken along the A-A' cutline in FIG. 5B. FIG. 5B also shows a second cutline B-B' perpendicular to cutline A-A', which is referred to in subsequent drawings, e.g., in FIGS. 14A, 14B, 15A, 15B, 16A, 16B, 17A, and 17B.

FIGS. 5A and 5B illustrate fin structures 125 and 225. Each fin structure includes a stack of alternating first and second semiconductor strips 112 and 122, respectively. First and second semiconductor strips 112 and 122 are the remaining portions of first and second semiconductor layers 110 and 120 illustrated in FIGS. 1-4. In the embodiments described herein, first and second semiconductor strips 112 and 122 are made of SiGe and Si, respectively. However, other semiconductor materials can also be used; for example, two different semiconductor materials having etch selectivity with respect to each can be used in some embodiments. The etching process may include a ME, NBE, or other etching processes. In some embodiments, a non-selective etching process can be used to etch the SiGe and Si layer concurrently. In other embodiments, selective etching processes can be used to sequentially etch the semiconductor layers.

FIGS. 6, 7, 8, 9, 10, 11, 12, and 13 illustrate cross-sectional views of respective intermediate structures at various stages of an exemplary method for fabricating semiconductor devices in device regions 1 and 2, respectively, in accordance with some embodiments.

Figure 6:
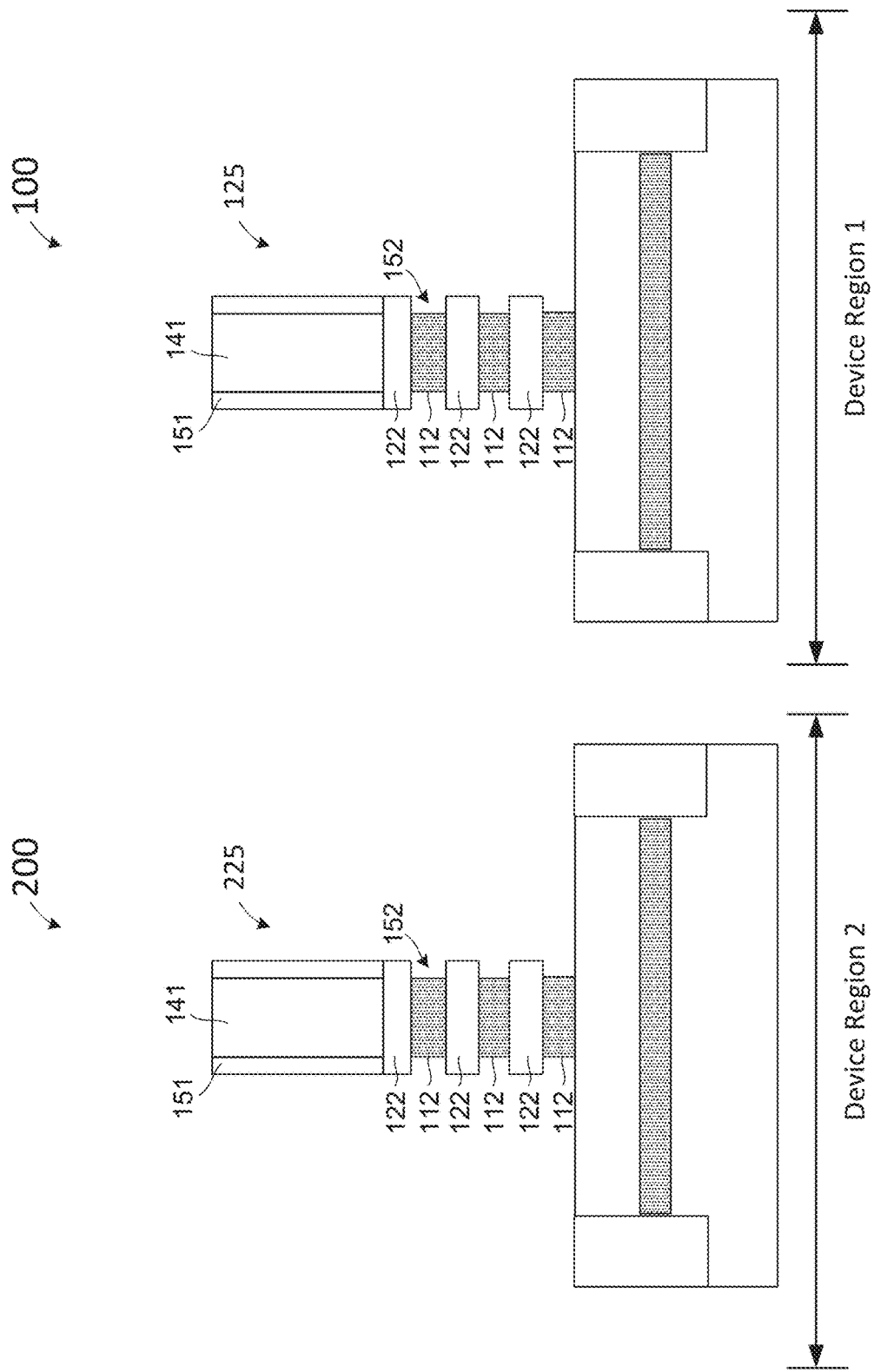
FIGS. 6, 7, 8, 9, 10, 11, 12, and 13 illustrate cross-sectional views of respective intermediate structures at various stages of an exemplary method for fabricating semiconductor devices in device regions 1 and 2, respectively, in accordance with some embodiments.

In FIG. 6, recessed regions 152 are formed on the sides of first semiconductor strips 112 in fin structures 125 and 225. The semiconductor strips 112 are etched using the dummy gate structure 141 and the gate spacers 151 as etching masks to form recessed regions 152. The recessed regions 152 may be formed using an isotropic etching process such as wet etching, plasma etching, ME, or another dry etching process. The wet isotropic etching process may use an etching solution such as ammonium hydroxide-peroxide water mixture (APM), tetramethylammonium hydroxide (TMAH), ammonium hydroxide (NH4OH), or another etchant. In embodiments where the first semiconductor strip 112 is made of SiGe and the second semiconductor strip 122 is made of Si, a selective etchant, e.g., TMAH, that etches SiGe at a higher rate than Si can be used.

Figure 7:
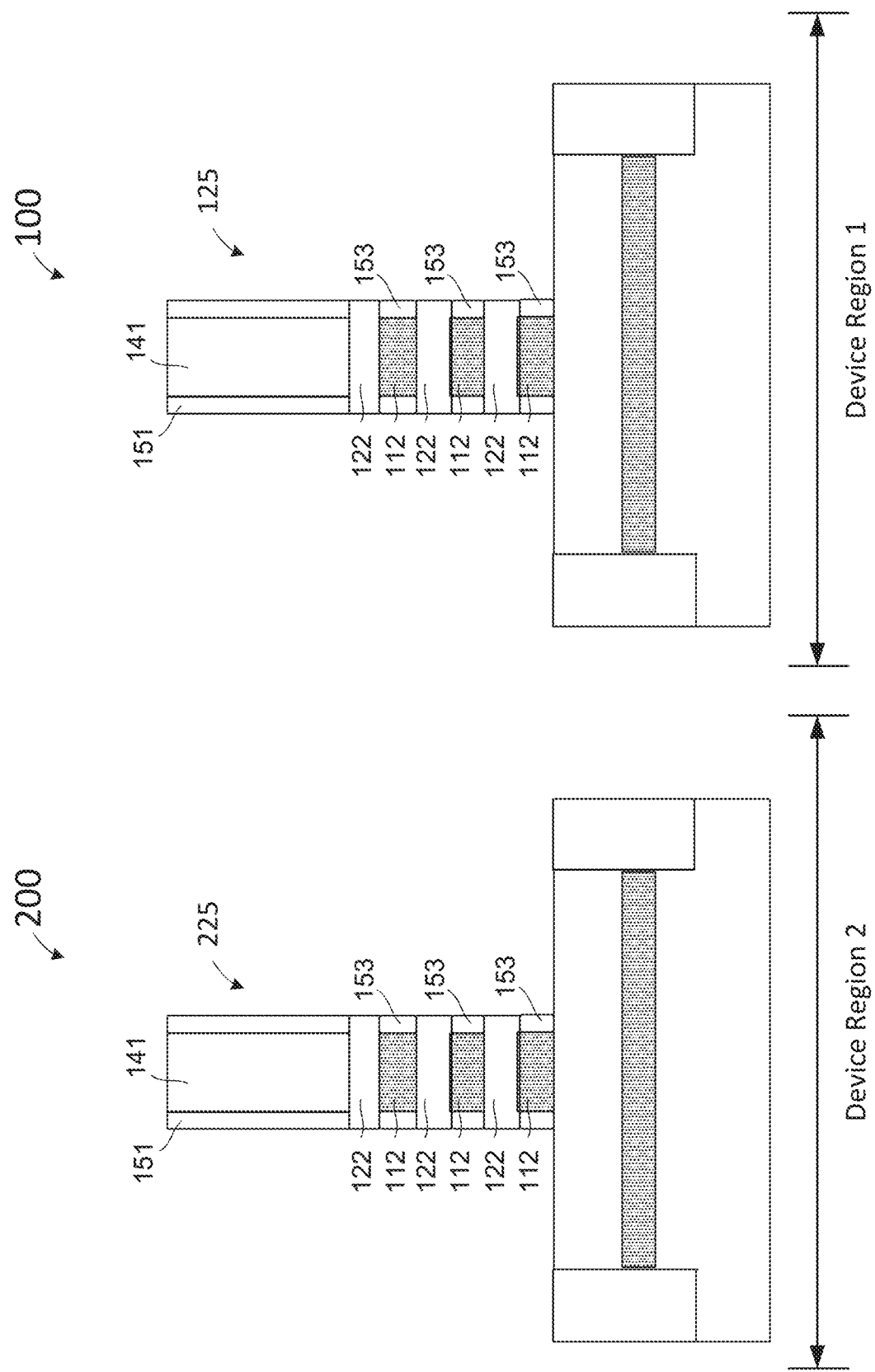

Next, as shown in FIG. 7, inner spacers 153 are formed in the recessed regions 152 on the sides of first semiconductor strips 112. The inner spacers 153 may be formed using a similar process as used in forming the gate spacers 151 described above in connection to FIG. 4. The inner spacers 153 may be formed by conformally depositing one or more spacer layers on the fin structures 125 and 225, and along their sidewalls. The spacer layers may be made of different materials and have different thicknesses than each other. The one or more spacer layers may include silicon oxide ($SiO_2$), silicon nitride (SiN or $Si_3N_4$), silicon oxynitride (SiON), silicon carbon nitride (SiCN), another low-K dielectric, or a combination thereof, and may be deposited by CVD, ALD or another deposition process. The spacer layers are then anisotropically etched to form the inner spacers 153. The etching process may include an ME, NBE, or other etching processes.

Figure 8:
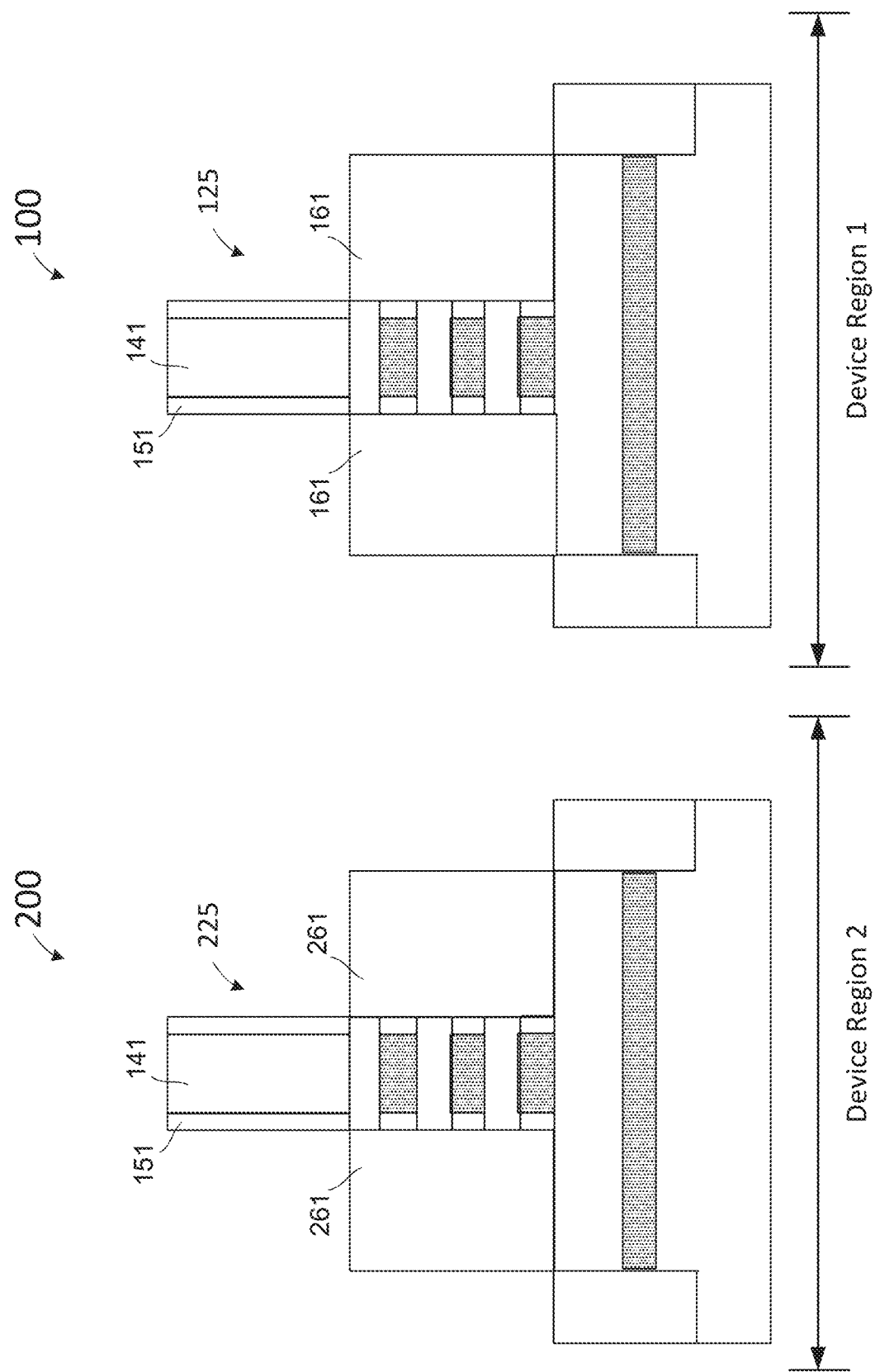

In FIG. 8, semiconductor structures 161 and 261 are formed on the sides of fin structures 125 and 225 in device region 1 and device region 2, respectively. In some instances, the top surfaces of semiconductor structures 161 and 261 may be higher than or at the same level with the top surfaces of the fin structures 125 and 225. The semiconductor structures 161 in the device region 1 and semiconductor structures 261 in the device region 2 may be made of different semiconductor materials formed by epitaxial processes. The semiconductor materials include silicon (Si), silicon germanium ($SiGe_1$-x, where x can be between approximately 0 and 1), silicon carbide (SiC), silicon phosphide (SiP), germanium, an III-V compound semiconductor, an II-VI compound semiconductor, or another epitaxial semiconductor. The materials of an III-V compound semiconductor may include InAs, AlAs, GaAs, InP, GaN, InGaAs, InAlAs, GaSb, AlSb, AlP, GaP, or another suitable compound semiconductor.

In some embodiments, semiconductor structures 261 in the device region 2 will be used to form source and drain structures of metal-oxide semiconductor field effect transistors (MOSFET), including NMOS transistors or PMOS transistors. In some embodiments, semiconductor structures 261 for NMOS transistors are made of SiC, and semiconductor structures 261 for PMOS transistors are made of SiGe. In some embodiments, semiconductor structures 161 in the device region 1 can be used or replaced to form an electrode for a capacitor or source and drain regions of a transistor, as will be described in detail below.

The semiconductor structures 161 and the semiconductor structures 261 may be independently formed by metal-organic CVD (MOCVD), molecular beam epitaxy (MBE), liquid phase epitaxy (LPE), vapor phase epitaxy (VPE), selective epitaxial growth (SEG), or another suitable process, or a combination thereof. In addition, the semiconductor structures 161 and the semiconductor structures 261 may be independently doped by in-situ doping during the epitaxial growth and/or by implantation after the epitaxial growth. In this case, patterned hard masks are used to protect the regions not receiving deposition or doping.

In some embodiments, semiconductor structures 161 in device region 1 will be replaced by a different material. In these cases, semiconductor structures 161 and 261 can be formed simultaneously to simplify the process.

When used as source and drain structures, semiconductor structures 161 and 261 may be shared between two neighboring transistors, such as through coalescing the structures by epitaxial growth. For example, the neighboring FinFETs with the shared source and drain structures may be implemented as two functional transistors. Other configurations in other examples may implement other numbers of functional transistors.

Figure 9:
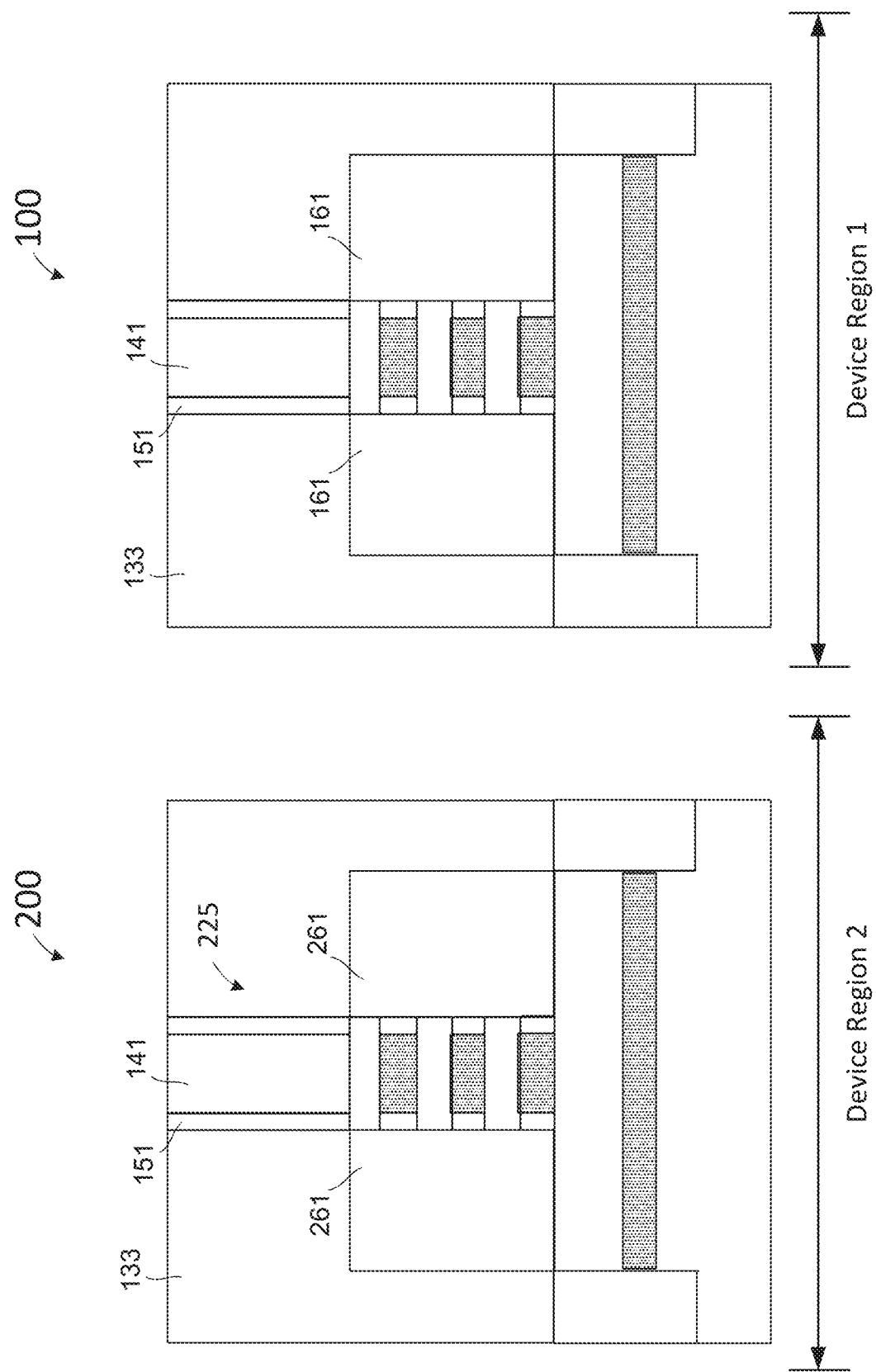

In FIG. 9, an interlayer dielectric (ILD) layer 133 is formed on the sides of the structures in FIG. 8, in accordance with some embodiments. In this process, an interlayer dielectric (ILD) layer 133 is formed on the source and drain structures 122. In some embodiments, a contact etch stop layer (CESL) can be deposited before the deposition of the ILD layer 133. The ILD layer 133 is then deposited on the CESL, which is not shown to simplify the drawing. The CESL can provide a mechanism to stop an etching process when forming contacts to the semiconductor layers. The CESL may be formed of a dielectric material having a different etch selectivity from the adjacent ILD layer 144. The material of the CESL may include silicon nitride (SiN or $Si_3N_4$), silicon carbon nitride (SiCN), or a combination thereof, and may be deposited by CVD, PECVD, ALD, or another deposition process. The material of the ILD layer 133 may include silicon dioxide ($SiO_2$) or a low-k dielectric material (e.g., a material having a dielectric constant (k-value) lower than the k-value (about 3.9) of silicon dioxide). The low-k dielectric material may include silicon oxynitride (SiON), phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG), another low-k dielectric material, or a combination thereof. The ILD layer 133 may be deposited by spin-on coating, CVD, Flowable CVD (FCVD), PECVD, PVD, or another deposition process.

After the deposition of the ILD layer 133, a planarization process, for example a chemical mechanical polishing (CMP) process, is performed on the ILD layer 133 and the CESL. After the planarization process, the dummy gate structure 141 are exposed. The top surfaces of the ILD layer 133 and the CESL 142 may be coplanar with the top surfaces of the dummy gate electrode layers 141 and the gate spacers 151, as shown in FIG. 9.

Figure 10:
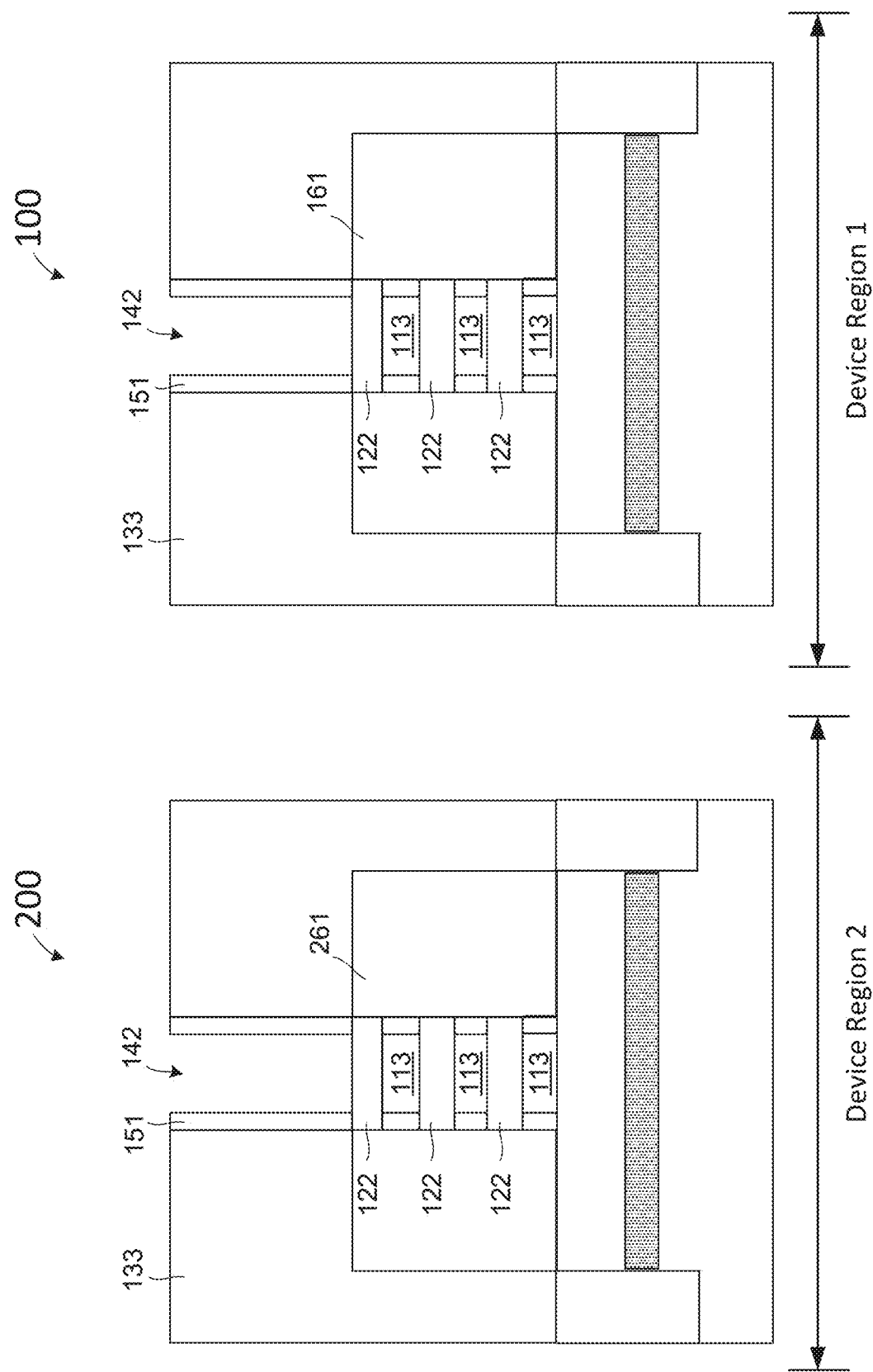

In FIG. 10, the dummy gate structure 141 and the first semiconductor strips 112 are removed, in accordance with some embodiments. The dummy gate structure 141 and the first semiconductor strips 112 in FIG. 9 can be removed using one or more etching processes. Removing the dummy gate structure 141 leaves a void 142 in its place, and removing the first semiconductor strips 112 in FIG. 9 forms first voids 113 between adjacent second semiconductor strips 122, in both the first and the second stacked structures 125 and 225. In some embodiments, each of the first voids 113 can have a height in a range from about 3 nm to about 15 nm. The semiconductor strips 122 are stacked and separated from each other by a distance that is in a range from about 3 nm to about 15 nm. Each of the semiconductor strips 122 can have a thickness in a range from about 3 nm to about 15 nm. However, it is understood that the thickness and spacing ranges are only cited as examples, and variations can be made depending on the applications. The stacked semiconductor strips 122 may also be referred to as nanostructures, nanosheets, or nanowires. As described below, semiconductor strips 122 can serve as channel layers of transistors formed subsequently.

Depending on the material compositions of the dummy gate structure 141 and the first semiconductor strips 112, appropriate etching processes can be used. For example, in some embodiments, the dummy gate structure 141 includes polysilicon as the dummy electrode material, and the etching of the dummy gate structure can be carried out using known dry or wet polysilicon etching processes. In the embodiments where semiconductor strips 112 are made of Si and semiconductor strips 122 are made of SiGe. The etching of first semiconductor strips 112 can include using a dry etching process or a wet etching process with a higher etching rate of Si than SiGe. For example, the wet etching process can include using a mixture of sulfuric acid ($H_2SO_4$) and hydrogen peroxide ($H_2O_2$) (SPM) and/or a mixture of ammonia hydroxide ($NH_4OH$) with $H_2O_2$ and deionized (DI) water (APM), or another suitable etchant. As a result of the etching of first semiconductor strips 112, suspended regions of second semiconductor strips 122 can be formed with first voids 113 between them.

Figure 11:
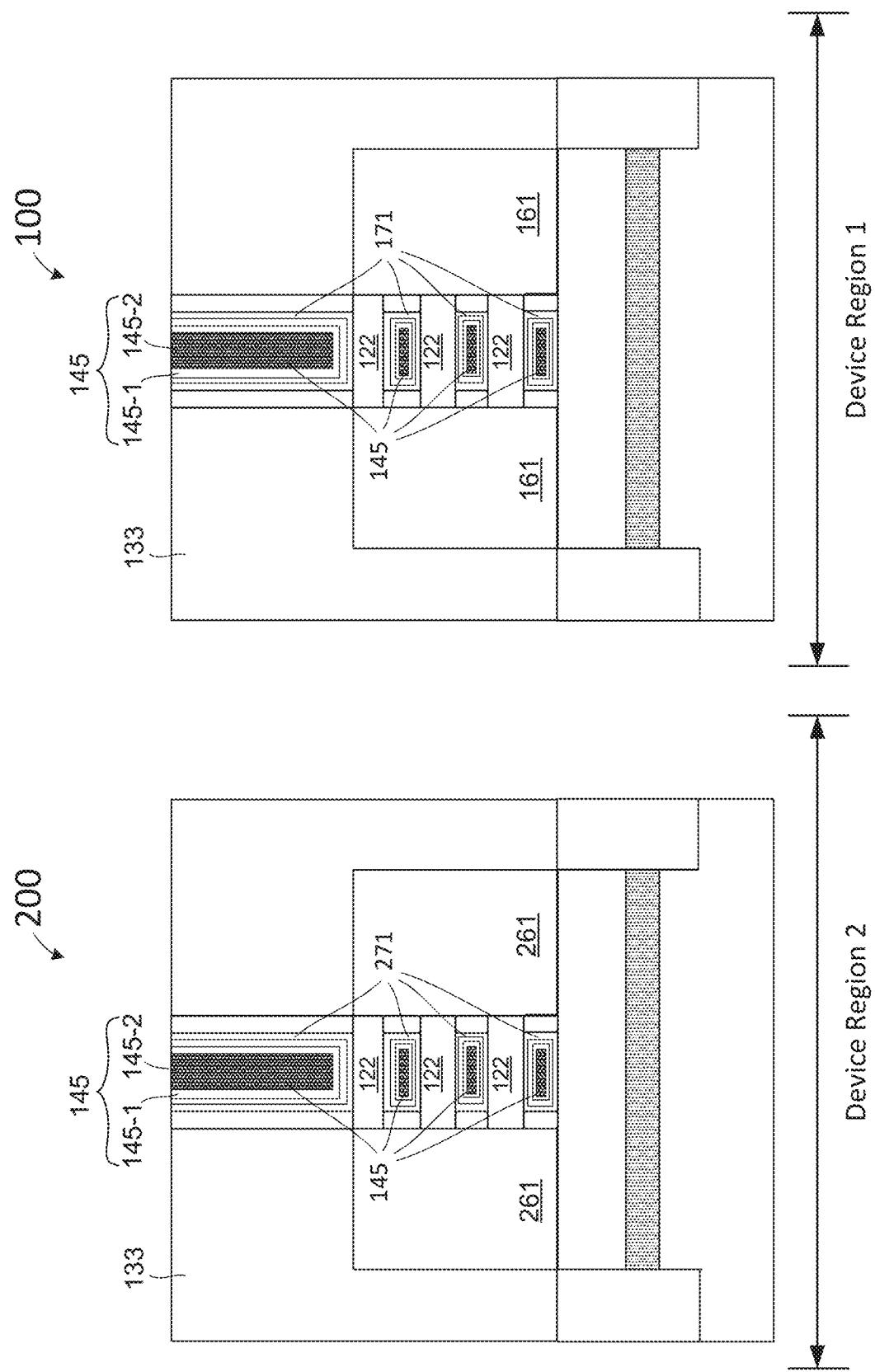

In FIG. 11, a first dielectric structure layer 171 and a second dielectric structure layer 271 are deposited to surround the second semiconductor strips 122 in the first and second device regions, respectively. Next, a first conductive fill material 145 is deposited to surround the first dielectric structure layer and the second dielectric structure layer, respectively.

In device region 1, the first dielectric structure layer 171 is formed in the first voids 113, shown in FIG. 10, between the second semiconductor strips 122 and the void 142 vacated by the dummy gate structure 141. As a result, the first dielectric structure layer 171 is formed surrounding the second semiconductor strips 122. The first dielectric structure layer 171 can include an interfacial layer (IL), which is not shown separately to simplify the drawings. As an example, the interfacial oxide layer can be formed by exposing the second semiconductor strips 122 to an oxidizing ambient. The oxidizing ambient can include a combination of ozone ($O_3$), a mixture of ammonia hydroxide ($NH_3OH$), hydrogen peroxide ($H_2O_2$), and water, also known as the SC1 solution, and/or a mixture of hydrochloric acid (HCl), hydrogen peroxide, ($H_2O_2$), and water, also known as the SC2 solution, or another suitable oxidizing ambient. As a result of the oxidation process, oxide layers ranging from about 0.5 nm to about 1.5 nm, also referred to as chemical oxide or native oxide, can be formed on the exposed surfaces of the second semiconductor strips 122. However, it is understood that the thickness range is only cited as examples, and variations can be made depending on the applications.

The first dielectric structure layer 171 can be substantially conformally deposited on the interfacial oxide layers. In some embodiments, the gate dielectric layer can include a dielectric material with a dielectric constant (k-value) higher than about 3.9. In some embodiments, the gate dielectric layer can include (i) silicon oxide, silicon nitride, and/or silicon oxynitride, or another suitable dielectric material, (ii) a high-k dielectric material, including ferroelectric materials, such as hafnium oxide ($HfO_2$), $TiO_2$, HfZrO, $Ta_2O_3$, $HfSiO_4$, $ZrO_2$, $ZrSiO_2$, or another suitable ferroelectric material, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or another suitable high-k dielectric material, or (iv) a combination thereof. The first dielectric structure layer 171 with high-k dielectric layer (e.g., HfZrO or $HfO_2$) can be formed by ALD and/or other suitable methods. In some embodiments, the first dielectric structure layer 171 can be formed with ALD using hafnium chloride ($HfCl_4$) as a precursor at a temperature ranging from about 250° C. to about 350° C. However, it is understood that the temperature range is only cited as examples, and variations can be made depending on the applications. In some embodiments, the first dielectric structure layer 171 can have a thickness ranging from about 1 nm to about 3 nm in order to wrap around the second semiconductor strips 122 without being constrained by spacing between adjacent the second semiconductor strips 122. However, it is understood that the thickness range are only cited as examples, and variations can be made depending on the applications.

Similarly, in device region 2, the second dielectric structure layer 271 are formed in the first voids 113 between the second semiconductor strips 122 and the void 142 vacated by the dummy gate structure 141. As a result, the second dielectric structure layer 271 is formed surrounding the second semiconductor strips 122. The second dielectric structure layer 271 can include an interfacial layer (IL), which is not shown separately to simplify the drawings. As an example, the interfacial oxide layer can be formed by exposing the second semiconductor strips 122 to an oxidizing ambient. The oxidizing ambient can include a combination of ozone ($O_3$), a mixture of ammonia hydroxide ($NH_3OH$), hydrogen peroxide ($H_2O_2$), and water, also known as the SC1 solution, and/or a mixture of hydrochloric acid (HCl), hydrogen peroxide, ($H_2O_2$), and water, also known as the SC2 solution. As a result of the oxidation process, oxide layers ranging from about 0.5 nm to about 1.5 nm, also referred to as chemical oxide or native oxide, can be formed on the exposed surfaces of the second semiconductor strips 122. However, it is understood that the thickness range is only cited as examples, and variations can be made depending on the applications.

The second dielectric structure layer 271 can be substantially conformally deposited on the interfacial oxide layers. In some embodiments, the gate dielectric layer can include a dielectric material with a dielectric constant (k-value) higher than about 3.9. In some embodiments, the gate dielectric layer can include (i) silicon oxide, silicon nitride, and/or silicon oxynitride, or another suitable dielectric material, (ii) a high-k dielectric material, including ferroelectric materials, such as hafnium oxide ($HfO_2$), $TiO_2$, HfZrO, $Ta_2O_3$, $HfSiO_4$, $ZrO_2$, $ZrSiO_2$, or another suitable ferroelectric material, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or another suitable high-k dielectric material, or (iv) a combination thereof. The second dielectric structure layer 271 with high-k dielectric layer (e.g., HfZrO or $HfO_2$) can be formed by ALD and/or other suitable methods. In some embodiments, the second dielectric structure layer 271 can be formed with ALD using hafnium chloride ($HfCl_4$) as a precursor at a temperature ranging from about 250° C. to about 350° C. However, it is understood that the temperature range is only cited as examples, and variations can be made depending on the applications. In some embodiments, the second dielectric structure layer 271 can have a thickness ranging from about 1 nm to about 3 nm in order to wrap around the second semiconductor strips 122 without being constrained by spacing between the second semiconductor strips 122. However, it is understood that the thickness ranges are only cited as examples, and variations can be made depending on the applications.

In some embodiments, the first dielectric structure layer 171 includes high-k dielectric layer HfZrO for increased charge storage when a capacitor or memory device is formed in device region 1.

In some embodiments, during device fabrication, the etching of the dielectric structure layers and metal layers can be performed using atomic layer etching (ALE) with a control process based on artificial intelligence (A.I.) or machine learning, as described below with reference to FIG. 25.

Referring back to FIG. 11, the first dielectric structure layer 171 and the second dielectric structure layer 271 are deposited to surround the second semiconductor strips 122 in the device regions 1 and 2, respectively. When different dielectric structure layers are desirable in device regions 1 and 2, a patterned hard mask can be used to protect the device region not receiving the deposition.

Next, a first conductive fill material 145 is formed over the first dielectric structure layer 171 and the second dielectric structure layer 271 to surround the second semiconductor strips 122 in device regions 1 and 2, respectively. In some embodiments, the first conductive fill material 145 includes an adhesion/barrier layer 145-1 and a metal fill material 145-2. For example, the adhesion/barrier layer 145-1 can include a titanium nitride (TiN) layer, and the metal fill material 145-2 can include a tungsten (W) material. The adhesion/barrier layer 145-1 can improve the adhesion between the metal fill material and the dielectric structure layer and prevent diffusion of elements (e.g., metals and oxygen) into dielectric structure layers. In some embodiments, the titanium nitride (TiN) layer can be replaced with other suitable materials, such as TaN, TiN, TaAlN, TiAlN, TaSiN, TiSiN, or AlN, etc. Similarly, the tungsten (W) material can be replaced by other conductive materials, such as cobalt (Co). The formation of adhesion/barrier layer 145-1 and metal fill material 145-2 can be made by known processes, such as ALD, CVD, etc., or another suitable process.

As shown in FIG. 11, in device region 2, the first conductive fill material 145 is configured to form a gate electrode for a gate-all-around (GAA) transistor, with dielectric structure 271 as the gate dielectric, and semiconductor structures 261 as the source and drain regions. In some embodiments, the structure in device region 1 can be used to form a memory device, such as a capacitor for a DRAM-like memory device or a ferroelectric random access memory (FeRAM) element. The process of forming the memory device in device region 1 is illustrated below with reference to FIGS. 12, 13, 14A, 14B, 15A, and 15B. During this process, the structure in device region 2 can be protected with a mask, such as a patterned photo resist layer or hard mask.

Figure 12:
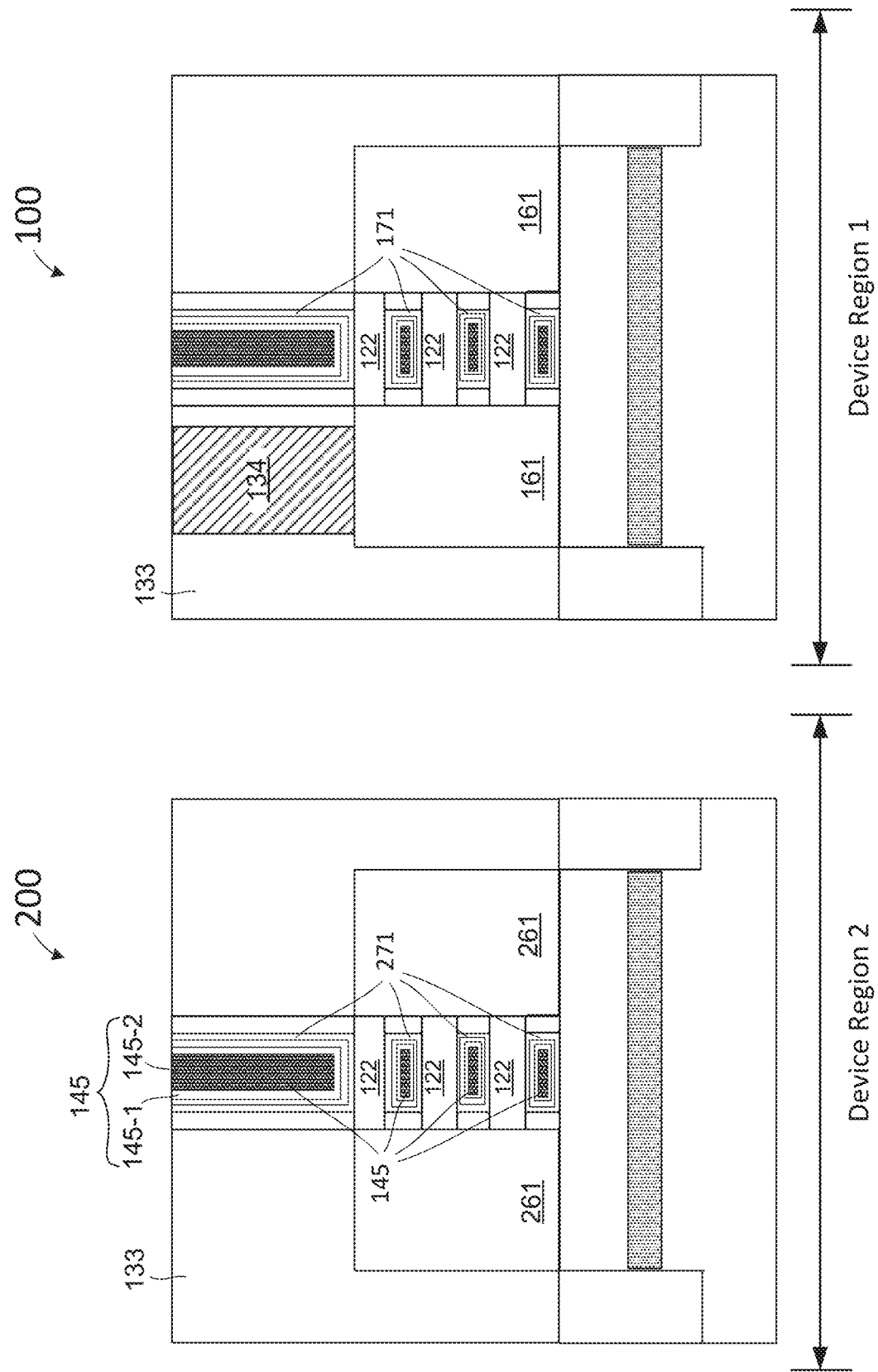

In FIG. 12, a void 134 is formed in the ILD layer 133 in the first device region. The void 134 can be formed by etching the ILD layer using a known etching process with a patterned mask. The void 134 exposes semiconductor region 161.

Figure 13:
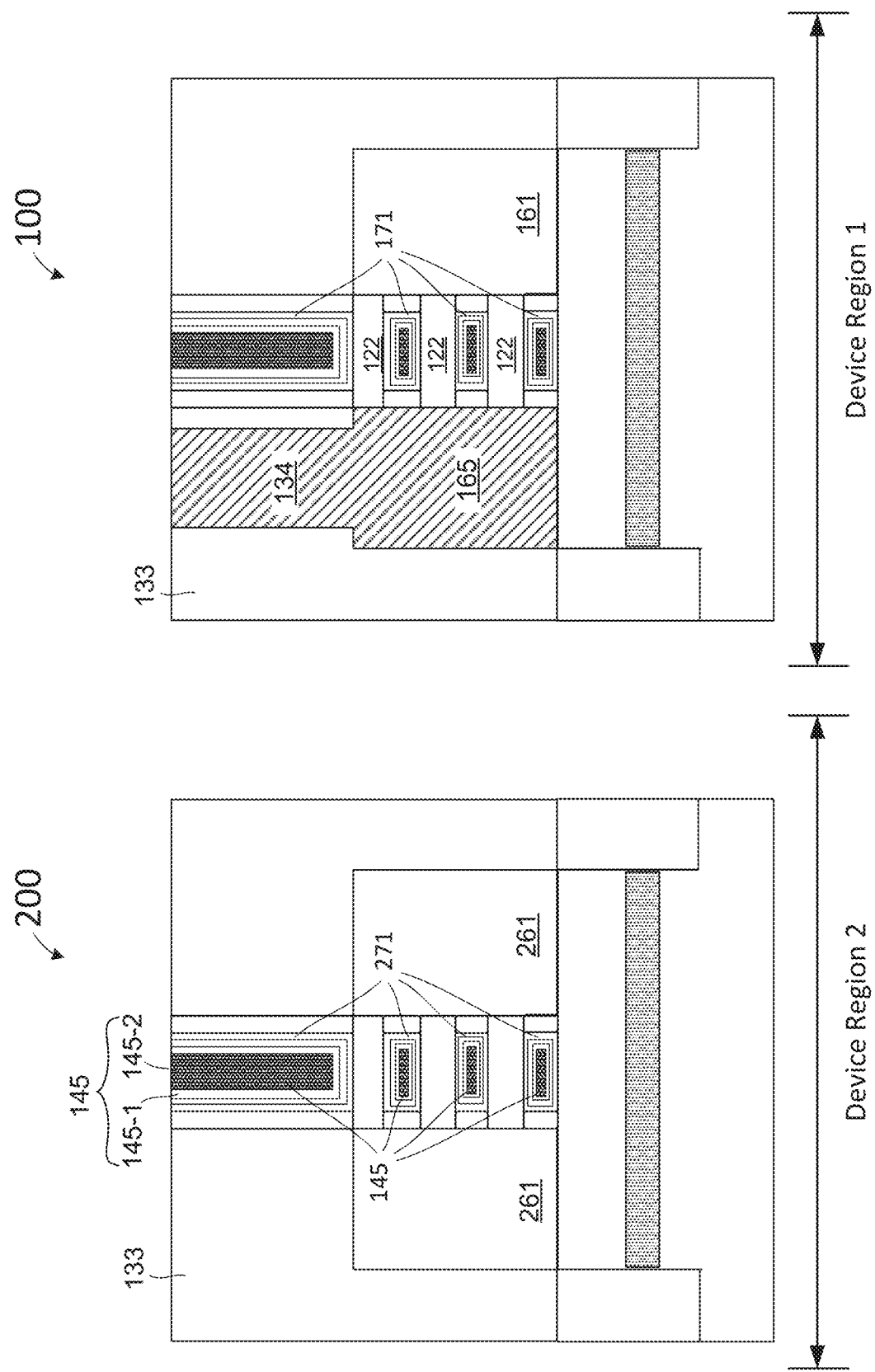

In FIG. 13, a portion of semiconductor regions 161 in the first device region is removed to form a void 165 and expose the second semiconductor strips 122. In embodiments where the semiconductor region 161 is made of SiGe and the second semiconductor strip 122 is made of Si, selective etchant, e.g., TMAH, that etches SiGe at a higher rate than Si can be used to remove a portion or all of semiconductor regions 161.

FIGS. 14A, 15A, 16A, and 17A illustrate cross-sectional views of respective intermediate structures at various stages of an exemplary method for fabricating a GAA capacitor in device regions 1 and a GAA transistor in device region 2, in accordance with some embodiments. FIGS. 14B, 15B, 16B, and 17B illustrate cross-sectional views of respective intermediate structures at various stages of another exemplary method for fabricating a GAA FeRAM in device regions 1 and a GAA transistor in device region 2, in accordance with some embodiments.

Figure 14A:
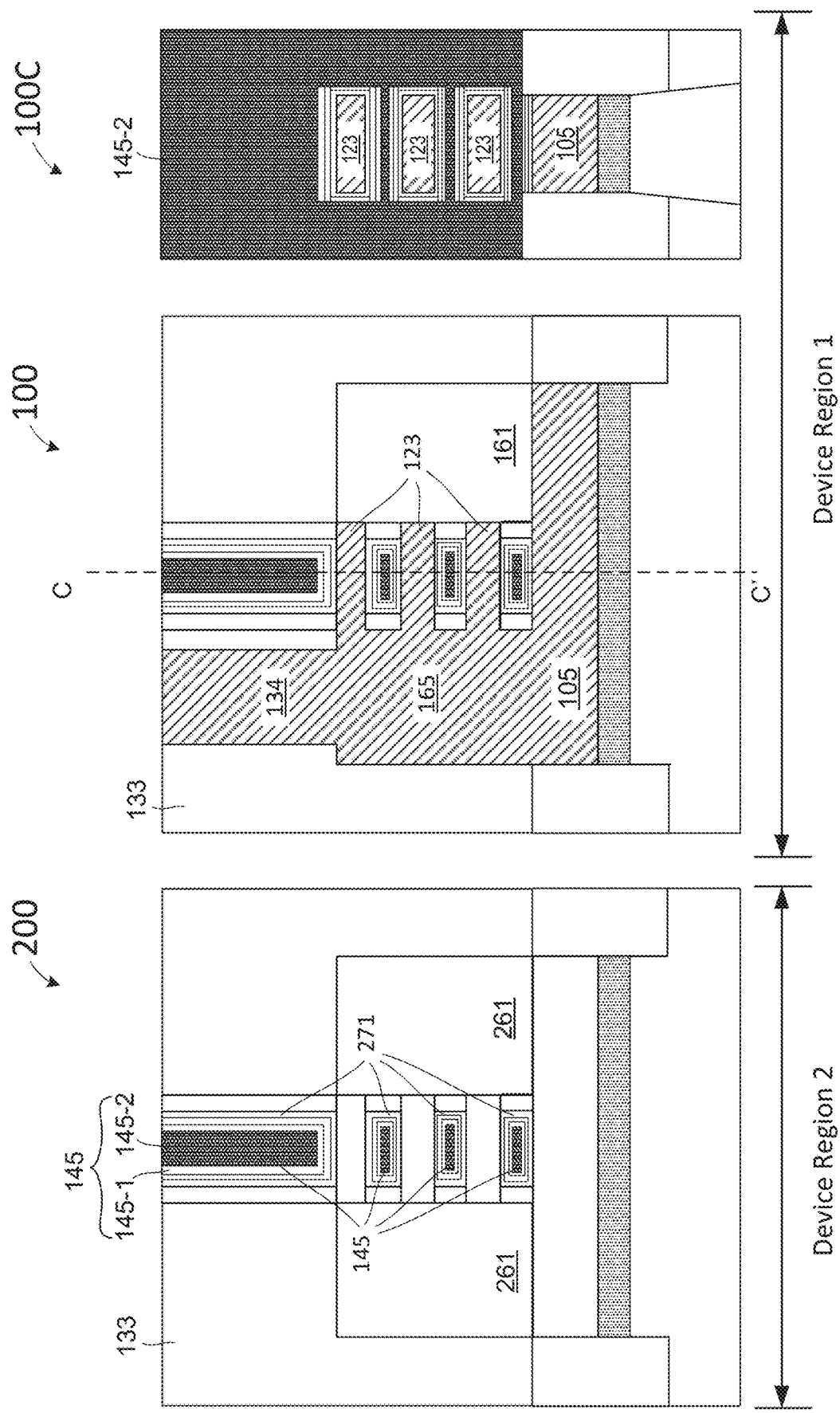
FIGS. 14A, 15A, 16A, and 17A illustrate cross-sectional views of respective intermediate structures at various stages of an exemplary method for fabricating semiconductor devices including a 3D gate-all-around (GAA) transistor and a 3D gate-all-around (GAA) capacitor, in accordance with some embodiments.

In FIG. 14A, the second semiconductor strips 122 in the first device region are removed to form second voids 123. As used herein, the second voids refer to the stacked void regions formed by removing stacked semiconductor strips 122, in contrast to first voids 113, which were formed by removing stacked semiconductor strips 112. Further, the semiconductor layer 103, as shown in FIG. 1A, is also removed to form a void 105. In device region 1, interconnected voids are formed, including voids 134, 165, 123, and 105. In embodiments where the second semiconductor strip 122 is made of Si, an isotropic Si etchant can be used to remove the second semiconductor strips 122. The right portion of FIG. 14A also shows a cross-sectional view 100C of the intermediate device structure 100 in device region 1 along a cutline C-C' shown in device region 1, which defines a plane perpendicular to the drawing sheet, similar to the plane defined by the cutline B-B' in FIG. 5B. The lateral dimension of the C-C' cross-sectional view 100C is shortened to fit in the figure.

Figure 14B:
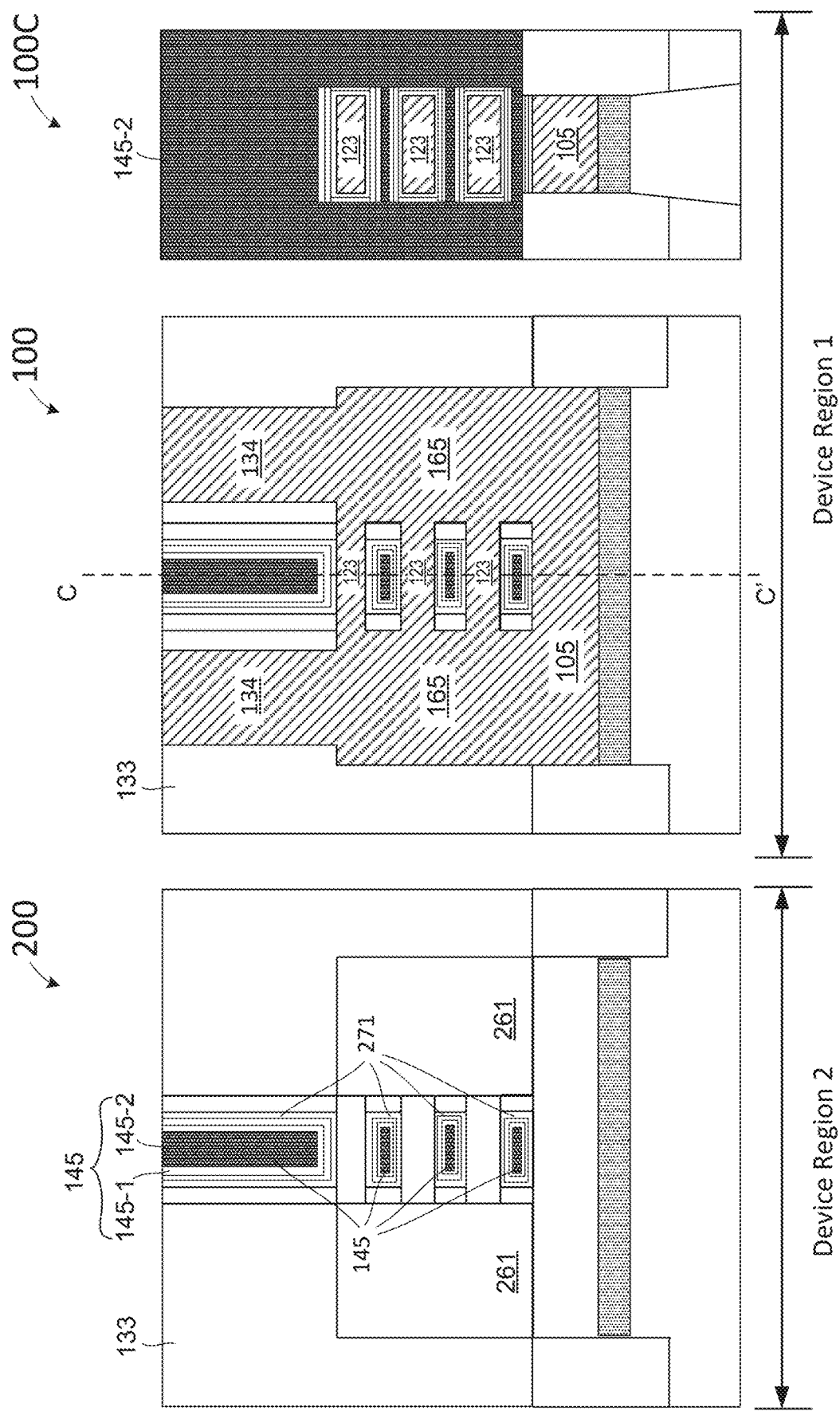
FIGS. 14B, 15B, 16B, and 17B illustrate cross-sectional views of respective intermediate structures at various stages of an exemplary method for fabricating alternative semiconductor devices including a 3D GAA transistor and a 3D GAA memory cell, in accordance with some embodiments.

FIG. 14B illustrates an alternative embodiment of forming the interconnected voids including voids 134, 165, and 123. In some embodiments, as shown in the intermediate device structure in FIG. 14B, voids 134 and 165 are formed on both sides of the stacked second voids 123 by modifying the processes in FIGS. 12 and 13 to etch dielectric layer 133 and semiconductor structure 161 on both sides of the stack. Suitable etching processes described above can be used in this process. The right portion of FIG. 14B also shows a cross-sectional view 100C of the intermediate device structure in device region 1 along a cutline C-C' shown device region 1, which defines a plane perpendicular to the drawing sheet, similar to the plane defined by cutline B-B' as shown in FIG. 5B. The lateral dimension of the C-C' cross-sectional view 100C is shortened to fit in the figure.

Figure 15A:
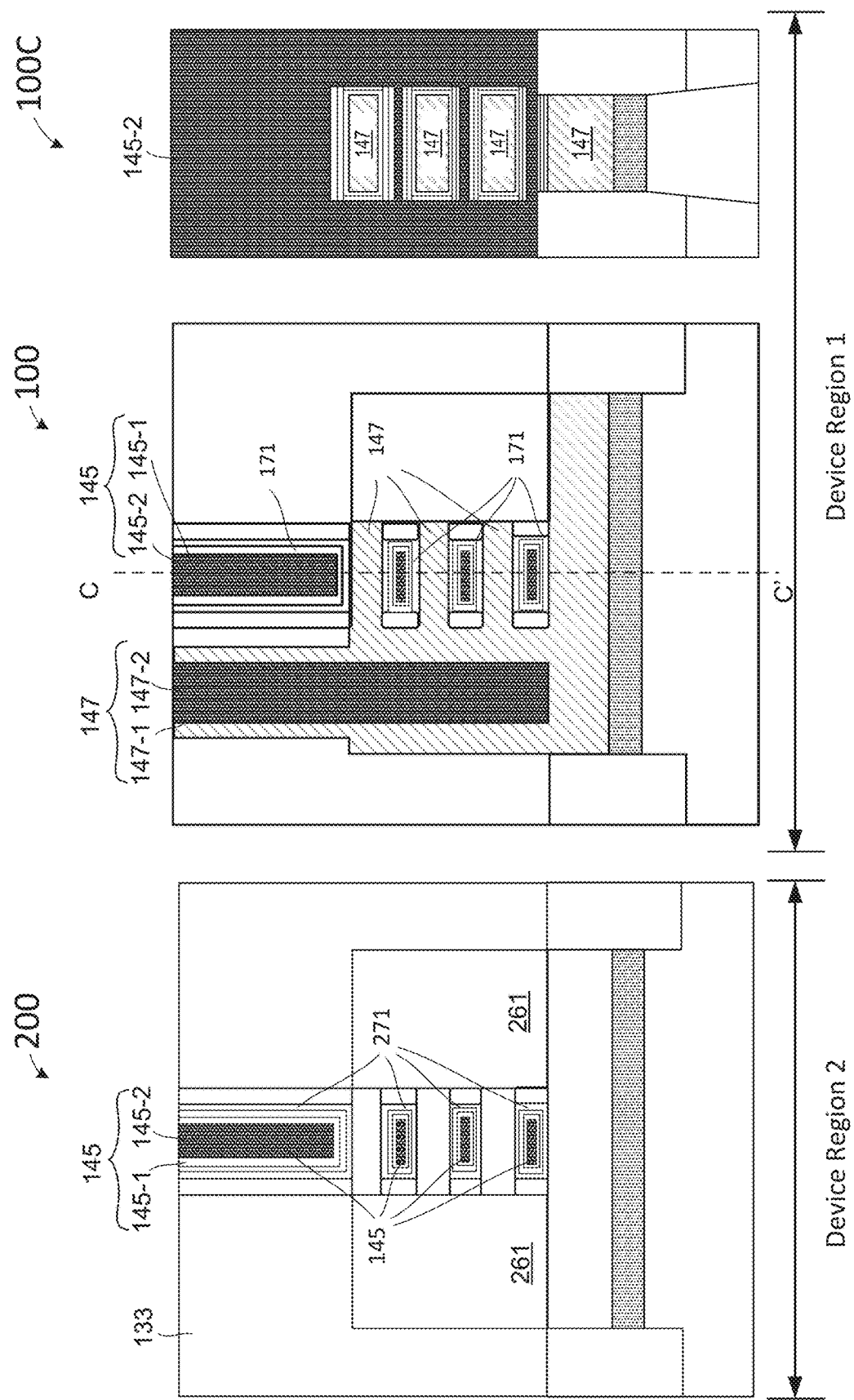
Figure 15B:
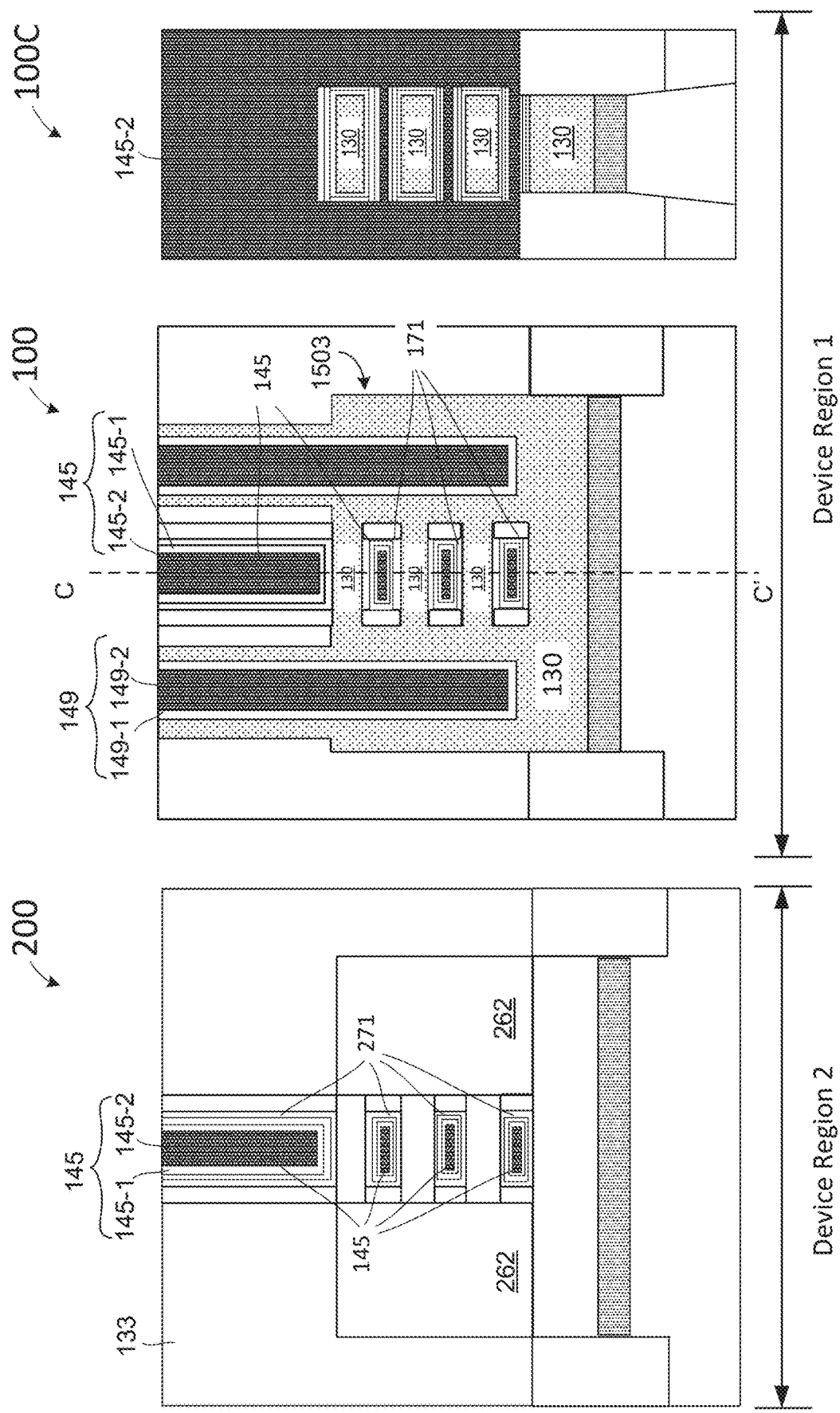
Figure 16A:
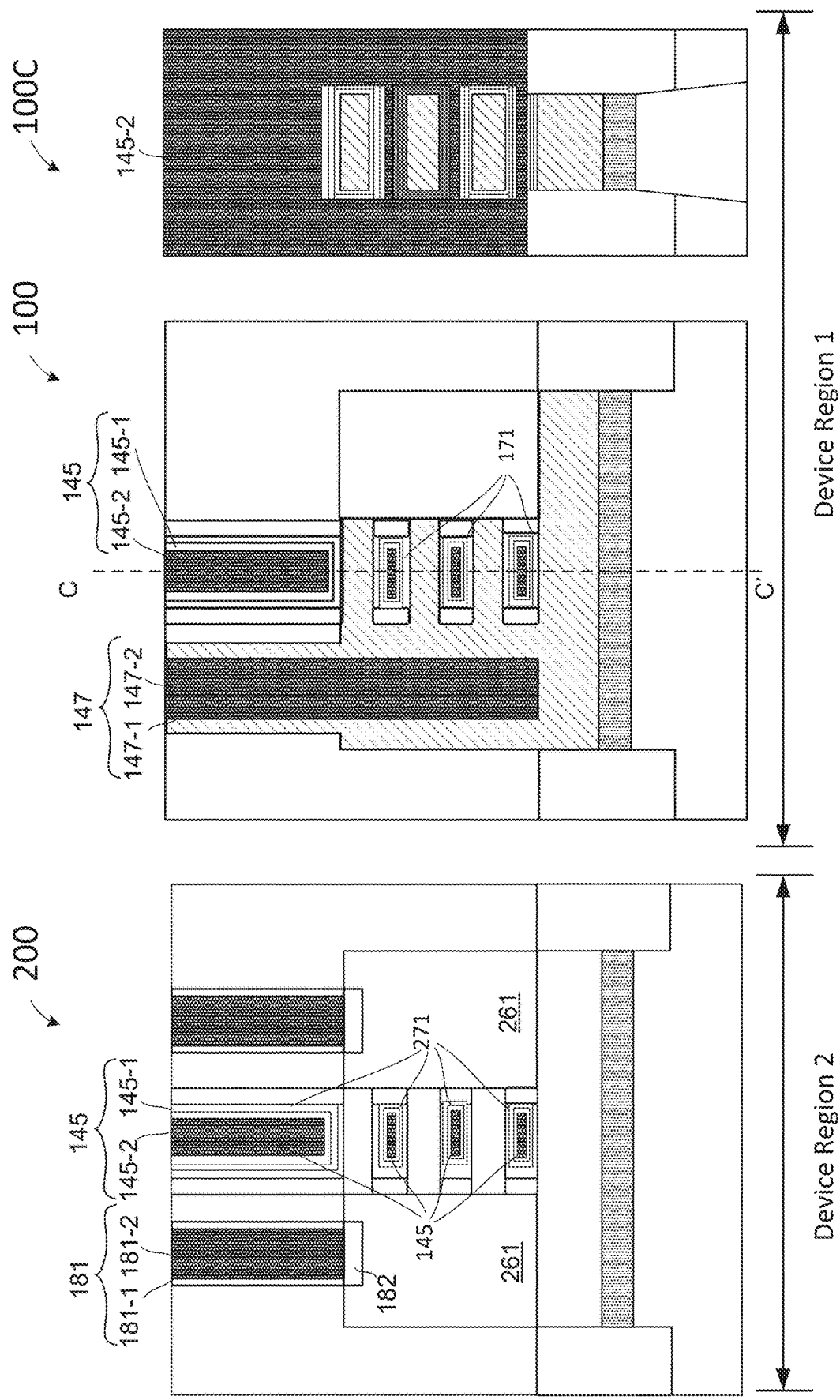
Figure 16B:
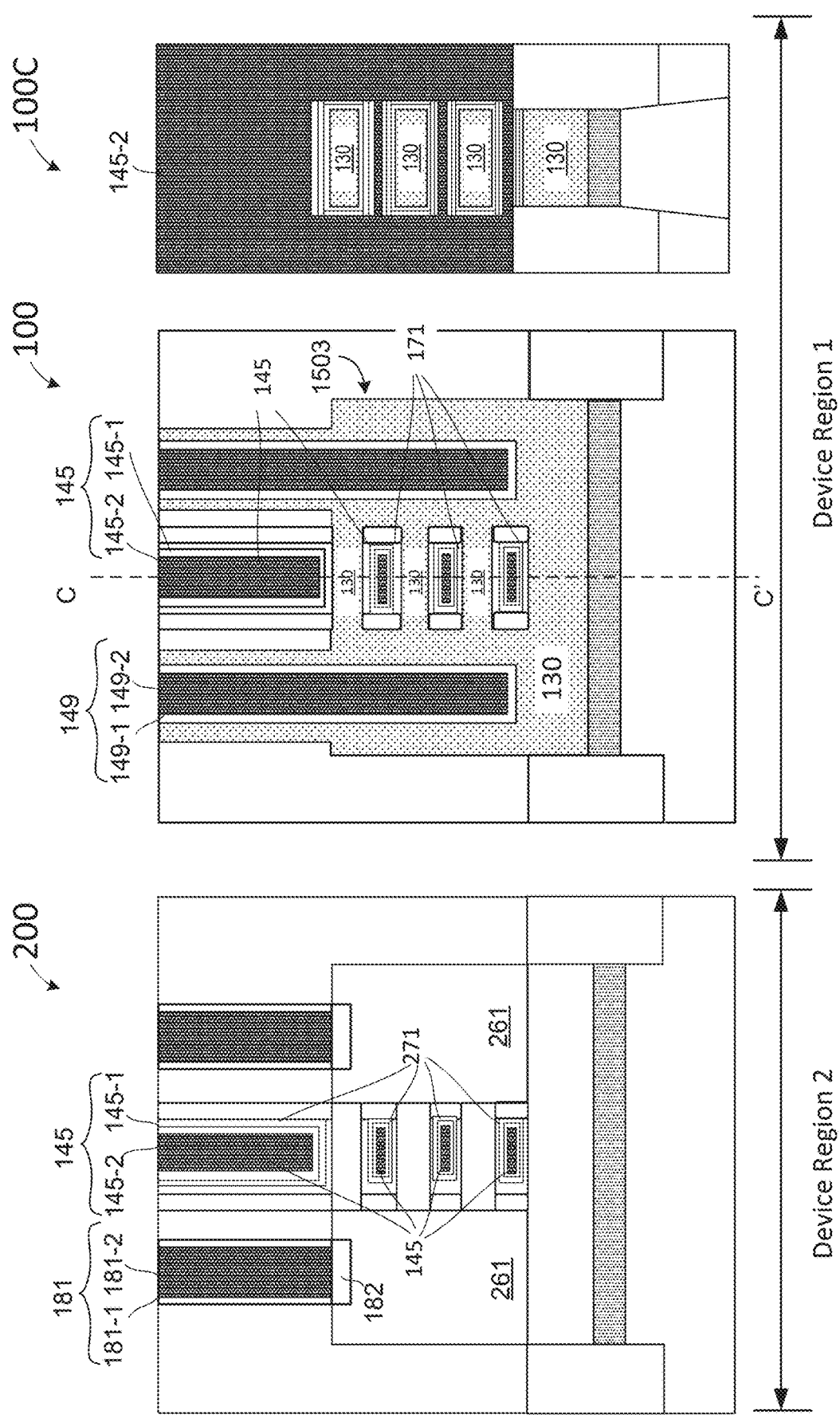
Figure 17A:
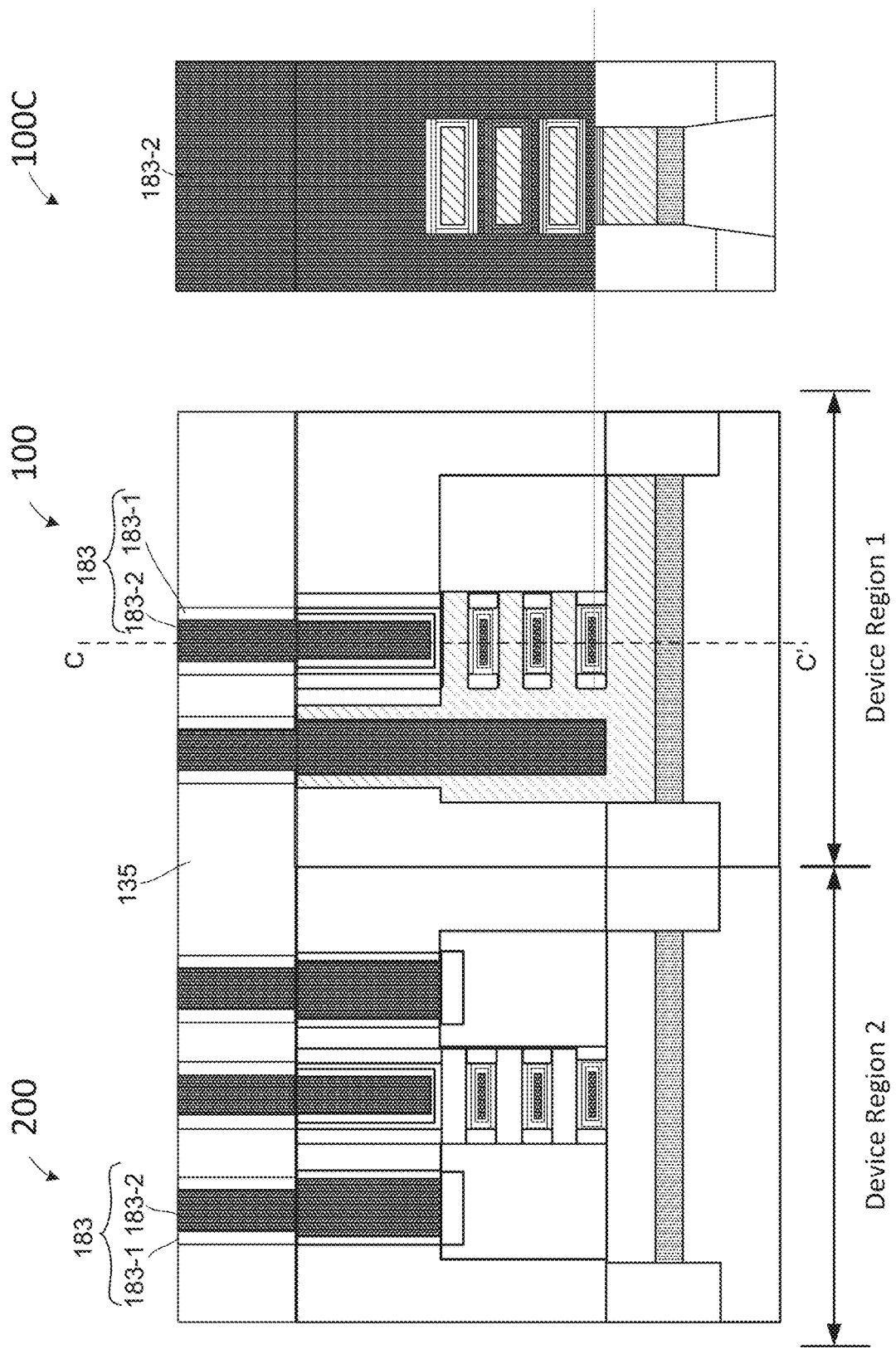
Figure 17B:
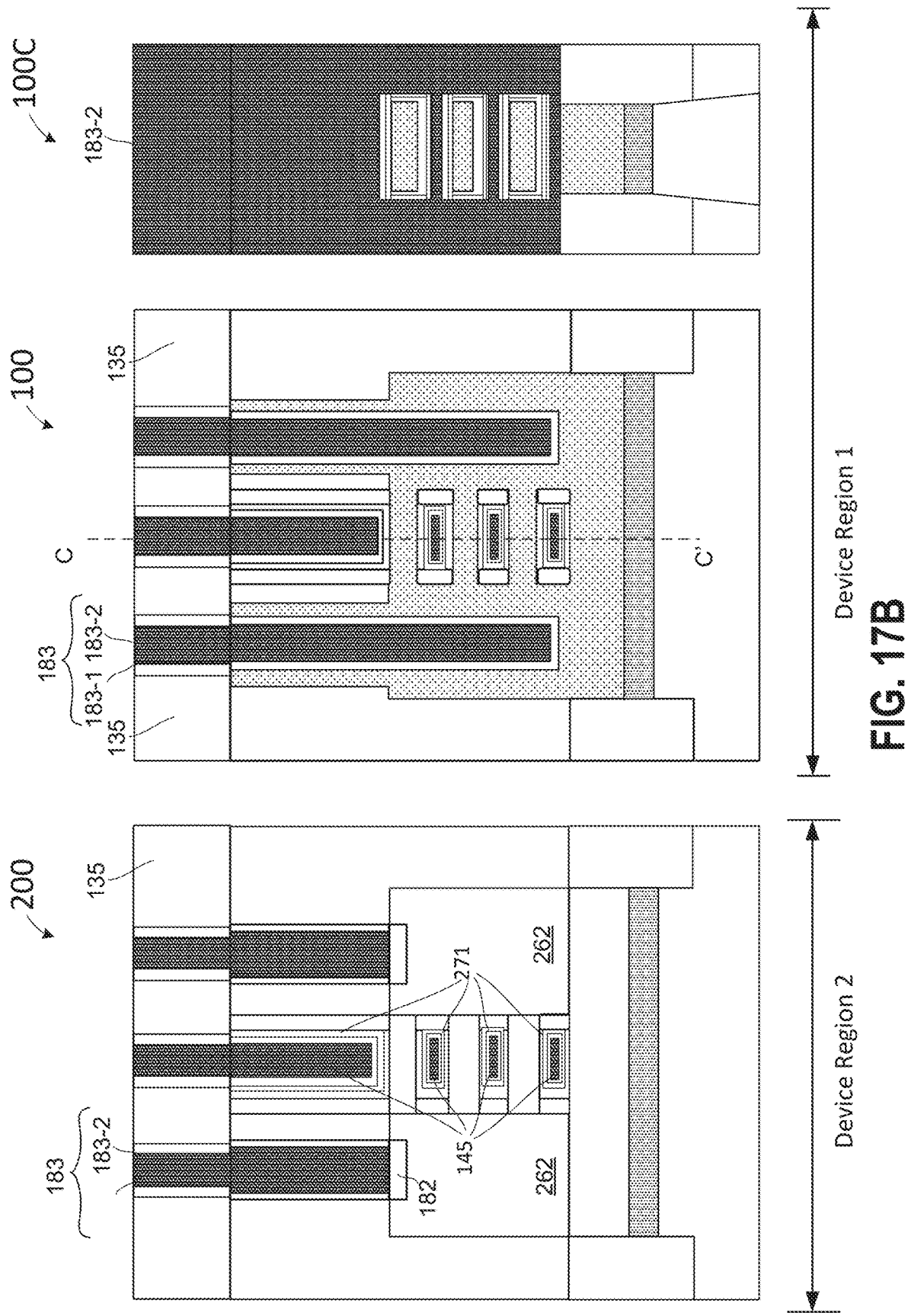

FIGS. 1-14B described above include common process stages and intermediate structures for a GAA ferroelectric capacitor and GAA 1T FeRAM. Different processes are used in subsequent steps. FIGS. 15A, 16A, and 17A illustrate cross-sectional views of respective structures at various stages of an exemplary method for fabricating a GAA ferroelectric capacitor and a GAA transistor, in accordance with some embodiments. FIGS. 15B, 16B, and 17B illustrate cross-sectional views of respective structures at various stages of an exemplary method for fabricating a GAA 1T FeRAM and a GAA transistor, in accordance with some embodiments.

In FIG. 15A, in device region 1, starting from the intermediate device structure in FIG. 14A, a second conductive fill material 147 is deposited in the second voids 123 between portions of the first dielectric structure layer 171, the voids 134 formed in the ILD layer 133, and the void 165 formed in the semiconductor structure 161. In some embodiments, the second conductive fill material 147 will be configured to form an electrode for a capacitor. Therefore, the second conductive fill material 147 is selected from materials that have high electrical conductivity and can be conformally deposited on the interior surface of the interconnected voids 123, 134, and 165.

In some embodiments, the second conductive fill material 147 includes a first layer 147-1 and a second layer 147-2. In the example of 15A, the first layer 147-1 is deposited in the second voids 123 shown in FIG. 14A between portions of the first dielectric structure layers 171. The first layer 147-1 is deposited on the surface of the second voids 123 to provide a desirable interface to the dielectric structure layers 171, and may or may not completely fill the second voids 123, depending on the device structure and process condition. In some embodiments, the first layer 147-1 can be selected from refractive metal nitrides, such as TiN, TaN, MoN, and WN, etc., or other suitable materials. The second layer 147-2 can be deposited in the unfilled portion in void 133 and 165 to improve the conductivity of the contact to the capacitor electrode. In some embodiments, the second layer 147-2 can be selected from metals suitable for forming contact plugs, such as W, Co, Mo, Ru, and Ir, etc., or other suitable materials.

In some embodiments, the second conductive fill material 147 includes an adhesion/barrier layer 147-1 and a metal fill material 147-2. For example, the adhesion/barrier layer 147-1 can include a titanium nitride (TiN) layer, and the metal fill material 147-2 can include a tungsten (W) material. The adhesion/barrier layer 147-1 can improve the adhesion between the metal fill material and the dielectric structure layer and prevent diffusion of elements (e.g., metals and oxygen) dielectric structure layers. The formation of adhesion/barrier layer 147-1 and metal fill material 147-2 can be made by known processes, such as ALD, CVD, etc. The right portion of FIG. 15A also shows a cross-sectional view 100C of device 100 along a cutline C-C' shown device region 1, which defines a plane perpendicular to the drawing sheet. The lateral dimension of the C-C' cross-sectional view 100C is shortened to fit in the figure.

In an alternative embodiment, the GAA ferroelectric capacitor can be formed using the process described in connection to FIG. 15A, but starting with the intermediate device structure in device region 1 of FIG. 14B, in which voids 134 and 165 are formed on both sides of the second voids 123. In this case, a second conductive fill material 147 is deposited in the interconnected voids shown in FIG. 14B.

FIG. 15B illustrates a cross-sectional view of an intermediate structure for a GAA 1T FeRAM, in accordance with some embodiments. Starting with the device structures in FIG. 14B, the structure in the device region 1 includes second voids 123 between portions of the first dielectric structure layer 171. As described above in connection with FIGS. 1-14B, the first dielectric structures 171 are formed in first voids 113 created by removing the first semiconductor strips 112, which are made of a first semiconductor material. Moreover, the second voids 123 are created by removing the second semiconductor strips 122, which are made of a second semiconductor material. The structure in the device region 1 also includes voids 134 formed in the ILD layer 133, and void 165 formed in the semiconductor structure 161. In FIG. 15B, a third semiconductor material 130 is deposited in the interconnected voids formed by the second voids 123 between portions of the first dielectric structure layer 171, the voids 134 formed in the ILD layer 133, and the void 165 formed in the semiconductor structure 161. In some embodiments, the first semiconductor material is SiGe, the second semiconductor material is Si, and the third semiconductor material 130 is indium gallium zinc oxide (IGZO). The right portion of FIG. 15B also shows a cross-sectional view 100C of device 100 along a cutline C-C' shown device region 1, which defines a plane perpendicular to the drawing sheet. The lateral dimension of the C-C' cross-sectional view 100C is shortened to fit in the figure.

IGZO is a metal-oxide semiconducting material, formed by indium (In), gallium (Ga), zinc (Zn) and oxygen (O). IGZO is an amorphous semiconductor material, which has 20-50 times the electron mobility of amorphous silicon. It can be deposited as a uniform amorphous phase while retaining the high carrier mobility. Using other semiconductor materials, it would be difficult to form single crystalline epitaxial semiconductor materials in the interconnected voids described above. Therefore, IGZO is suitable as a filling material to fill in the interconnected voids to form the integral semiconductor structure 1503 in FIG. 15B. IGZO is a metal-oxide semiconductor and can avoid low-k interfacial layer with high-k ferroelectric $HfO_2$ gate insulator. Moreover, IGZO is an N-type semiconductor and can be used in junctionless transistor operation, and avoid charge trapping, which occurs in inversion mode operation.

IGZO can be manufactured using a synthesis method, for example, a low temperature atomic layer deposition (ALD) process, for example, at or below 250° C. Alternatively, IGZO can be manufactured using solution processing, such as a pulsed laser deposition (PLD), or spin coating, which involves depositing In and Ga solution layers onto a hot plate and annealing at temperatures roughly between 200° C. and 400° C., depending on the target composition. Subsequently, the films can be annealed in air.

Next, a third conductive fill material 149 is deposited in the spaces in second voids 123 and 165 that are not filled by the third semiconductor material 130. In some embodiments, the third conductive fill material 149 can be similar to conductive fill materials 145 and 147 described above. The third conductive fill material 147 includes an adhesion/barrier layer 149-1 and a metal fill material 149-2. For example, the adhesion/barrier layer 149-1 can include a titanium nitride (TiN) layer, and the metal fill material 149-2 can include a tungsten (W) material. The adhesion/barrier layer 149-1 can improve the adhesion between the metal fill material and the dielectric structure layer and prevent diffusion of elements (e.g., metals and oxygen) dielectric structure layers. The formation of adhesion/barrier layer 149-1 and metal fill material 149-2 can be made by known processes, such as ALD, CVD, etc.

FIG. 16A and FIG. 16B illustrate the same device structures as shown in FIGS. 15A and 15B, respectively, with the additional feature of metal contact structures 181 for source and drain regions for the transistor device in device region 1, in accordance with some embodiments. In FIGS. 16A and 16B, metal contact structures 181 are formed in contact holes etched in the dielectric layer. In some embodiments, metal contact structure 181 includes an adhesion/barrier layer 181-1 and a metal fill material 181-2. For example, the adhesion/barrier layer 181-1 can include a titanium nitride (TiN) layer, and the metal fill material 181-2 can include a tungsten (W) material. The adhesion/barrier layer 181-1 can improve the adhesion between the metal fill material and the dielectric structure layer and prevent diffusion of elements (e.g., metals and oxygen) dielectric structure layers. The formation of adhesion/barrier layer 181-1 and metal fill material 181-2 can be made by known processes, such as ALD, CVD, etc. In some embodiments, metal contact structure 181 can also include a silicide layer 182 formed at the bottom of the contact hole to improve the adhesion and reduce contact resistance between the metal contact structure and the underlying semiconductor surface. The right portions of FIGS. 16A and 16B, respectively, also show cross-sectional views 100C of device 100 along a cutline C-C' shown device region 1, which defines a plane perpendicular to the drawing sheet. The lateral dimension of the C-C' cross-sectional view 100C is shortened to fit in the figure.

FIG. 17A and FIG. 17B illustrate the same device structures as shown in FIGS. 16A and 16B, respectively, with the addition of via structures 183 for source and drain regions for the transistor device in device region 2 and for electrodes in the memory device in device region 1, in accordance with some embodiments. In FIGS. 17A and 17B, via structures 183 are formed in vias etched in a dielectric layer 135 formed over the device structures in FIGS. 16A and 16B. In some embodiments, the via structure 183 includes an adhesion/barrier layer 183-1 and a metal fill material 183-2. For example, the adhesion/barrier layer 183-1 can include a titanium nitride (TiN) layer, and the metal fill material 183-2 can include a tungsten (W) material. The adhesion/barrier layer 183-1 can improve the adhesion between the metal fill material and the dielectric structure layer and prevent diffusion of elements (e.g., metals and oxygen) in dielectric structure layers. The formation of adhesion/barrier layer 183-1 and metal fill material 183-2 can be made by known processes, such as ALD, CVD, etc., or another suitable process. The right portions of FIGS. 17A and 17B, respectively, also show cross-sectional views 100C of device 100 along a cutline C-C' shown device region 1, which defines a plane perpendicular to the drawing sheet. The lateral dimension of the C-C' cross-sectional view 100C is shortened to fit in the figure.

Figure 18:
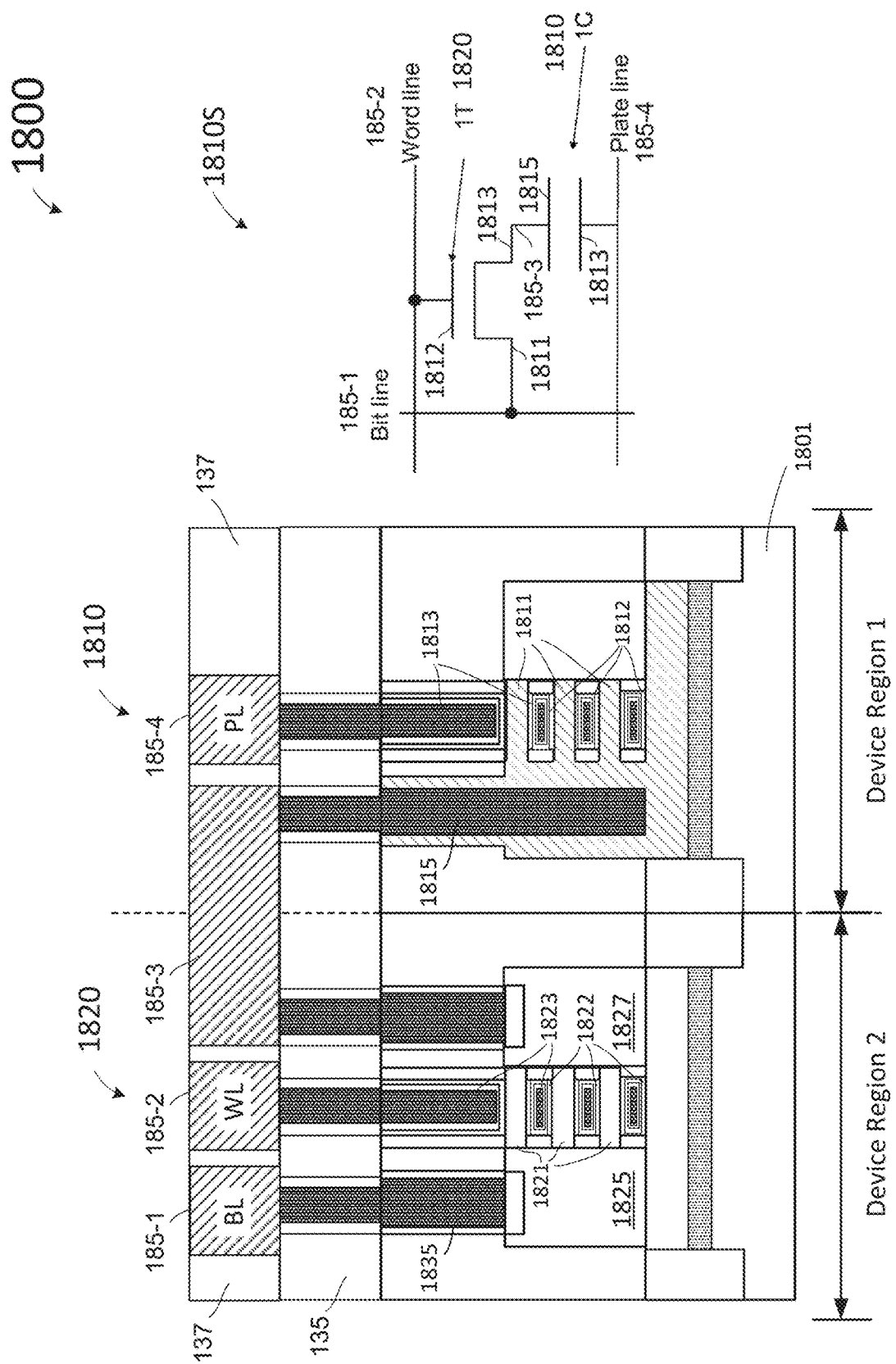
FIG. 18 illustrates a cross-sectional view and a schematic diagram of a semiconductor device formed including a GAA transistor and a GAA capacitor forming one-transistor one-capacitor ferroelectric random access memory (1T1C FeRAM), in accordance with some embodiments.

FIG. 18 illustrates a cross-sectional view and a schematic diagram of a semiconductor device formed by a GAA transistor and a GAA capacitor, in accordance with some embodiments. In FIG. 18, semiconductor device 1800 is a one-transistor-one-capacitor (1T1C) memory element, and includes a transistor 1820 and a capacitor 1810 shown in a cross-sectional view and a schematic diagram 1800S for the 1T1C memory element. Transistor 1820 is also referred to as an active device, and capacitor 1810 is also referred to as a passive device.

In FIG. 18, transistor 1820 and a capacitor 1810 have the same device structures as shown in FIG. 17A, with the addition of metal interconnect structures 185 for connecting transistor 1820 and capacitor 1810, in device regions 2 and 1, respectively. Metal interconnect structures 185 are formed in a dielectric layer 137 formed over the device structures in FIG. 17A. In some embodiments, metal interconnect structures 185 are formed by etching trenches in dielectric layer 137, followed by electro-copper plating (ECP) to fill the trenches with copper (Cu), and copper chemical-mechanical-polishing (CMP) for planarization.

In FIG. 18, device 1810 includes stacked conductive electrode strips 1811 disposed in a first device region (Device Region 1) of a substrate 1801, the stacked conductive electrode strips 1811 being separated from one another. A first dielectric structure layer 1812 is wrapped around the stacked conductive electrode strips 1811, and a conductive electrode layer 1813 is wrapped around the first dielectric structure layer 1812 and the conductive strips 1811. In some embodiments, the stacked conductive electrode strips 1811 can be made of titanium nitride (TiN). In alternative embodiments, other suitable material such as T, Ta, TaN, etc., can also be used. In some embodiments, the substrate 1801 can include SOI wafer or SiGe EPI wafer as an etching stop layer. In some embodiments, the SiGe EPI wafer may be doped with boron.

In FIG. 18, device 1820 includes stacked semiconductor strips 1821 disposed in a second device region (Device Region 2) of the substrate 1801, and the semiconductor strips 1821 separated from one another. A second dielectric structure layer 1822 is wrapped around the stacked semiconductor strips 1821, and a conductive electrode layer 1823 is wrapped around the second dielectric structure layer 1822 and the semiconductor strips 1821. In some embodiments, the stacked semiconductor strips 1821 can be made of Si or SiGe. In alternative embodiments, other suitable semiconductor materials as described above can also be used.

As shown in FIG. 18, device 1810, including the stacked first conductive strips 1811, the first dielectric structure layer 1812, and the conductive electrode 1813, in a gate-all-around (GAA) structure, is configured to form a capacitor as a charge storage memory device. The stacked first conductive strips 1811 and the conductive electrode 1813 are configured as the electrodes of GAA capacitor 1810. Device 1820, including the stacked semiconductor strips 1821, the second dielectric structure layer 1822, and the conductive electrode 1823, in a gate-all-around (GAA) structure, is configured to form a GAA transistor. The stacked semiconductor strips 1821 are configured to form channels of transistor 1820. In some embodiments, the first dielectric structure layer 1812 includes hafnium zirconium oxide (HfZrO), and the second dielectric structure layer 1822 includes hafnium oxide (HfO$_2$).

Metal interconnect structures 185 include a bit line (BL) 185-1 coupled to the drain 1825 of transistor 1820, a word line (WL) 185-2 coupled to the gate 1823 of transistor 1820, and an interconnect line 185-3 connecting the source 1827 of the transistor 1820. Interconnect line 185-3 also connects the source 1827 of the transistor 1820 to an electrode 1815 of the capacitor 1810. Metal interconnect structures 185 also include a plate line 185-4 coupled to the other electrode 1813 of the capacitor. As shown in the schematic diagram 1800S in FIG. 18, GAA transistor 1820 and GAA capacitor 1810 are connected as a one-transistor-one-capacitor (1T1C) memory, which can be a non-volatile memory (NVM) cell or a dynamic random access memory (DRAM) cell in a ferroelectric random access memory (FeRAM). The GAA of capacitor 1810, with the multiple stacked conductive electrode strips and wrapped around structure, provides a large effective area for the capacitor and increased charge storage capability. Moreover, hafnium zirconium oxide (HfZrO) is characterized by a high ferroelectric polarization, and can further provide higher charge storage capabilities.

In the example of FIG. 18, semiconductor device 1800 is an integrated device including an active device 1820, which is a GAA transistor that can be used in core/IO/SRAM regions, and passive device 1810, which is a 3D GAA capacitor structure. Devices 1810 and 1820 are disposed side by side and configured as a 1T1C FeRAM. Both capacitor 1810 and transistor 1820 have 3D GAA structure, such that the charge storage in the capacitor and the current drive in the transistor can be increased. Further, using the high-k dielectric structures increases charge storage capacity and allows thicker dielectric layers to be used. Moreover, in some embodiments, the FeRAM can include one transistor coupled to multiple capacitors for increase charge storage capacity, for example, 1T1C, 1T2C, 1T3C, 1T4C, . . . , 1TnC, where n is a positive integer.

As described above, transistor device 1820 includes a channel 1821, interfacial layer (not shown), high-k gate dielectric, tungsten gate fill material 1823, and contact plugs 1835. Similarly, the capacitor device 1810 includes a dielectric structure that has an interfacial layer (not shown), high-k gate dielectric 1812, tungsten gate fill material in conductive electrode 1813, and contact plugs 1835.

The channel 1821 for the transistor 1820 can be Si or SiGe, and can be in the shapes of stacked strips, nanosheet, or nanowire structures. The Si or SiGe channel can have at least three nanosheets or nanowires. In some embodiments, the channel length of the topmost Si or SiGe nanosheet is equal to or less than the channel length of the middle Si or SiGe nanosheet, and the channel length of the middle Si or SiGe nanosheet is equal to or less than the channel length of the bottom Si or SiGe nanosheet.

In some embodiments, the dielectric structure layer can include an interfacial layer (IL). In some embodiments, the thickness of the IL on the topmost Si or SiGe nanosheet is greater than the IL on the middle nanosheet, which, in turn, has a thickness that is greater than the IL on the bottom nanosheet. In 3D GAA capacitor 1810, the dielectric structure layer 1812 has an HfZrO layer with a thickness equal to or greater than 3 nm, and the Zr concentration is around 40%-60%. However, it is understood that the thickness and concentration ranges are only cited as examples, and variations can be made depending on the applications. The dielectric structure 1822 in transistor 1820 can be the same as dielectric structure 1812 in capacitor 1810. Alternatively, the dielectric structure 1822 in transistor 1820 can be different than 1812, for example, with $HfO_2$ replacing HfZrO. In some embodiments, the HfZrO and $HfO_2$ layers can have a crystalline phase, for example, an orthorhombic phase. In some embodiments, the thickness of the dielectric structure layers 1812 and 1822 on the topmost nanosheet is greater than the dielectric structure layers on the middle nanosheet, which, in turn, has a thickness that is greater than the dielectric structure layers on the bottom nanosheet. In some embodiments, during device fabrication, the etching of the dielectric structure layers can be performed using atomic layer etching (ALE) with a control process based on artificial intelligence (A.I.) or machine learning, as described below with reference to FIG. 25.

The metal gate structures 1813 and 1823 for capacitor 1810 and transistor 1820, respectively, can be single layer metal compound or multi-layer metal compound. The capacitor 1810 has stripped or nanosheet structures in the other electrode 1813 which can be single layer metal compound or multi-layer metal compound. In some embodiments, the sheet-sheet spacing can be 8-15 nm for transistor 1820 and 10-20 nm for 3D GAA capacitor 1810. However, it is understood that the thickness ranges are only cited as examples, and variations can be made depending on the applications. The metal gate structures 1813 and 1823 can have at least two types of metals. The first is the metal gate with p-type work function, which can include TiN, TaN, WN, and MoN, etc. The second is the metal gate with n-type work function, for example, Al based metals including TiAlC and TaAlC, etc., or metal silicides, including TiSi, TaSi, WSi, CoSi, and NiSi, etc. The contact plugs 1835 that connect metal layers to the semiconductors can be selected from low-resistance metals besides W, for example, Ru, Ir, Mo, and Co, etc. In some embodiments, the metal contact can include TiSi and/or TiN layers and cobalt fill material. In some embodiments, during device fabrication, the etching of the conductive layers can be performed using atomic layer etching (ALE) with a control process based on artificial intelligence (A.I.) or machine learning, as described below with reference to FIG. 25.

Figure 19A:
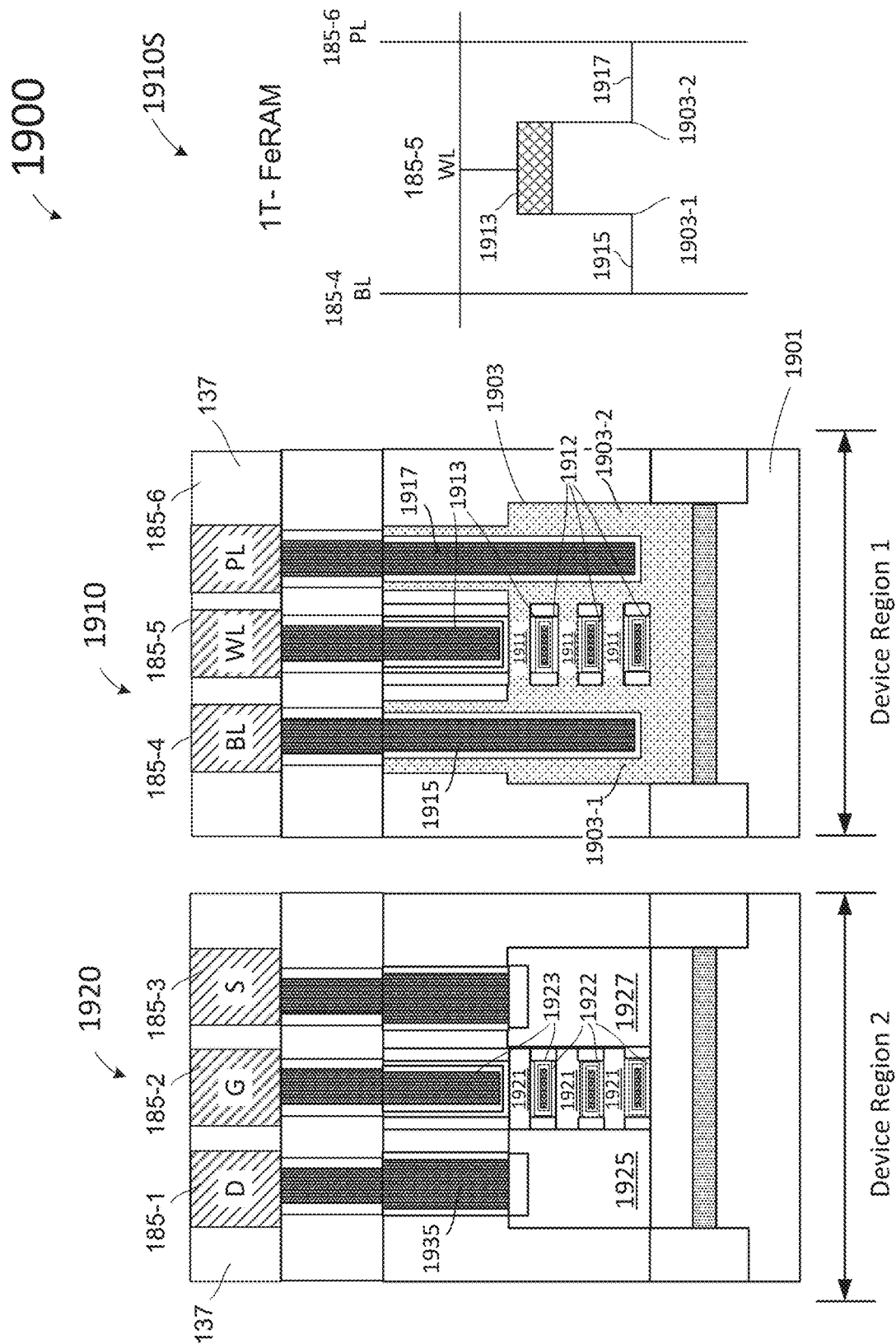
FIG. 19A illustrates a cross-sectional view and a schematic diagram of a semiconductor device including a transistor and a GAA single transistor ferroelectric random access memory (1T-FeRAM), in accordance with some embodiments.

FIG. 19A illustrates a cross-sectional view and a schematic diagram of a semiconductor device including a GAA single transistor ferroelectric random access memory (1T-FeRAM) and a separate GAA transistor, in accordance with some embodiments. In FIG. 19A, device 1900 includes a memory device 1910 used as 1T-FeRAM and a transistor 1920 shown in cross-sectional views and a schematic diagram 1910S of memory device 1910.

In FIG. 19A, memory device 1910 and transistor 1920 have the same device structures as those shown in FIG. 17B, with the addition of metal interconnect structures 185 for connecting memory device 1910 and transistor 1920, in device regions 1 and 2, respectively. Metal interconnect structures 185 are formed in a dielectric layer 137 deposited over the device structures in FIG. 17B. In some embodiments, metal interconnect structures 185 are formed by etching trenches in dielectric layer 137, followed by electro-copper plating (ECP) to fill the trenches with copper (Cu), and copper chemical-mechanical-polishing (CMP) for planarization.

In FIG. 19A, memory device 1910 includes an integral semiconductor structure 1903 having interconnected parts made of the same semiconductor material in a first device region (Device Region 1) of a substrate 1901. The integral semiconductor structure 1903 includes first and second portions, 1903-1 and 1903-2, respectively, connected by stacked strips 1911 of the semiconductor material. The stacked strips are separated from one another. A conductive electrode layer 1913 is wrapped around the stacked strips 1911 of the integral semiconductor structure 1903. A first dielectric structure layer 1912 is wrapping around the stacked strips 1911 and separating the stacked strips 1911 from the conductive electrode layer 1913. As shown in FIG. 19A, the integral semiconductor structure 1903 is made of interconnected parts, including first and second portions, 1903-1 and 1903-2, respectively, connected by stacked strips 1911 of the semiconductor material. In some embodiments, the integral semiconductor structure 1903 is formed by filling a semiconductor material in interconnected voids created by an etching process, as described above in connection with FIGS. 15B, 16B, and 17B. In some embodiments, the filling semiconductor material is indium gallium zinc oxide (IGZO). In alternative embodiments, other suitable metal-oxide semiconductor materials, such as $In_2O_3$, ZnO, $SnO_2$, $Cu_2O$ and $CuMO_2$ (M=Al, Ga, or In), etc., can also be used.

In some embodiments, memory device 1910, in a gate-all-around (GAA) structure, is configured as a single transistor ferroelectric random access memory (1T-FeRAM) cell. In this example, the first and second portions, 1903-1 and 1903-2, of the integral semiconductor structure 1903 are configured as drain and source of the transistor, respectively, connected by stacked strips 1911 of the semiconductor material, which is configured as the channel regions. The first dielectric structure layer can include the ferroelectric material hafnium zirconium oxide (HfZrO). In other example, other ferroelectric materials can also be used, such as hafnium oxide ($HfO_2$), etc.

Memory device 1910 in FIG. 19A is a ferroelectric FET (FeFET) with ferroelectric materials HfZrO or $HfO_2$ as gate dielectric and IGZO channel forming the 1T-FeRAM. Such an FET can provide better subthreshold swing (SS) and higher mobility than poly-silicon channel. The FeFET as a memory device can have the advantages of low-power, high-speed, and high-capacity. Further, ferroelectric-HfZrO and $HfO_2$ are compatible with CMOS processing.

In FIG. 19A, device 1920 is a gate-all-around (GAA) transistor similar to transistor 1820 in FIG. 18. Device 1920 includes stacked semiconductor strips 1921 disposed in a second device region (Device Region 2) of the substrate 1901, and the semiconductor strips 1921 are separated from one another. A second dielectric structure layer 1922 is wrapped around the stacked semiconductor strips 1921, and a conductive electrode layer 1923 is wrapped around the second dielectric structure layer 1922 and the semiconductor strips 1921. In some embodiments, the stacked semiconductor strips 1921 can be made of Si or SiGe. In alternative embodiments, other suitable semiconductor materials as described above can also be used. In some embodiments, the first dielectric structure layer 1812 includes hafnium zirconium oxide (HfZrO), and the second dielectric structure layer 1822 includes hafnium oxide (HfO$_2$).

Metal interconnect structures 185 include a bit line (BL) 185-1 coupled to the drain 1925 of transistor 1920, a word line (WL) 185-2 coupled to the conductive electrode layer 1923, which forms the gate of transistor 1920, and an interconnect line 185-3 connecting the source 1927 of the transistor 1920. Metal interconnect structures 185 also include a bit line (BL) 185-4 coupled to a drain electrode 1915 of the device 1910, a word line (WL) 185-5 coupled to the gate electrode 1913 of the device 1910, and a plate line (PL) 185-6 coupled to a source electrode 1917 of the device 1910.

In the example of FIG. 19A, semiconductor device 1900 is an integrated device including an active device 1920, which is a GAA transistor that can be used in core/IO/SRAM regions, and memory device 1910, which is a 3D GAA 1T-FeRAM structure. Both memory device 1910 and transistor 1920 have a 3D GAA structure, such that the charge storage in the memory and the current drive in the transistor can be increased. Moreover, memory device 190 has an IGZO channel. IGZO can be manufactured using a synthesis method, for example, a low temperature atomic layer deposition (ALD) process, for example, at or below 250 degrees C. As illustrated in FIG. 19, memory device 1910 and transistor 1920 are GAA FET. Further, using the high-k dielectric structures increases charge storage capacity and allows thicker dielectric layers to be used. Moreover, in some embodiments, the FeRAM can include one transistor coupled to multiple capacitors for increased charge storage capacity, for example, 1T1C, 1T2C, 1T3C, 1T4C, . . . , 1TnC, where n is a positive integer. In some embodiments, they can be implemented in a FinFET structure.

As described above, transistor device 1920 includes a channel 1921, interfacial layer, high-k gate dielectric 1913, tungsten gate fill material in conductive electrode layer 1923, and contact plugs 1935 that connect metal layers to the semiconductors. Similarly, the capacitor device 1910 includes a dielectric structure that has an interfacial layer, high-k gate dielectric 1912, tungsten gate fill material 1913, and metal contact.

The channel 1921 for the transistor 1920 can be Si or SiGe, and can be in the shapes of strips, nanosheets, or nanowire structures. The Si or SiGe channel can have at least three nanosheets or nanowires. In some embodiments, the channel length of the topmost Si or SiGe nanosheet is equal to or less than the channel length of the middle Si or SiGe nanosheet, and the channel length of the middle Si or SiGe nanosheet is equal to or less than the channel length of the bottom Si or SiGe nanosheet.

In some embodiments, the dielectric structure layer can include an interfacial layer (IL). In some embodiments, the thickness of the IL on the topmost Si or SiGe nanosheet is greater than the IL on the middle nanosheet, which, in turn, has a thickness that is greater than the IL on the bottom nanosheet. In 3D GAA FeRAM 1910, the dielectric structure 1912 has an HfZrO layer with a thickness equal to or greater than 3 nm, and the Zr concentration is around 40%-60%. However, it is understood that the thickness concentration ranges are only cited as examples, and variations can be made depending on the applications. The dielectric structure layer 1922 in transistor 1920 can be the same as dielectric structure 1912 in FeRAM 1910. Alternatively, the dielectric structure layer 1922 in transistor 1920 can be different than dielectric structure 1912, for example, with HfO2 replacing HfZrO. In some embodiments, the HfZrO and HfO$_2$ layers can have a crystalline phase, for example, an orthorhombic phase. In some embodiments, the thickness of the dielectric structure layers 1912 and 1922 on the topmost nanosheet is greater than the dielectric structure layers on the middle nanosheet, which, in turn, has a thickness that is greater than the dielectric structure layers on the bottom nanosheet. In some embodiments, during device fabrication, the etching of the dielectric structure layers can be performed using atomic layer etching (ALE) with a control process based on artificial intelligence (A.I.) or machine-learning, as described below with reference to FIG. 25.

The metal gate structures formed by conductive electrode layers 1913 and 1923 for FeRAM 1910 and transistor 1920 can be single layer metal compound or multi-layer metal compound, respectively. In some embodiments, the sheet-sheet spacing can be 8-15 nm for transistor 1920 and 10-20 nm for 3D GAA FeRAM 1910. However, it is understood that the thickness ranges are only cited as examples, and variations can be made depending on the applications. The metal gate structures 1913 and 1923 can have at least two types of metals. The first is the metal gate with p-type work function, which can include TiN, TaN, WN, and MoN, etc. The second is the metal gate with n-type work function, for example, Al based metals including TiAlC and TaAlC, etc., or metal silicides, including TiSi, TaSi, WSi, CoSi, and NiSi, etc. The contact plugs 1935 that connect metal layers to the semiconductors can be selected from low-resistance metals besides W, for example, Ru, Ir, Mo, and Co, etc. In some embodiments, the metal contact can include TiSi and/or TiN layers and cobalt fill material. In some embodiments, during device fabrication, the etching of the metal layers can be performed using atomic layer etching (ALE) with a control process based on artificial intelligence (A.I.) or machine-learning, as described below with reference to FIG. 25.

Figure 19B:
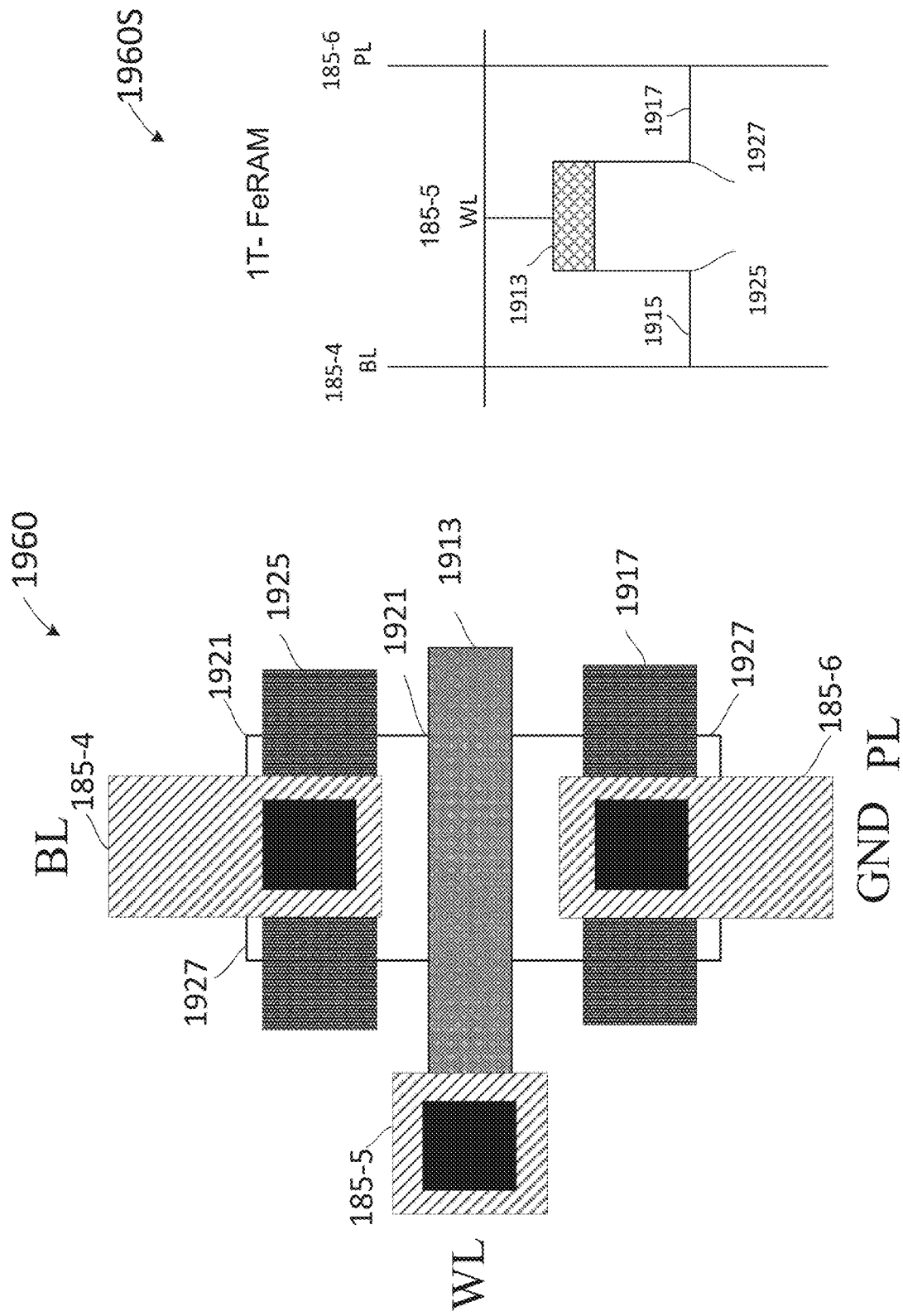
FIG. 19B illustrates a top view layout diagram and a schematic diagram of the GAA single transistor ferroelectric random access memory (1T-FeRAM) of FIG. 19A, in accordance with some embodiments.

FIG. 19B illustrates a top view layout diagram 1960 and a schematic diagram 1960S of an example of the single transistor ferroelectric random access memory (1T-FeRAM) of FIG. 19A, in accordance with some embodiments. The layout diagram 1960 in FIG. 19B can be used as a layout for a one-bit unit cell in an array of FeRAM. FIG. 19B shows a semiconductor region 1927, in which drain 1925, channel 1921 and source 1927 are formed but are blocked from view by overlying structures in FIG. 19B. Further, metal interconnect structure 185 includes a bit line (BL) 185-4 coupled to the drain contact 1915, which is coupled to the drain 1921; a word line (WL) 185-5 coupled to the gate contact 1913; and a plate line (PL) 185-6 coupled to a source contact 1917, which is coupled to the source 1903-2. The plate line (PL) 185-6 serves as a ground (GND) of the device.

Figure 20:
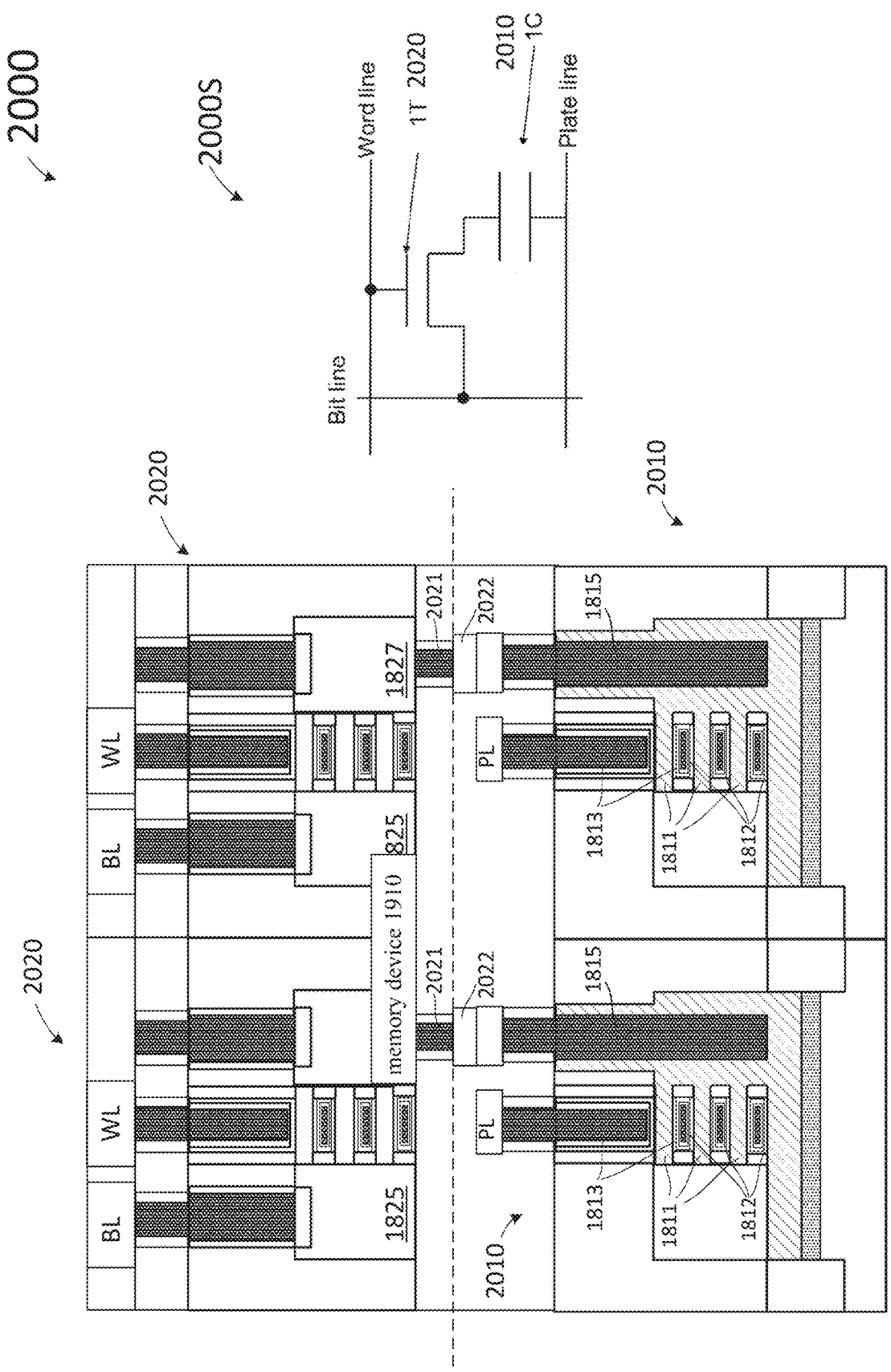
FIG. 20 illustrates a cross-sectional view of a stacked three-dimensional (3D) memory device, in accordance with some embodiments.

FIG. 20 illustrates a cross-sectional view of a stacked three-dimensional (3D) memory device, in accordance with some embodiments. As shown in FIG. 20, device 2000 includes transistors 2020 stacked over capacitor devices 2010, respectively. An example of transistors 2020 is transistor 1820 described above in connection with FIG. 18, and an example of capacitors 2010 is capacitor 1810 described above in connection with FIG. 18. Transistor 2020 and capacitor 2010 can be fabricated on separate wafers, e.g., a transistor wafer and a capacitor wafer, respectively, according to the methods described above. Next, a wafer thinning process can be used to reduce the backside thickness of the transistor wafer for the transistors 2020. A backside contact 2021 and backside interconnect 2022 are then formed on the backside of the transistor wafer. Afterwards, a wafer bonding process is used to bond the transistor wafer on top of the capacitor wafer.

An integrated device including a one-transistor one-capacitor (1T1C) FeRAM memory cell can be formed by a transistor 2020 stacked on and electrically coupled to a capacitor 2010, as shown by the schematic 2000S diagram in FIG. 20. Further, in some embodiments, the FeRAM can include one transistor coupled to multiple capacitors for increased charge storage capacity, for example, 1T1C, 1T2C, 1T3C, 1T4C, . . . , 1TnC, where n is a positive integer.

Figure 21:
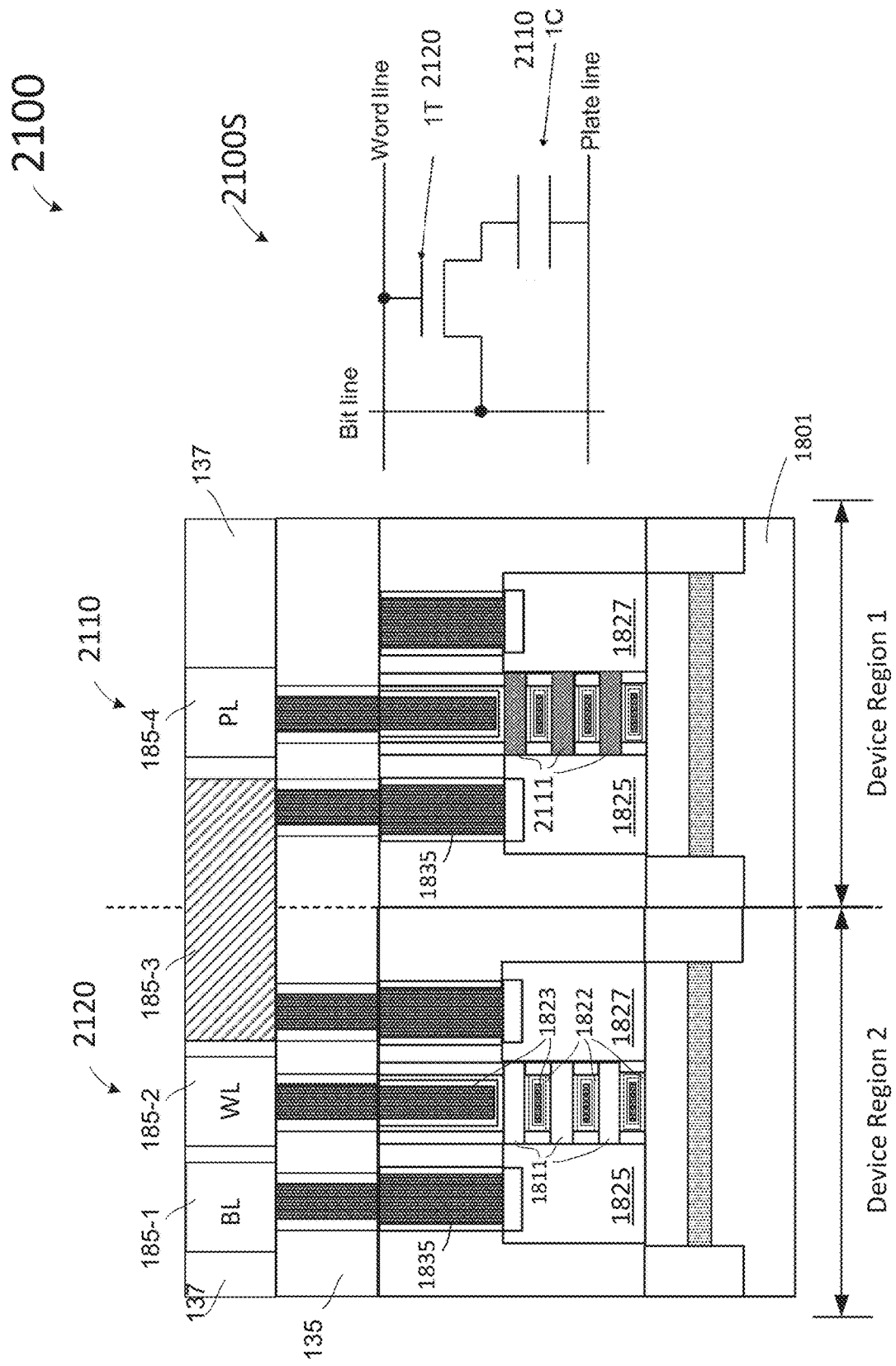
FIG. 21 illustrates a cross-sectional view and a schematic diagram of another GAA one-transistor one-capacitor ferroelectric random access memory (1T1C FeRAM), in accordance with some embodiments.

FIG. 21 illustrates a cross-sectional view and a schematic diagram of a GAA one-transistor one-capacitor ferroelectric random access memory (1T1C FeRAM), in accordance with some embodiments. In FIG. 21, semiconductor device 2100 is a one-transistor-one-capacitor (1T1C) memory element, similar to semiconductor device 1800 in FIG. 18, and includes a transistor 2120 and a capacitor 2110 shown in a cross-sectional view and a schematic diagram 2100S. Both transistor 2120 and capacitor 2110 have gate-all-around (GAA), in which the gate electrode wraps around a channel or another electrode with a dielectric structure in between. However, memory device 2100 is different from memory device 1800 in that capacitor 2110 in FIG. 21 has heavily doped semiconductor strips 2111 as the conductive strips that function as an electrode for the capacitor, in contrast to memory device 1800 which has metal strips 1811 as an electrode for the capacitor.

Capacitor 2110 can be fabricated using a process similar to the process for forming the GAA transistor as described above in connection with FIGS. 1A-18. For example, as shown in FIG. 1A, the second semiconductor material layer 120 in device region 1 can be heavily doped, while the second semiconductor material layer 120 in device region 2 is maintained as undoped or lightly doped and used as a channel region of a transistor. In an example, an epitaxial process can be performed in both device region 1 and device region 2 to form semiconductor layers 120, and then the semiconductor layer 120 in device region 1 is heavily doped, while device region 2 is protected by a mask. For example, a photoresist mask or a hard mask can be used if ion implantation is used for doping. Alternatively, separate epitaxial growth of semiconductor layers 120 can be performed in device region 1 and device region 1 using different in-situ doping, while protecting one of the device regions with a hard mask. Subsequently, the fabrication process for transistor 1820 can be used to form a transistor 2120 with a heavily doped channel region that is used as a capacitor. In some embodiments, the capacitor 2110 has the same doping type (n-type or p-type) for the source, channel, and drain regions.

Alternatively, capacitor 2110 can be fabricated using a process similar to the process for forming the capacitor structures in FIGS. 14A and 14B to form the voids, as described above in connection with FIGS. 1A-18. Next, a heavily doped semiconductor material can be used to fill the voids and used as an electrode for the capacitor.

As shown in FIG. 21, semiconductor device 2100 is an integrated device including an active device 2120 and a passive device 2110. The active device 2120 is formed in a second device region of the substrate, which can include the core, IO, and SRAM devices. The passive device 2110, which has a 3D GAA capacitor structure, is formed in a first device region of the substrate. In the example of FIG. 21, an active device 2120 and a capacitor 2110 are located side by side connected by a metal interconnect to form a 1T1C FeRAM. Further, in some embodiments, the FeRAM can include one transistor coupled to multiple capacitors for increase charge storage capacity, for example, 1T1C, 1T2C, 1T3C, 1T4C, . . . , 1TnC, where n is positive integer. As described above, transistor device 2120 includes a channel, interfacial layer, high-k gate dielectric, tungsten gate fill material, and metal-active region contact. The channel for the transistor 2120 can be Si or SiGe, and can be in the shapes of strips, nanosheets, or nanowire structures. The corresponding channel region in capacitor 2110 is heavily-doped Si or SiGe, which is used as an electrode for the capacitor. The metal gate in capacitor 2110 can be single layer metal compound or multi-layer metal compound.

Figure 22:
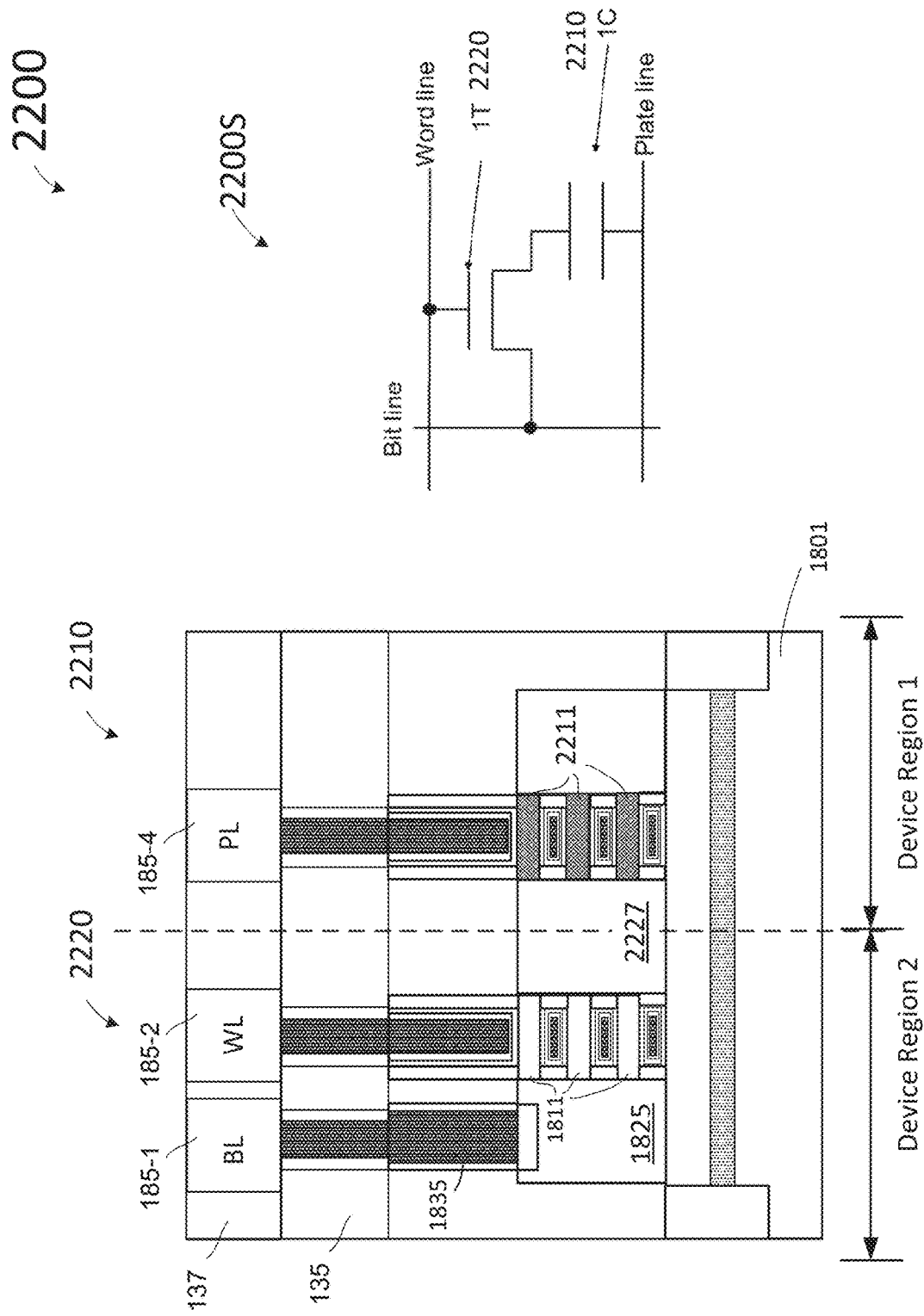
FIG. 22 illustrates a cross-sectional view and a schematic diagram of yet another GAA one-transistor one-capacitor ferroelectric random access memory (1T1C FeRAM), in accordance with some embodiments.

FIG. 22 illustrates a cross-sectional view and a schematic diagram of another GAA one-transistor one-capacitor ferroelectric random access memory (1T1C FeRAM), in accordance with some embodiments. In FIG. 22, memory device 2200 is a one-transistor-one-capacitor (1T1C) memory element, similar to memory device 2100 in FIG. 21, and includes a transistor 2220 and a capacitor 2210 shown in a cross-sectional view and a schematic diagram 2200S. Both transistor 2220 and capacitor 2210 have gate-all-around (GAA), in which an electrode wraps around a channel region or another electrode with a dielectric structure in between. However, memory device 2200 is different from memory device 2100 in that the source region 2227 of transistor 2220 is shared as a drain region 2215 in capacitor 2210, which is connected to the heavily doped channel region 2211 in capacitor 2210 and used as an electrode for the capacitor forming the one-transistor-one-capacitor (1T1C) memory element.

Memory device 2200 can be fabricated using a process similar to the process for forming memory device 2100 described above, with a slight modification that capacitor 2210 and transistor 2220 are placed closer together. In this arrangement, the source region 2227 of transistor 2220 is connected to the heavily doped channel region 2211 in capacitor 2210 and used as an electrode for the capacitor forming the one-transistor-one-capacitor (1T1C) memory element. One advantage of memory device 2200 is that the device area is reduced, and device density can be increased.

In the example of FIG. 22, semiconductor device 2200 is an integrated device including an active device 2220, which is a GAA transistor that can be used in core/IO/SRAM regions, and passive device 2210, which is a 3D GAA capacitor structure. Devices 2210 and 2220 are disposed side by side and configured as a 1T1C FeRAM. Moreover, in some embodiments, the FeRAM can include one transistor coupled to multiple capacitors for increase charged storage capacity, for example, 1T1C, 1T2C, 1T3C, 1T4C, . . . , 1TnC, where n is a positive integer.

As described above, similar to transistor 1820 in FIG. 18, transistor device 2220 includes a channel, interfacial layer, high-k gate dielectric, tungsten gate fill material, and metal-active region contact. Further, similar to capacitor 1810 in FIG. 18, the capacitor device 2210 includes a dielectric structure that has an interfacial layer, a high-k gate dielectric, a tungsten gate fill material, and contact plugs that connect metal layers to the semiconductors. The channel for the transistor 2220 can be Si or SiGe, and can be in the shapes of strips, nanosheets, or nanowire structures. The corresponding channel region in capacitor 2210 is heavily doped Si or SiGe, which is used as an electrode for the capacitor. The metal gate in capacitor 2210 can be single layer metal compound or multi-layer metal compound. Further, capacitor 2210 and transistor 2220 share a common source/drain region.

Figure 23:
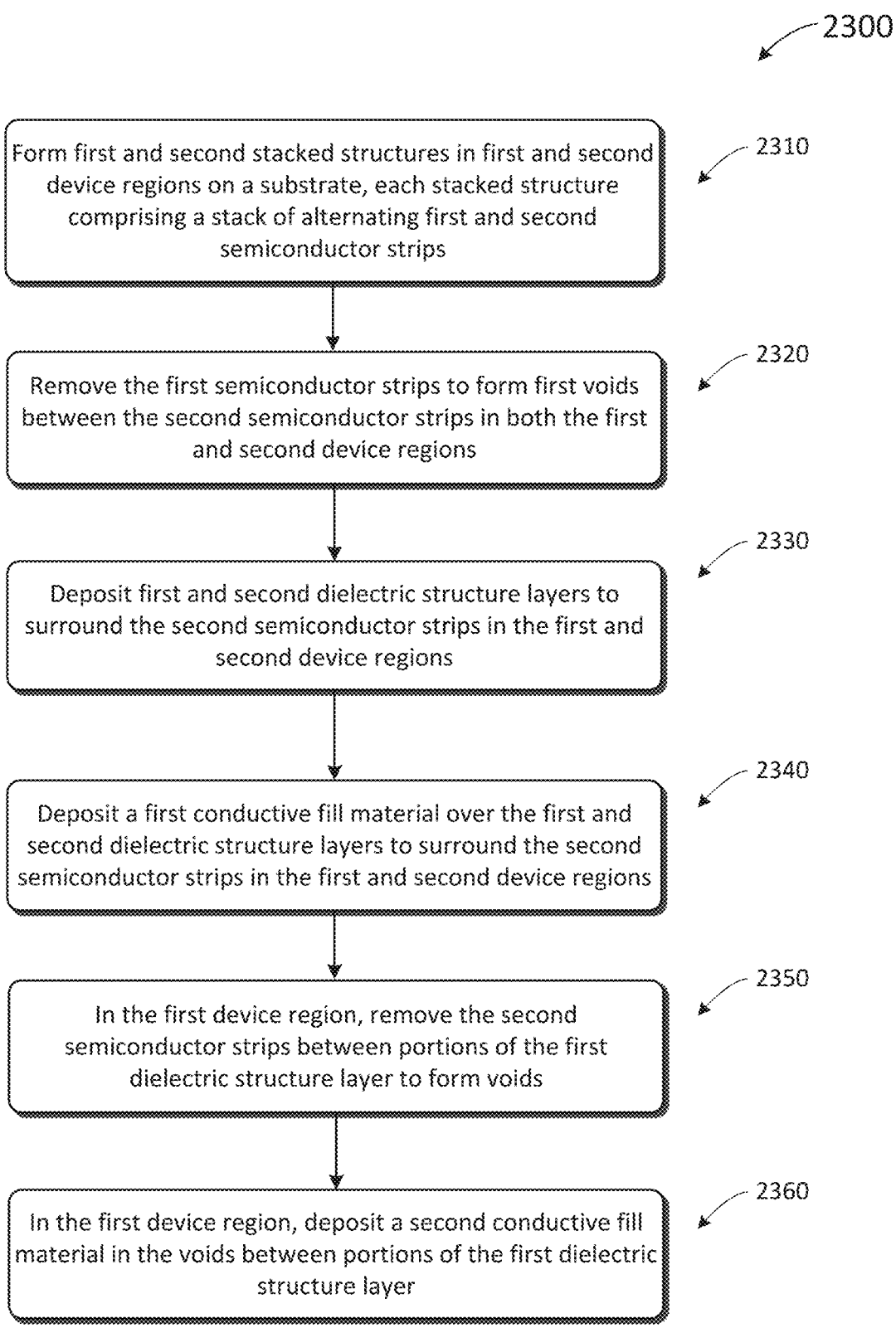
FIG. 23 is a simplified flowchart illustrating a method for fabricating a semiconductor device, in accordance with some embodiments.

FIG. 23 is a simplified flowchart illustrating a method of fabricating a semiconductor device, in accordance with some embodiments. As shown in FIG. 23, method 2300 describes a method for forming a gate-all-around (GAA) capacitor and a gate-all-around (GAA) transistor concurrently on the same wafer. It is understood that the GAA capacitor and GAA transistor can also be formed separately. The operations in method 2300 are briefly summarized below with reference to FIGS. 1-22 described above. It is noted that method 2300 as described below may not include all the details to produce a complete semiconductor device. Accordingly, additional processes can be provided before, during, and after method 2300. It is also understood that the operations in method 2300 can be performed in a different order, or some operations not performed, depending on specific applications.

In operation 2310, the method includes forming first and second stacked structures in first and second device regions on a substrate, respectively. Each of the first and second stacked structures includes a stack of alternating first and second semiconductor strips. Examples of stacked structures including a stack of alternating first and second semiconductor strips are shown in FIGS. 5A and 5B. In FIGS. 5A and 5B, each of fin structures 125 and 225 includes a stack of alternating first and second semiconductor strips 112 and 122, respectively. First and second semiconductor strips 112 and 122 are the remaining portions of first and second semiconductor layers 110 and 120 illustrated in FIGS. 1-4. In the embodiments described herein, first and second semiconductor strips 112 and 122 are made of SiGe and Si, respectively.

In operation 2320, the first semiconductor strips are removed to form first voids between the second semiconductor strips in both the first and second device regions. Examples of the first voids formed between the second semiconductor strips in the stacks of alternating first and second semiconductor strips are shown in FIGS. 6-10. Removing the first semiconductor strips 112 in FIG. 9 forms first voids 113 between adjacent second semiconductor strips 122, in both the first and the second stacked structures 125 and 225.

Method 2300 also includes, in operation 2330, depositing a first dielectric structure layer and a second dielectric structure layer to surround the second semiconductor strips in the first and second device regions, respectively, and in operation 2340, depositing a first conductive fill material over the first dielectric structure layer and the second dielectric structure layer to surround the second semiconductor strips in the first and second device regions, respectively. Examples of the resulting device structures are shown in FIG. 11, in which a first dielectric structure layer 171 and a second dielectric structure layer 271 are deposited to surround the second semiconductor strips 122 in the first and second device regions, respectively. As described above in connection to FIG. 11, the first dielectric structure layer 171 and the second dielectric structure layer 271 can include ferroelectric materials. For example, the first dielectric structure layer 171 can include HfZrO, and the second dielectric structure layer 271 can include $HfO_2$.

In operation 2340, still referring to FIG. 11, after the first dielectric structure layer 171 and the second dielectric structure layer 271 are deposited to surround the second semiconductor strips 122 in the device regions 1 and 2, respectively, a first conductive fill material 145 is formed over the first dielectric structure layer 171 and the second dielectric structure layer 271 to surround the second semiconductor strips 122 to form all-around gate structures in device regions 1 and 2, respectively.

In operation 2350, as shown in FIGS. 12-14A and 14B, in the first device region only, the second semiconductor strips 122 between portions of the first dielectric structure layer 171 and all-around gate structure are removed to form second voids 123.

In operation 2360, as shown in FIG. 15A, a second conductive fill material 147 is deposited in the second voids 123 between portions of the first dielectric structure layers. In some embodiments, the second conductive fill material 147 includes an adhesion/barrier layer 147-1 and a metal fill material 147-2. For example, the adhesion/barrier layer 147-1 can include a titanium nitride (TiN) layer, and the metal fill material 147-2 can include a tungsten (W) material.

As shown in FIG. 15A, the first conductive fill material 145 and the second conductive fill material 147 are configured to form first and second electrodes of a capacitor as a memory device in the first device region Device Region 1. The first conductive fill material 145 in the second device region, Device Region 2, is configured to form a gate electrode for a gate-all-around (GAA) transistor in the second device region. With additional backend processing described with reference to FIGS. 16A, 17A, and 18, an example of the semiconductor device is shown in FIG. 18, with a GAA capacitor 1810 and a GAA transistor 1820, described above in detail with reference to FIG. 18.

In method 2300 as illustrated in FIG. 23 and outlined above, the capacitor in device region 1 and the transistor in device region 2 are formed concurrently on the same substrate. In some operations, the same process steps are applied simultaneously in device regions 1 and 2, for example, operations 2310, 2320, and 2340 in method 2300, and some of the subsequent backend processed illustrated in FIGS. 16A-19B, and 21-22. In other operations, the process steps are performed only in device region 1 or only in device region 2. For example, in operation 2330, first and second dielectric structure layers can be formed in device region 1 and device region 2, respectively. As another example, operations 2350 and 2360 in method 2350 are performed only in device region 1. In this case, one of the device regions can be protected with a mask, for example, a photo resist mask or a hard mask.

In some embodiments, however, the capacitor device can be formed separately from the transistor device, and on different substrates, as described above with reference to the stacked structure in FIG. 20. In this case, method 2300 can be modified such that operations 2310-2360 are performed only in device region 1, or on a separate wafer, to form the capacitor separately from the transistor.

Figure 24:
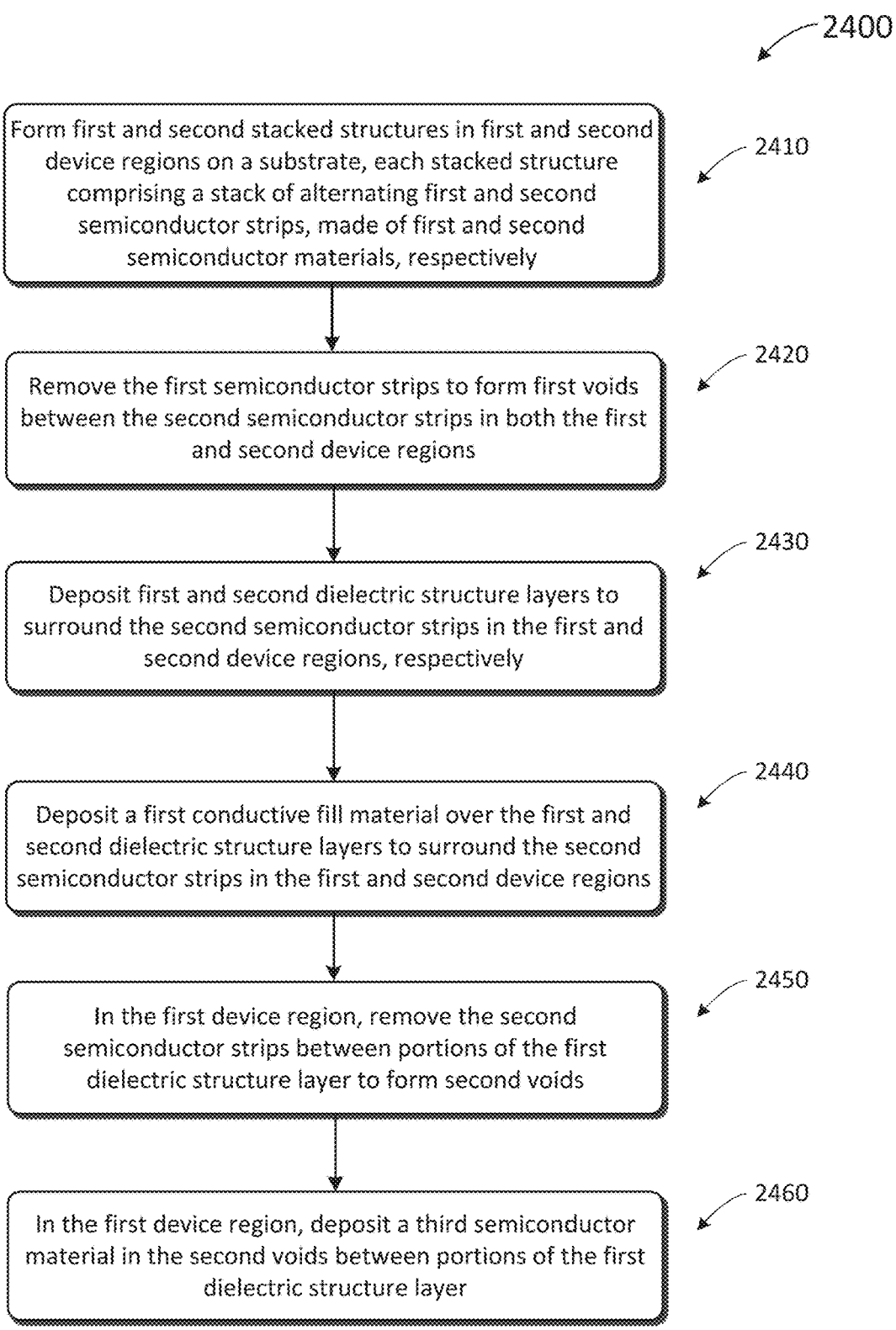
FIG. 24 is a simplified flowchart illustrating another method for fabricating a semiconductor device, in accordance with some embodiments.

FIG. 24 is a simplified flowchart illustrating another method of fabricating a semiconductor device, in accordance with some embodiments. As shown in FIG. 24, method 2400 can be used to form a gate-all-around (GAA) 1T-FeRAM, either separately or concurrently with a gate-all-around (GAA) transistor. The operations in method 2400 are briefly summarized below with reference to FIGS. 1-23 described above. It is noted that method 2400 as described below may not include all the details to produce a complete semiconductor device. Accordingly, additional processes can be provided before, during, and after method 2400. It is also understood that the operations in method 2400 can be performed in a different order, or some operations not performed, depending on specific applications.

As shown in FIG. 24, method 2400 includes operations 2410-2460. In some embodiments, operations 2410-2440 can be similar to operations 2310-2340 of method 2300 of FIG. 23, and they are described in detail here.

In operation 2410, the method includes forming first and second stacked structures in first and second device regions on a substrate, respectively. Each of the first and second stacked structures includes a stack of alternating first and second semiconductor strips. The first and second semiconductor strips are made of first and second semiconductor materials, respectively. In some embodiments, the first semiconductor material is SiGe, and the second semiconductor material is Si. Details of operation 2410 are similar to operation 2310 of FIG. 23 and are not described here.

In operation 2420, similar to operation 2320 of FIG. 23, the first semiconductor strips are removed to form first voids between the second semiconductor strips in both the first and second device regions.

Method 2400 also includes, in operation 2430, depositing a first dielectric structure layer and a second dielectric structure layer to surround the second semiconductor strips in the first and second device regions, respectively, similar to operation 2330 of FIG. 23.

In operation 2440, method 2400 includes depositing a first conductive fill material over the first dielectric structure layer and the second dielectric structure layer to surround the second semiconductor strips in the first and second device regions, respectively. The first conductive fill material is configured to form all-around gate electrodes for the devices in both device region 1 and device region 2, as shown in FIG. 11.

In operation 2450, in the first device region only, the second semiconductor strips 122 between portions of the first dielectric structure layer 171 and the all-around gate structure are removed to form second voids 123, as shown in FIG. 14B. In the embodiment of FIG. 14B, voids 134 and 165 are formed on both sides of the stacked structures by modifying the processes in FIGS. 12 and 13.

In operation 2460, as shown in FIG. 15B, a third semiconductor material 130 is deposited in the second voids 123 between portions of the first dielectric structure layers. In some embodiments, the first semiconductor material is SiGe, the second semiconductor material is Si, and the third semiconductor material is indium gallium zinc oxide (IGZO).

In some embodiments, the third semiconductor material is also deposited in voids 134 and 165 as shown in FIG. 14B. The method can also include using a second conductive fill material to fill the voids remaining after the deposition of the third semiconductor material 130. The second conductive fill material 147 includes an adhesion/barrier layer 147-1 and a metal fill material 147-2. For example, the adhesion/barrier layer 147-1 can include a titanium nitride (TiN) layer, and the metal fill material 147-2 can include a tungsten (W) material.

As shown in FIG. 15B, the third semiconductor material is configured to form channel, source, and drain regions of a one-transistor ferroelectric random access memory (1T-FeRAM) in the first device region, the first conductive fill material is configured to form a gate electrode for the 1T-FeRAM, and the first conductive fill material is configured to form a gate electrode for a gate-all-around (GAA) transistor in the second device region. With additional backend processing described with reference to FIGS. 16B, 17B, and 19, an example of the semiconductor device is shown in FIGS. 19A and 19B, with a GAA 1T-FeRAM 1910 and an GAA transistor 1920.

In method 2400 as illustrated in the flowchart of FIG. 24 and outlined above, the 1T-FeRAM in device region 1 and the transistor in device region 2 are formed concurrently on the same substrate. In some operations, the same process steps are applied simultaneously in device regions 1 and 2, for example, operations 2410, 2420, and 2440 in method 2400, and some of the subsequent backend processes illustrated in FIGS. 16A-19B. In other operations, the process steps are performed only in device region 1 or only in device region 2. For example, in operation 2430, first and second dielectric structure layers can be formed in device region 1 and device region 2, respectively. As another example, operations 2450 and 2460 in method 2400 are performed only in device region 1. In these cases, one of the device regions can be protected with a mask, for example, a photo resist mask or a hard mask.

In some embodiments, however, the 1T-FeRAM device can be formed separately from the transistor device, and on different substrates. In this case, method 2400 can be modified such that operations 2410-2460 are performed only in device region 1 to form the 1T-FeRAM device separately from the transistor.

Figure 25:
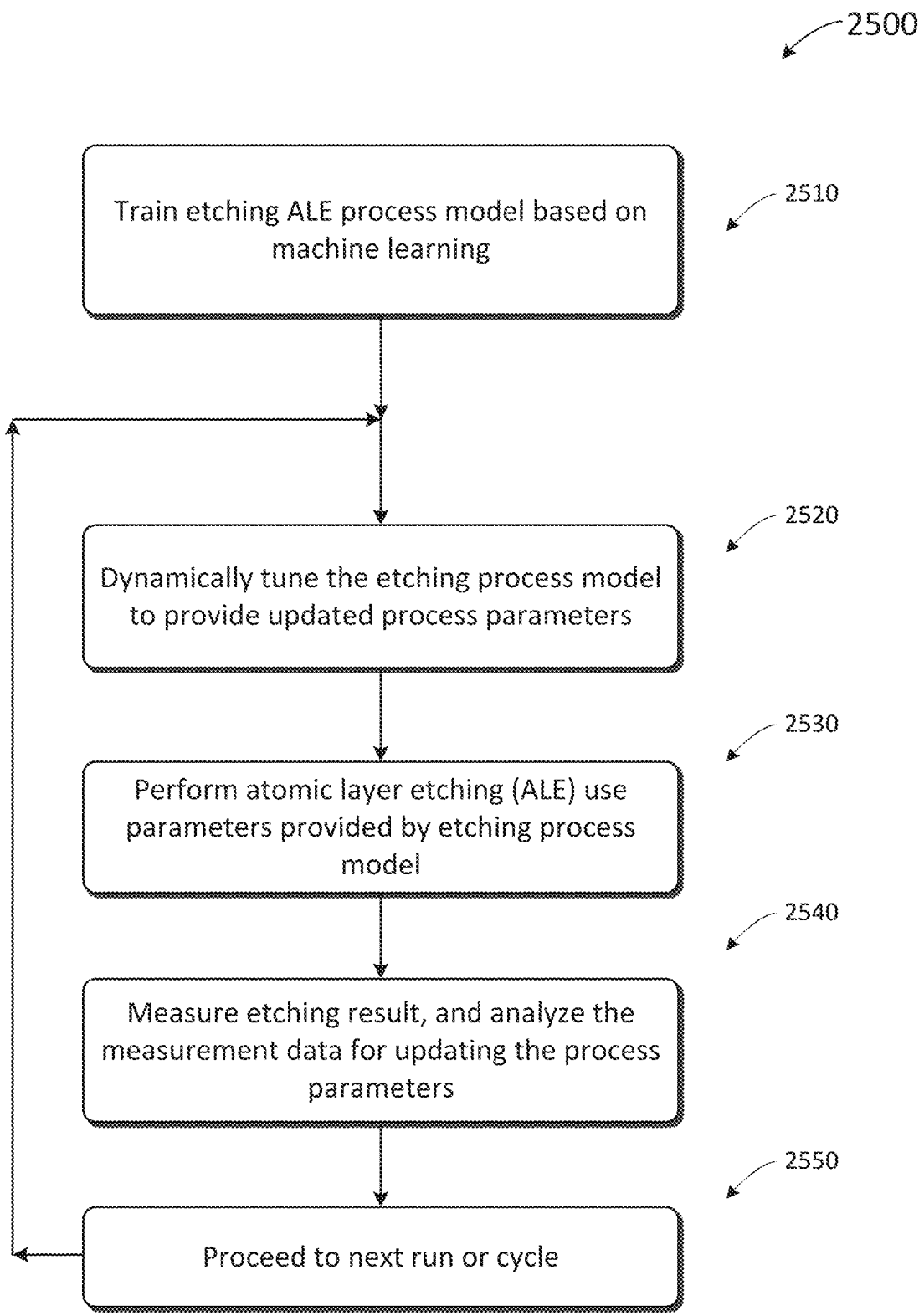
FIG. 25 is a simplified flowchart illustrating a method of performing an etching process for fabricating a semiconductor device, in accordance with some embodiments.

FIG. 25 is a simplified flowchart illustrating a method of performing an etching process for fabricating a semiconductor device, in accordance with some embodiments. As described above, various etch processes for etching a thin film on a patterned substrate are used in the fabrication of semiconductor devices as described above in connection to FIGS. 1A-24. In some embodiments, atomic layer etching (ALE) can be used to control the etching results. It is desirable to continuously improve the etch processes. As shown in the flowchart of FIG. 25, method 2500 is an artificial intelligence (A.I.) based method using machine learning, and can be applied to various etch processes to dynamically improve the etching results. In some embodiments, the method can also be applied to other fabrication processes.

Atomic layer etching (ALE) is a technique that removes thin layers of material using sequential self-limiting reactions to form volatile reaction products. In a simplified description, ALE starts with a modification step to form a reactive layer, followed by a removal step to remove only the modified layer. As an example, the ALE can have a cycle of four steps that is repeated as many times as necessary to achieve the required etch depth. In step 1, the substrate is exposed with an etching gas, which adsorbs on and reacts with the surface layer material. The etching gas is stopped after adsorbing one monolayer. In step 2, all residual etch gas is purged. In step 3, the surface is bombarded with low energy inert ions, which remove the reacted surface layer. In step 4, etching products are purged from the chamber. The advantages of ALE includes low damage, precise control of ultra-thin layers, high selectivity, improved uniformity, and high aspect ratio of etched features.

ALE can be used in the etching processes for forming nano-scaled structures such as those described above in connection with FIGS. 1A-24. As an example, ALE has been demonstrated in etching metal oxides, such as $HfO_2$ and HfZrO, as well as metals and other materials.

As shown in FIG. 25, method 2500 includes training the ALE process model using machine learning for providing etching process parameters for target etching results, and dynamically adjusting the etching process parameters on a run-to-run or cycle-by-cycle basis.

In operation 2510, an ALE etching process model is set up by machine learning. For example, an ALE etching model is set up for etching high-k dielectric layer (e.g., HfZrO or HfO$_2$) in the first dielectric structure layer 171 in device 100 as shown in FIG. 11. Another ALE etching model is set up for etching high-k dielectric layer (e.g., HfZrO or HfO$_2$) in the second dielectric structure layer 271 in device 200 as shown in FIG. 11. In some embodiments, the ALE etching process model is configured to identify various factors that can affect the ALE etching results. The ALE etching process model can be used to select etching process parameters that can be adjusted to achieve desirable result. The factors considered in the model can include ALE raw material information, which can include information related to process gases and equipment, such as ampoule lifetime, material features including solid, liquid, gas, or phase mixture, temperature, humidity, light adsorption/reflection, pressure, carrier gas condition, gas supply pipe length, etc. Other factors that can affect the etching results include the target device pattern density, exposed effective plain area, exposed effective plain area crystal orientation, exposed effective plain area roughness index, exposed effective side wall area, exposed effective side wall tilt angle, wafer rotation/tilt parameters, and process gas parameters, etc. In some embodiments, the ALE etching model includes an analysis engine, which can include machine learning, neural network, and big data mining.

Machine learning involves giving computers access to a large amount of data and letting the computers search for optimal solutions. Machine learning algorithms are able to improve without being explicitly programmed. In other words, they are able to find patterns in the data and apply those patterns to new problems.

Deep learning is a subset of machine learning, which uses neural networks with many layers to analyze the data. Neural networks make use of an architecture inspired by neurons in the human brain. In a human brain, a neuron receives an input, and based on that input, fires off an output that is used by another neuron. The neural network simulates this behavior in learning about the collected data and then predicting outcomes. The trained neural network can then be used to provide process control parameters in the fabrication process.

In some embodiments, machine learning can be implemented using a linear regression process. In the linear regression process, training data is first gathered, including historical process conditions and process results. An analysis model produces predicted data based on training data. The predicted data is compared with additional training data, and the parameters in the analysis model are adjusted. This process is carried out iteratively until the accuracy of the analysis model is acceptable. The trained process model can then be used to provide process parameters in the fabrication process.

Machine learning requires that the right set of data be applied to a learning process. The right set of data can be provided by big data mining, which refers to extracting knowledge from a large amount of data, i.e., big data. Big data mining can help improve the accuracy of machine learning models.

In operation 2510, in a machine learning process, historical ALE etching data is collected and analyzed as training data for the machine learning process. For example, historical ALE etching data can be collected and analyzed for ALE etching of high-k dielectric layer (e.g., HfZrO or HfO$_2$) in the first dielectric structure layer 171 in device 100 and second high-k dielectric layer (e.g., HfZrO or fO$_2$) in the second dielectric structure layer 271 in device 200 as shown in FIG. 11. Such training data can be used to train the machine learning process by following a respective training procedure associated with the machine learning process. In some embodiments, a neural network based machine learning process can be used to build the ALE etching model. In some embodiments, the machine learning process can include a supervised machine learning process, such as linear regression, logistic regression, decision tree, random forest, support vector machine, artificial neural network, convolution neural network, recurrent neural network, or deep learning, where the supervised machine learning process can be trained or optimized by introducing the training data through one or more training procedures (e.g., gradient decent algorithm) associated with the supervised machine learning process.

In operation 2520, in every etching run or cycle, the etching process model is dynamically tuned to provide updated process parameters. For example, operation 2520 includes dynamically tuning the etching process models for etching of high-k dielectric layer (e.g., HfZrO or HfO$_2$) in the first dielectric structure layer 171 in device 100 and second high-k dielectric layer (e.g., HfZrO or HfO$_2$) in the second dielectric structure layer 271 in device 200 as shown in FIG. 11. In the initial etching run, an initial set of process parameters are determined based on the train etching process model. In a subsequent run or cycle, results from the previous runs or cycles are used to tune the ALE etching model using the machine learning process described above to improve the model and adjust to changes in equipment characteristics and material properties.

In operation 2530, an atomic layer etching (ALE) process is performed using parameters provided by etching process model in operation 2520. As described above, in some embodiments, the ALE process can have a cycle of four steps that is repeated as many times as necessary to achieve the required etch depth. In step 1, the substrate is exposed with an etching gas, which adsorbs on and reacts with the surface layer material. The etching gas is stopped after adsorbing one monolayer. In step 2, all residual etch gas is purged. In step 3, the surface is bombarded with low energy inert ions which remove the reacted surface layer. In step 4, etching products are purged from the chamber. For example, the ALE process is carried out to etch high-k dielectric layer (e.g., HfZrO or HfO$_2$) in the first dielectric structure layer 171 in device 100 and second high-k dielectric layer (e.g., HfZrO or HfO$_2$) in the second dielectric structure layer 271 in device 200 as shown in FIG. 11.

In operation 2540, results from the etching process are measured, and the measurement data is analyzed, which is used for updating the process parameters in the ALE etching model. For example, etching results are measured and analyzed for ALE etching of high-k dielectric layer (e.g., HfZrO or HfO$_2$) in the first dielectric structure layer 171 in device 100 and second high-k dielectric layer (e.g., HfZrO or HfO$_2$) in the second dielectric structure layer 271 in device 200 as shown in FIG. 11. The process parameters in the ALE etching model can then be updated based on the analysis. The process results measured in this step can include etch results such as etching depth, etching rate, etching profile, uniformity, distribution over wafer or chip area, etc. Other data gathered in the etching process can include the factors used in the ALE etching model etching material information, gas flow rate, temperature, humidity, light adsorption/reflection, pressure, carrier gas condition, etc. Other data can include the target device pattern density, exposed effective plain area, exposed effective plain area crystal orientation, exposed effective plain area roughness index, exposed effective side wall area, exposed effective side wall tilt angle, wafer rotation/tilt parameters, and process gas parameters, etc.

In operation 2550, the method 2500 returns to operation 2520 for the next run or cycle. The training process in operation 2510 can be performed offline, in accordance with some embodiments. Operations 2520-2550 are executed in every etching run or cycle to dynamically tune the ALE process in order to meet the requirement specification. For example, etching process for the ALE can be dynamically tuned for etching of high-k dielectric layer (e.g., HfZrO or $HfO_2$) in the first dielectric structure layer 171 in device 100 and second high-k dielectric layer (e.g., HfZrO or $HfO_2$) in the second dielectric structure layer 271 in device 200 as shown in FIG. 11. Moreover, the A.I. or machine learning based ALE optimization processes described above can also be applied to the etching of the dielectric structure 1812 in capacitor 1810, the dielectric structure 1822 in transistor 1820, and the etching of conductive layers such as metal gates and work function layers in the devices depicted in FIG. 18. Further, during device fabrication, the etching of the dielectric layers and the metal layers as depicted in FIGS. 19A and 19B can be performed using atomic layer etching (ALE) with a control process based on artificial intelligence (A.I.) or machine learning, as described below with reference to FIG. 25.

Figure 26:
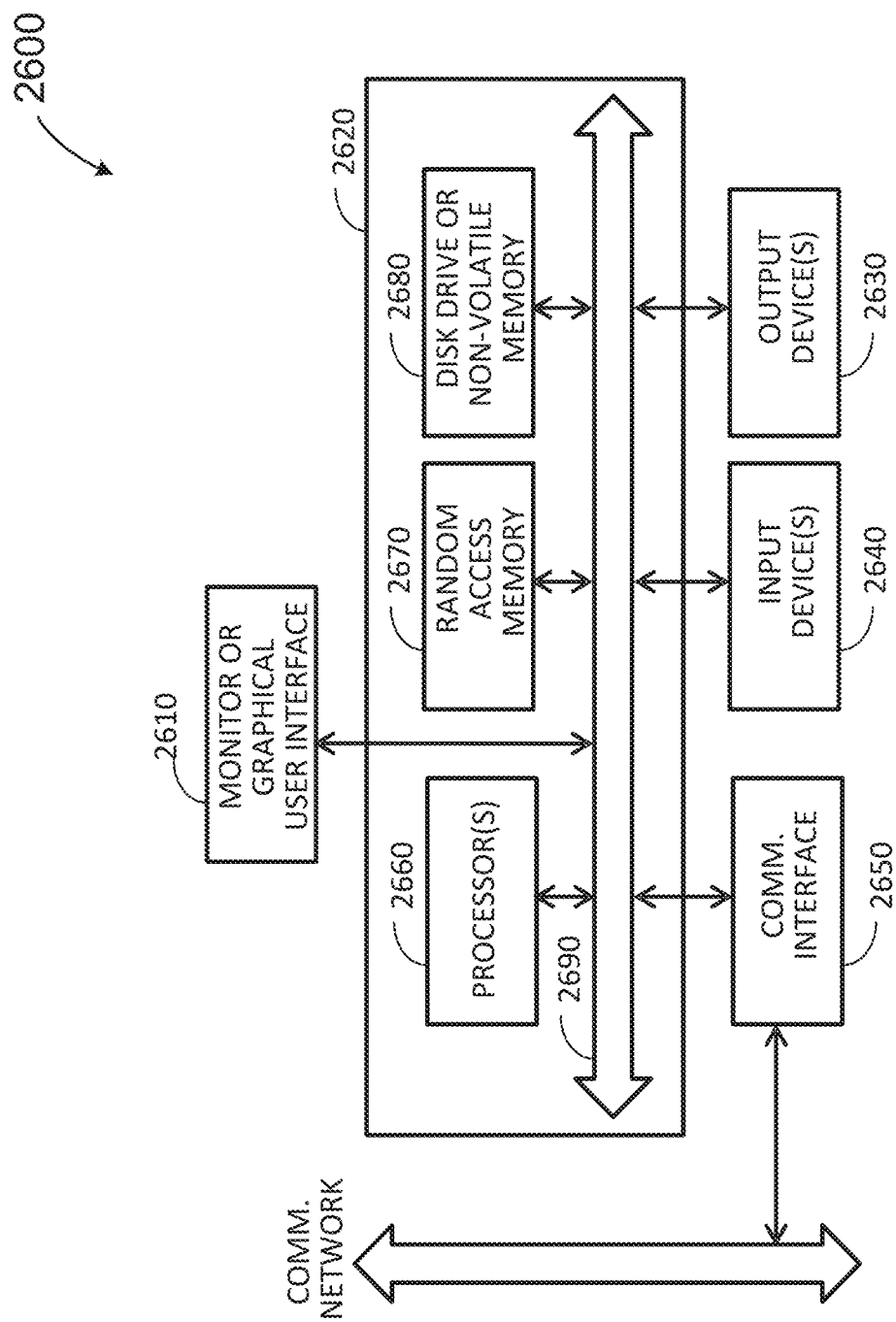
FIG. 26 is a simplified block diagram illustrating an apparatus that may be used to implement various processes described above, in accordance with some embodiments.

FIG. 26 is a simplified block diagram illustrating an apparatus that may be used to implement various processes described above, in accordance with some embodiments. FIG. 26 is merely illustrative of an embodiment incorporating the present disclosure and does not limit the scope of the disclosure as recited in the claims. One of ordinary skill in the art would recognize other variations, modifications, and alternatives. In one embodiment, computer system 2600 typically includes a monitor 2610, a computer 2620, user output devices 2630, user input devices 2640, communications interface 2650, and the like.

FIG. 26 is representative of a computer system capable of embodying the present disclosure. For example, the measurement data analysis, and the ALE etching process model tuning in method 2500 illustrated in FIG. 25 can be implemented using a system similar to system 2600 depicted in FIG. 26. Moreover, the offline training of the machine learning systems in method 2500 can be carried out in a system similar to system 2600 depicted in FIG. 26. Furthermore, computer systems similar to system 2600 depicted in FIG. 26 can be used in executing the operations in method 2300 illustrated in FIG. 23 and in executing the operations in method 2400 illustrated in FIG. 24. For example, the computer systems can be used in designing process recipes based on analysis of historical process data and device and process simulations, controlling the process equipment to execute the process recipes, measuring and analysing of process result data, and optimizing of the process recipes, etc.

As shown in FIG. 26, computer 2620 may include a processor(s) 2660 that communicates with a number of peripheral devices via a bus subsystem 2690. These peripheral devices may include user output devices 2630, user input devices 2640, communications interface 2650, and a storage subsystem, such as random access memory (RAM) 2670 and disk drive 2680.

User input devices 2640 can include all possible types of devices and mechanisms for inputting information to computer system 2620. These may include a keyboard, a keypad, a touch screen incorporated into the display, audio input devices such as voice recognition systems, microphones, and other types of input devices.

User output devices 2630 include all possible types of devices and mechanisms for outputting information from computer 2620. These may include a display (e.g., monitor 2610), non-visual displays such as audio output devices, etc.

Communications interface 2650 provides an interface to other communication networks and devices. Communications interface 2650 may serve as an interface for receiving data from and transmitting data to other systems.

RAM 2670 and disk drive 2680 are examples of tangible storage media configured to store data such as embodiments of the present disclosure, including executable computer code, human readable code, or the like. Other types of tangible storage media include floppy disks, removable hard disks, optical storage media such as CD-ROMS, DVDs and bar codes, semiconductor memories such as flash memories, read-only memories (ROMS), battery-backed volatile memories, networked storage devices, and the like. RAM 2670 and disk drive 2680 may be configured to store the basic programming and data constructs that provide the functionality of the present disclosure.

Software code modules and instructions that provide the functionality of the present disclosure may be stored in RAM 2670 and disk drive 2680. These software modules may be executed by processor(s) 2660. RAM 2670 and disk drive 2680 may also provide a repository for storing data used in accordance with the present disclosure.

RAM 2670 and disk drive 2680 may include a number of memories including a main random access memory (RAM) for storage of instructions and data during program execution and a read-only memory (ROM) in which fixed non-transitory instructions are stored. RAM 2670 and disk drive 2680 may include a file storage subsystem providing persistent (non-volatile) storage for program and data files. RAM 2670 and disk drive 2680 may also include removable storage systems, such as removable flash memory.

Bus subsystem 2690 provides a mechanism for letting the various components and subsystems of computer 2620 communicate with each other as intended. Although bus subsystem 2690 is shown schematically as a single bus, alternative embodiments of the bus subsystem may utilize multiple busses.

FIG. 26 is representative of a computer system capable of embodying the present disclosure. It will be readily apparent to one of ordinary skill in the art that many other hardware and software configurations are suitable for use with the present disclosure. Further, the use of other microprocessors and microcontrollers is contemplated.

Various embodiments of the present disclosure can be implemented in the form of logic in software or hardware or a combination of both. The logic may be stored in a computer-readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

In some embodiments, methods for forming 3D GAA capacitors and 3D GAA 1T-FeRAM memory devices are provided. The methods include forming first and second stacked structures in first and second device regions on a substrate, respectively. Each of the first and second stacked structures includes a stack of alternating first and second semiconductor strips. The method also includes removing the first semiconductor strips to form first voids between the second semiconductor strips. In some embodiments, the first voids are filled with a dielectric structure layer and a first conductive layer. Next, the second semiconductor strips are removed to form second voids, which are wrapped around by the dielectric layer and the first conductive layer. In some embodiments, the second voids are filled by a second conductive layer, which is configured as a second electrode for the 3D GAA capacitor. Alternatively, the second voids can be filled by a semiconductor material, e.g., IGZO, which is configured as a channel for the 3D GAA 1T-FeRAM memory devices. The method also includes performing atomic layer etching (ALE) of selected dielectric and metals using an artificial intelligence (A.I.) based ALE etching model, with run-to-run or cycle-to-cycle dynamic tuning. The methods also allow concurrent formation of a 3D GAA transistor with the 3D GAA capacitors and 3D GAA 1T-FeRAM memory devices.

In the 3D GAA capacitor, a first electrode includes multiple strips stacked in a three-dimensional structure, and each conductive strip is wrapped around by a second electrode, with a dielectric structure layer sandwiched between the first electrode and the electrode. An example is shown in FIG. 18. The 3D GAA capacitor provides large effective capacitor area for a small device size compared with convention capacitor structures, such as planar or deep trench capacitors. The charge storage capability is increased. The dielectric structure layer includes high-k ferroelectric dielectrics, which can further increase the charge storage.

In the 3D GAA 1T-FeRAM memory devices, an IGZO channel includes multiple strips stacked in a three-dimensional structure, and each IGZO strip is wrapped around by a second electrode which functions as the gate, with a dielectric structure layer sandwiched between the first electrode and the electrode. In an embodiment, the source and drain regions are also made of IGZO, forming an integral semiconductor structure with the channel region. An example is shown in FIG. 19. The 3D GAA 1T-FeRAM memory device provides large effective channel area for a small device size. Such an FET can provide better subthreshold swing (SS) and higher mobility than poly-silicon channel. The FeFET as a memory device can have the advantages of low-power, high-speed, and high-capacity. FeFET 1910 can be used as a non-volatile memory cell.

According to some embodiments, a method of fabricating a semiconductor device includes forming first and second stacked structures in first and second device regions on a substrate, respectively. Each of the first and second stacked structures includes a stack of alternating first and second semiconductor strips. The method also includes removing the first semiconductor strips to form first voids between the second semiconductor strips in both the first and second device regions. The method further includes depositing a first dielectric structure layer and a second dielectric structure layer in the first voids to surround the second semiconductor strips in the first and second device regions, respectively, with the first dielectric structure layer being different from the second dielectric layer. The method also includes depositing a first conductive fill material in the first voids over the first dielectric structure layer and the second dielectric structure layer to surround the second semiconductor strips in the first and second device regions, respectively. In addition, the method includes, in the first device region, removing the second semiconductor strips between portions of the first dielectric structure layer to form second voids, and depositing a second conductive fill material in the second voids between portions of the first dielectric structure layer. In some embodiments, the first conductive fill material and the second conductive fill material form first and second electrodes of a memory device in the first device region, and the first conductive fill material forms a gate electrode for a gate-all-around (GAA) transistor in the second device region.

According to some embodiments, a method of fabricating a semiconductor device includes forming a first stack of semiconductor layers in a first device region on a substrate. The first stack of semiconductor layers includes alternating first and second semiconductor strips. The method also includes removing the first semiconductor strips to form first voids between the second semiconductor strips in the first stack of semiconductor layers. The method further includes depositing a first dielectric structure layer in the first voids to surround the second semiconductor strips, and depositing a first conductive fill material in the first voids to surround the first dielectric structure layer and the second semiconductor strips. In addition, the method includes removing the second semiconductor strips to form second voids between portions of the first dielectric structure layer, and depositing a second conductive fill material in the second voids. In some embodiments, the first conductive fill material and the second conductive fill material are configured to form first and second electrodes of a memory device in the first device region.

According to some embodiments, a semiconductor device includes stacked conductive electrode strips disposed in a first device region of a substrate. The first conductive strips are separated from one another. The semiconductor device also includes a first dielectric structure layer wrapped around the stacked conductive electrode strips. The semiconductor device further includes a conductive electrode layer wrapped around the first dielectric structure layer and the conductive strips. In some embodiments, the stacked conductive electrode strips include titanium nitride (TiN) material. In some embodiments, the stacked conductive electrode strips include a heavily doped semiconductor material.

According to some embodiments, a method of fabricating a semiconductor device includes forming first and second stacked structures in first and second device regions on a substrate, respectively, each of the first and second stacked structures comprising a stack of alternating first and second semiconductor strips. The first and second semiconductor strips comprise first and second semiconductor materials, respectively. The method also includes removing the first semiconductor strips to form first voids between the second semiconductor strips in both the first and the second stacked structures. The method further includes depositing a first dielectric structure layer and a second dielectric structure layer in the first voids to surround the second semiconductor strips in the first and second stacked structures, respectively. In addition, the method also includes depositing a first conductive fill material in the first voids to surround the first dielectric structure layer and the second dielectric structure layer, respectively. Moreover, the method includes, in the first device region, removing the second semiconductor strips to form second voids between portions of the first dielectric structure layer, and depositing a third semiconductor material in the second voids between portions of the first dielectric structure layer. In some embodiments, the third semiconductor material is configured to form channel, source, and drain regions of a gate-all-around (GAA) one-transistor ferroelectric random access memory (1T-FeRAM) in the first device region, the first conductive fill material is configured to form a gate electrode for the 1T-FeRAM, and the first conductive fill material is configured to form a gate electrode for a gate-all-around (GAA) transistor in the second device region.

According to some embodiments, a method of fabricating a semiconductor device includes forming a first stack of semiconductor layers in a first device region on a substrate. The first stack of semiconductor layers includes alternating first and second semiconductor strips. The first and second semiconductor strips include first and second semiconductor materials, respectively. The method also includes removing the first semiconductor strips to form first voids between the second semiconductor strips in the first stack of semiconductor layers. Further, the method includes depositing a first dielectric structure layer in the first voids to surround the second semiconductor strips, and depositing a first conductive fill material in the first voids to surround the first dielectric structure layer and the second semiconductor strips. In addition, the method includes removing the second semiconductor strips to form second voids between portions of the first dielectric structure layer, and depositing a third semiconductor material in second voids between layers of the first conductive fill material.

According to some embodiments, a semiconductor device includes an integral semiconductor structure in a first device region of a substrate. The integral semiconductor structure includes a single semiconductor material forming first and second portions connected by stacked strips of the semiconductor material. The stacked strips are separated from one another. The semiconductor device also includes a conductive electrode layer wrapped around the stacked strips of the integral semiconductor structure. Further, the semiconductor device includes a first dielectric structure layer separating the stacked strips from the conductive electrode layer. According to some embodiments, the semiconductor material is disposed in interconnected voids in the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   forming first and second stacked structures in first and second device regions on a substrate, respectively, each of the first and second stacked structures comprising a stack of alternating first and second semiconductor strips;
   removing the first semiconductor strips to form first voids between the second semiconductor strips in both the first and second device regions;
   depositing a first dielectric structure layer and a second dielectric structure layer in the first voids to surround the second semiconductor strips in the first and second device regions, respectively, wherein the first dielectric structure layer is different from the second dielectric layer;
   depositing a first conductive fill material in the first voids over the first dielectric structure layer and the second dielectric structure layer to surround the second semiconductor strips in the first and second device regions, respectively;
   in the first device region, removing the second semiconductor strips between portions of the first dielectric structure layer to form second voids; and
   in the first device region, depositing a second conductive fill material in the second voids between portions of the first dielectric structure layer;
   whereby the first conductive fill material and the second conductive fill material form first and second electrodes of a memory device in the first device region, and the first conductive fill material forms a gate electrode for a gate-all-around (GAA) transistor in the second device region.

2. The method of claim 1, wherein removing the first semiconductor strips to form first voids further comprises:
   removing portions of the first semiconductor strips to form recessed regions;
   depositing a dielectric material in the recessed regions; and
   removing the first semiconductor strips, using the dielectric material in the recessed regions as a mask, to form the first voids between the second semiconductor strips in the first stacked structure.

3. The method of claim 1, wherein depositing a first dielectric structure layer to surround the second semiconductor strips further comprises:
   depositing a first ferroelectric material layer to surround the second semiconductor strips.

4. The method of claim 1, wherein the first conductive fill material comprises titanium nitride (TiN) and tungsten (W); and the second conductive fill material comprises titanium nitride (TiN).

5. The method of claim 1, wherein:
   the first dielectric structure layer comprises hafnium zirconium oxide (HfZrO); and
   the second dielectric structure layer comprises hafnium oxide ($HfO_2$).

6. A method of fabricating a semiconductor device, comprising:
   forming a first stack of semiconductor layers in a first device region on a substrate, the first stack of semiconductor layers comprising alternating first and second semiconductor strips;

removing the first semiconductor strips to form first voids between the second semiconductor strips in the first stack of semiconductor layers;
depositing a first dielectric structure layer in the first voids to surround the second semiconductor strips;
depositing a first conductive fill material in the first voids to surround the first dielectric structure layer and the second semiconductor strips;
removing the second semiconductor strips to form second voids between portions of the first dielectric structure layer; and
depositing a second conductive fill material in the second voids,
whereby the first conductive fill material and the second conductive fill material are configured to form first and second electrodes of a memory device in the first device region.

7. The method of claim 6, wherein removing the first semiconductor strips to form voids further comprises:
removing portions of the first semiconductor strips to form recessed regions;
depositing a dielectric material in the recessed regions; and
removing the first semiconductor strips, using the dielectric material in the recessed regions as a mask, to form the voids between the second semiconductor strips in the first stack of semiconductor layers.

8. The method of claim 6, wherein depositing a first dielectric structure layer to surround the second semiconductor strips further comprises:
depositing a first ferroelectric material layer to surround the second semiconductor strips.

9. The method of claim 6, wherein the first conductive fill material comprises titanium nitride (TiN) and tungsten (W), and the second conductive fill material comprises titanium nitride (TiN).

10. The method of claim 6, wherein the first conductive fill material comprises titanium nitride (TiN) and tungsten (W), and the second conductive fill material comprises a heavily doped semiconductor material.

11. The method of claim 6, wherein the first dielectric structure layer comprises hafnium zirconium oxide (HfZrO).

12. The method of claim 6, further comprising:
forming a second stack of semiconductor layers in a second device region on the substrate, the second stack of semiconductor layers comprising alternating first and second semiconductor strips;
removing the first semiconductor strips to form voids between the second semiconductor strips in the second stack of semiconductor layers;
depositing a second dielectric structure layer to surround the second semiconductor strips; and
depositing the first conductive fill material to surround the first dielectric structure layer and the second semiconductor strips,
whereby the first conductive fill material is configured to form a gate electrode of a transistor device in the second device region.

13. The method of claim 12, further comprising: simultaneously,
depositing the first conductive fill material to surround the first dielectric structure layer and the first semiconductor strips; and
depositing the first conductive fill material to surround the first dielectric structure layer and the second semiconductor strips.

14. A semiconductor device, comprising:
stacked first strips disposed in a first device region of a substrate, the stacked first strips separated from one another;
a first dielectric structure layer wrapped around the stacked first strips;
a first conductive electrode layer wrapped around the first dielectric structure layer and the stacked first strips in the first device region;
stacked second strips disposed in a second device region of the substrate and separated from one another; and
a second dielectric structure layer wrapped around the stacked second strips;
a second conductive electrode layer wrapped around the second dielectric structure layer and the stacked second strips in the second device region,
wherein:
the stacked first strips, the first dielectric structure layer, and the first conductive electrode layer are configured to form a memory device;
the stacked second strips are configured to form channels of a transistor, and the second conductive electrode layer is configured to form a gate of the transistor; and
wherein the stacked second strips in the second device region and the stacked first strips in the first device region comprise different materials.

15. The semiconductor device of claim 14, wherein:
the stacked first strips comprise titanium nitride (TiN).

16. The semiconductor device of claim 14, wherein:
the stacked first strips comprise a heavily doped semiconductor material.

17. The semiconductor device of claim 14,
wherein the first strips comprise a material selected from indium gallium zinc oxide (IGZO), $In_2O_3$, ZnO, $SnO_2$, $Cu_2O$, $CuMO_2$, or a combination thereof.

18. The semiconductor device of claim 14, wherein the memory device is disposed below the transistor to form a stacked memory cell.

19. The semiconductor device of claim 14, further comprising a semiconductor structure in contact with the stacked first strips and the stacked second strips, thereby connecting the memory device with the transistor,
wherein the stacked first strips comprise a heavily doped semiconductor material.

20. The semiconductor device of claim 14, wherein:
the first dielectric structure layer comprises hafnium zirconium oxide (HfZrO); and
the second dielectric structure layer comprises hafnium oxide ($HfO_2$).

* * * * *